United States Patent
Korematsu et al.

(10) Patent No.: US 12,275,091 B2
(45) Date of Patent: Apr. 15, 2025

(54) LASER PROCESSING APPARATUS AND LASER PROCESSING METHOD

(71) Applicant: HAMAMATSU PHOTONICS K.K., Hamamatsu (JP)

(72) Inventors: Katsuhiro Korematsu, Hamamatsu (JP); Takeshi Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 332 days.

(21) Appl. No.: 17/289,069

(22) PCT Filed: Oct. 30, 2019

(86) PCT No.: PCT/JP2019/042662
§ 371 (c)(1),
(2) Date: Apr. 27, 2021

(87) PCT Pub. No.: WO2020/090929
PCT Pub. Date: May 7, 2020

(65) Prior Publication Data
US 2022/0009039 A1 Jan. 13, 2022

(30) Foreign Application Priority Data

Oct. 30, 2018 (JP) .................................. 2018-204114
Apr. 5, 2019 (JP) .................................. 2019-073098
Apr. 5, 2019 (JP) .................................. 2019-073178

(51) Int. Cl.
*B23K 26/53* (2014.01)
*B23K 26/08* (2014.01)
(Continued)

(52) U.S. Cl.
CPC .............. *B23K 26/53* (2015.10); *B23K 26/08* (2013.01); *H01L 21/268* (2013.01); *B23K 2103/56* (2018.08)

(58) Field of Classification Search
CPC ............ B23K 2101/40; B23K 2103/56; B23K 26/0006; B23K 26/0604; B23K 26/0622;
(Continued)

(56) References Cited

U.S. PATENT DOCUMENTS 7,981,770 B2   7/2011  Kaneko
8,604,381 B1  12/2013  Shin
(Continued)

FOREIGN PATENT DOCUMENTS

CN   1491144 A   4/2004
CN   1902023 A   1/2007
(Continued)

OTHER PUBLICATIONS

International Preliminary Report on Patentability mailed May 14, 2021 for PCT/JP2019/042616.
(Continued)

*Primary Examiner* — Dana Ross
*Assistant Examiner* — Adam M Eckardt
(74) *Attorney, Agent, or Firm* — Faegre Drinker Biddle & Reath LLP

(57) ABSTRACT

A laser processing apparatus irradiates a target with a laser light to form a modified region along a virtual plane in the target. The laser processing apparatus includes a support portion, an irradiation portion, a movement mechanism, and a controller. The controller performs a first processing process of irradiating a first portion in the target with the laser light under a first processing condition, and a second processing process of irradiating a second portion more on an inner side than the first portion in the target with the laser
(Continued)

light under a second processing condition different from the first processing condition, after the first processing process.

20 Claims, 54 Drawing Sheets

(51) Int. Cl.
*B23K 103/00* (2006.01)
*H01L 21/268* (2006.01)

(58) Field of Classification Search
CPC .............. B23K 26/08; B23K 26/0823; B23K 26/0853; B23K 26/0876; B23K 26/53; B23K 37/0235; H01L 21/268; H01L 21/301; H01L 21/304; H01L 21/68
See application file for complete search history.

(56) References Cited

U.S. PATENT DOCUMENTS

| | | | |
|---|---|---|---|
| 8,730,568 | B2 | 5/2014 | Tong et al. |
| 9,071,037 | B2 | 6/2015 | Gu et al. |
| 9,878,397 | B2* | 1/2018 | Hirata ............... B23K 26/0626 |
| 10,388,526 | B1* | 8/2019 | Seddon .................. B24B 37/20 |
| 2011/0139759 | A1 | 6/2011 | Millman, Jr. et al. |
| 2012/0091107 | A1 | 4/2012 | Sugiura |
| 2012/0100785 | A1 | 4/2012 | Ishimasa et al. |
| 2013/0248500 | A1 | 9/2013 | Shreter et al. |
| 2017/0120374 | A1* | 5/2017 | Hendricks ......... B23K 26/0624 |
| 2018/0076043 | A1 | 3/2018 | Ito et al. |
| 2018/0076060 | A1 | 3/2018 | Oh et al. |
| 2018/0154572 | A1 | 6/2018 | Richter et al. |
| 2018/0254223 | A1 | 9/2018 | Hirata et al. |
| 2019/0001433 | A1 | 1/2019 | Yamamoto |
| 2019/0039185 | A1 | 2/2019 | Nayuki et al. |

FOREIGN PATENT DOCUMENTS

| | | |
|---|---|---|
| CN | 101024260 A | 8/2007 |
| CN | 101251725 A | 8/2008 |
| CN | 101297050 A | 10/2008 |
| CN | 101878090 A | 11/2010 |
| CN | 101965242 A | 2/2011 |
| CN | 102574245 A | 7/2012 |
| CN | 102665999 A | 9/2012 |
| CN | 102990230 A | 3/2013 |
| CN | 104439696 A | 3/2015 |
| CN | 104641286 A | 5/2015 |
| CN | 104768698 A | 7/2015 |
| CN | 105189025 A | 12/2015 |
| CN | 105324207 A | 2/2016 |
| CN | 105689888 A | 6/2016 |
| CN | 107123588 A | 9/2017 |
| CN | 107452678 A | 12/2017 |
| CN | 107863293 A | 3/2018 |
| CN | 107995996 A | 5/2018 |
| DE | 102013223637 A1 | 5/2015 |
| DE | 102014204347 A1 | 9/2015 |
| JP | H06-007979 A | 1/1994 |
| JP | H10-258376 A | 9/1998 |
| JP | 2002-131559 A | 5/2002 |
| JP | 2004-111606 A | 4/2004 |
| JP | 2004-111946 A | 4/2004 |
| JP | 2005-294656 A | 10/2005 |
| JP | 2006-167804 A | 6/2006 |
| JP | 2006-315033 A | 11/2006 |
| JP | 2007-165848 A | 6/2007 |
| JP | 2007-180565 A | 7/2007 |
| JP | 2007-229773 A | 9/2007 |
| JP | 2008-087026 A | 4/2008 |
| JP | 2009-172668 A | 8/2009 |
| JP | 2010-000542 A | 1/2010 |
| JP | 2010-082644 A | 4/2010 |
| JP | 2010-153590 A | 7/2010 |
| JP | 2010-167433 A | 8/2010 |
| JP | 2011-056576 A | 3/2011 |
| JP | 2011167718 A * | 9/2011 |
| JP | 2012-130952 A | 7/2012 |
| JP | 2012-254478 A | 12/2012 |
| JP | 2013-049161 A | 3/2013 |
| JP | 2013-055084 A | 3/2013 |
| JP | 2013-141701 A | 7/2013 |
| JP | 2014-033163 A | 2/2014 |
| JP | 5456510 B2 | 4/2014 |
| JP | 2014-091642 A | 5/2014 |
| JP | 2015-012015 A | 1/2015 |
| JP | 2015-074003 A | 4/2015 |
| JP | 2015-536896 A | 12/2015 |
| JP | 2016-025188 A | 2/2016 |
| JP | 2016-032828 A | 3/2016 |
| JP | 2016-043558 A | 4/2016 |
| JP | 2016-513016 A | 5/2016 |
| JP | 2016-168606 A | 9/2016 |
| JP | 6064519 B2 | 1/2017 |
| JP | 2017-034200 A | 2/2017 |
| JP | 2017-056469 A | 3/2017 |
| JP | 2017-064746 A | 4/2017 |
| JP | 2017-071074 A | 4/2017 |
| JP | 6127526 B2 | 5/2017 |
| JP | 2017-131942 A | 8/2017 |
| JP | 2017-131944 A | 8/2017 |
| JP | 2017-168772 A | 9/2017 |
| JP | 2017-526161 A | 9/2017 |
| JP | 2017-528322 A | 9/2017 |
| JP | 2017-204574 A | 11/2017 |
| JP | 2017-224678 A | 12/2017 |
| JP | 6241174 B2 | 12/2017 |
| JP | 2018-043340 A | 3/2018 |
| JP | 2018-098464 A | 6/2018 |
| JP | 2018-133484 A | 8/2018 |
| JP | 2018-147928 A | 9/2018 |
| JP | 7133633 A | 8/2022 |
| JP | 7157816 | 10/2022 |
| KR | 20050078187 A | 8/2005 |
| KR | 1020180073306 A | 7/2018 |
| TW | 201214566 A | 4/2012 |
| TW | 201433397 A | 9/2014 |
| TW | 201703912 A | 2/2017 |
| TW | 201718155 A | 6/2017 |
| TW | 201735171 A | 10/2017 |
| TW | 201838001 A | 10/2018 |
| WO | WO 2005/102638 A1 | 11/2005 |
| WO | WO-2011/030802 A1 | 3/2011 |
| WO | WO-2014/075995 A2 | 5/2014 |
| WO | WO-2014/121261 A1 | 8/2014 |
| WO | WO-2015/052218 A1 | 4/2015 |
| WO | WO-2016/005455 A1 | 1/2016 |
| WO | WO-2016/083610 A2 | 6/2016 |
| WO | WO-2017/030039 A1 | 2/2017 |
| WO | WO-2018/192689 A1 | 10/2018 |
| WO | WO-2018/192691 A1 | 10/2018 |
| WO | WO 2019/176589 A1 | 9/2019 |
| WO | WO 2020/054504 A1 | 3/2020 |
| WO | WO 2020/084909 A1 | 4/2020 |
| WO | WO 2020/129730 A1 | 6/2020 |

OTHER PUBLICATIONS

International Preliminary Report on Patentability mailed May 14, 2021 for PCT/JP2019/042600.
International Preliminary Report on Patentability mailed May 14, 2021 for PCT/JP2019/042662.
International Preliminary Report on Patentability mailed May 14, 2021 for PCT/JP2019/042627.
International Preliminary Report on Patentability mailed May 14, 2021 for PCT/JP2019/042602.
International Preliminary Report on Patentability mailed May 14, 2021 for PCT/JP2019/042610.
International Preliminary Report on Patentability mailed May 14, 2021 for PCT/JP2019/042589.
International Preliminary Report on Patentability mailed May 14, 2021 for PCT/JP2019/042635.

(56) References Cited

OTHER PUBLICATIONS

International Preliminary Report on Patentability mailed May 14, 2021 for PCT/JP2019/042584.

* cited by examiner

Fig.11
(a)
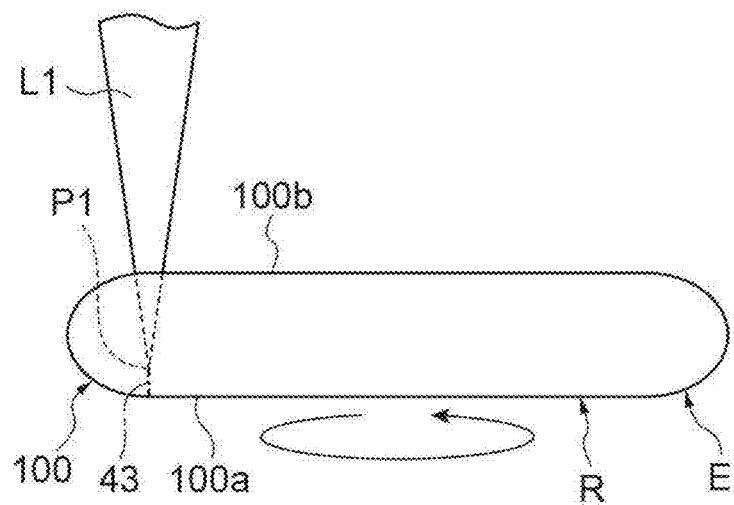
(b)
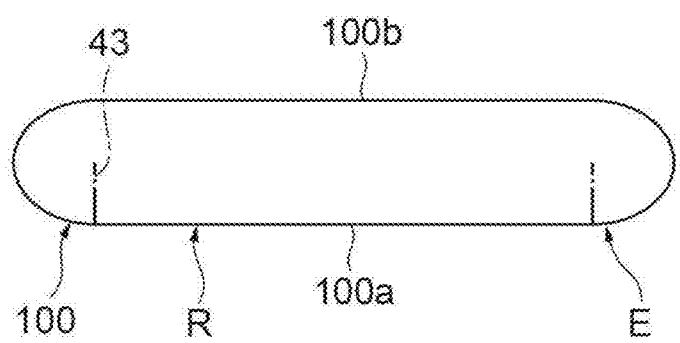

Fig.13
(a)
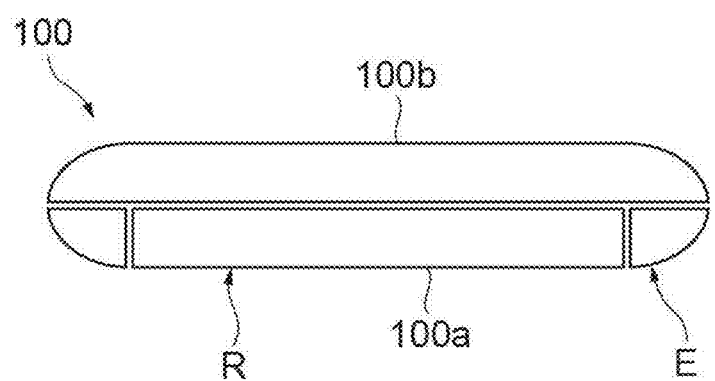
(b)
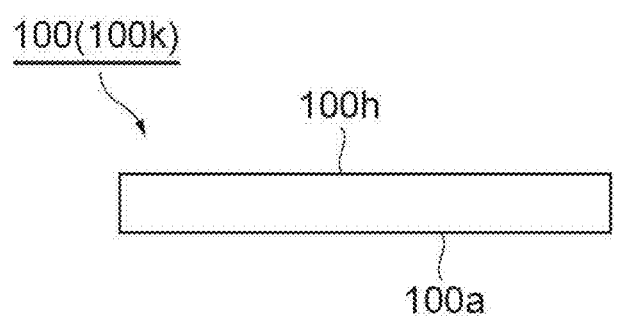

Fig.16
(a)
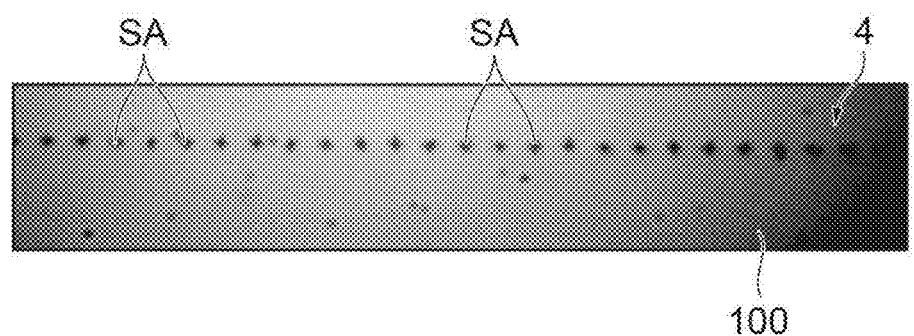
(b)
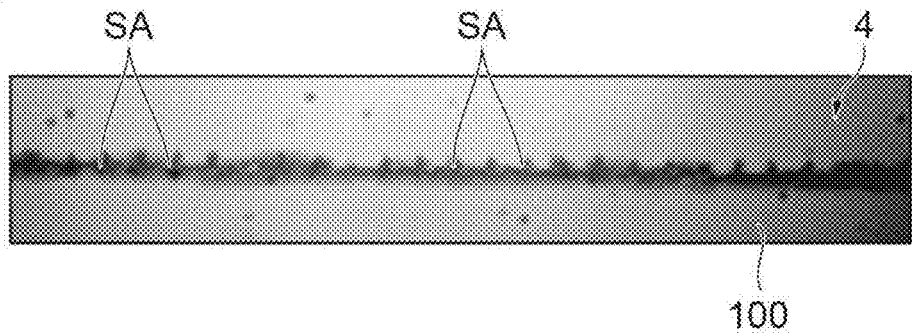

Fig.17
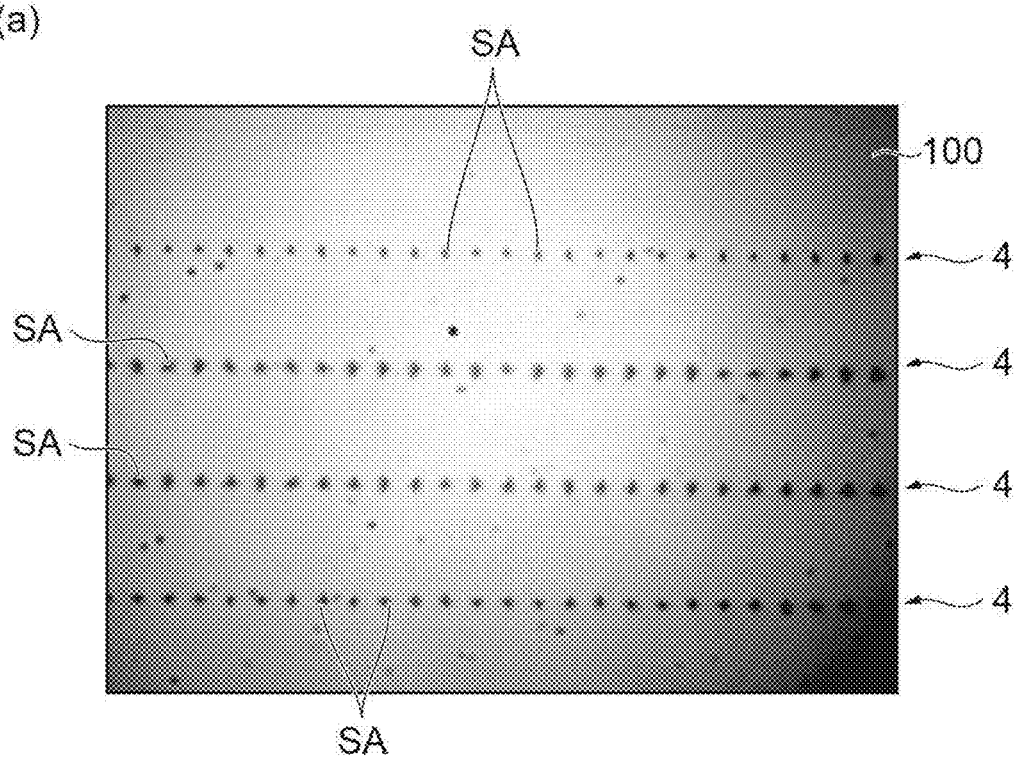
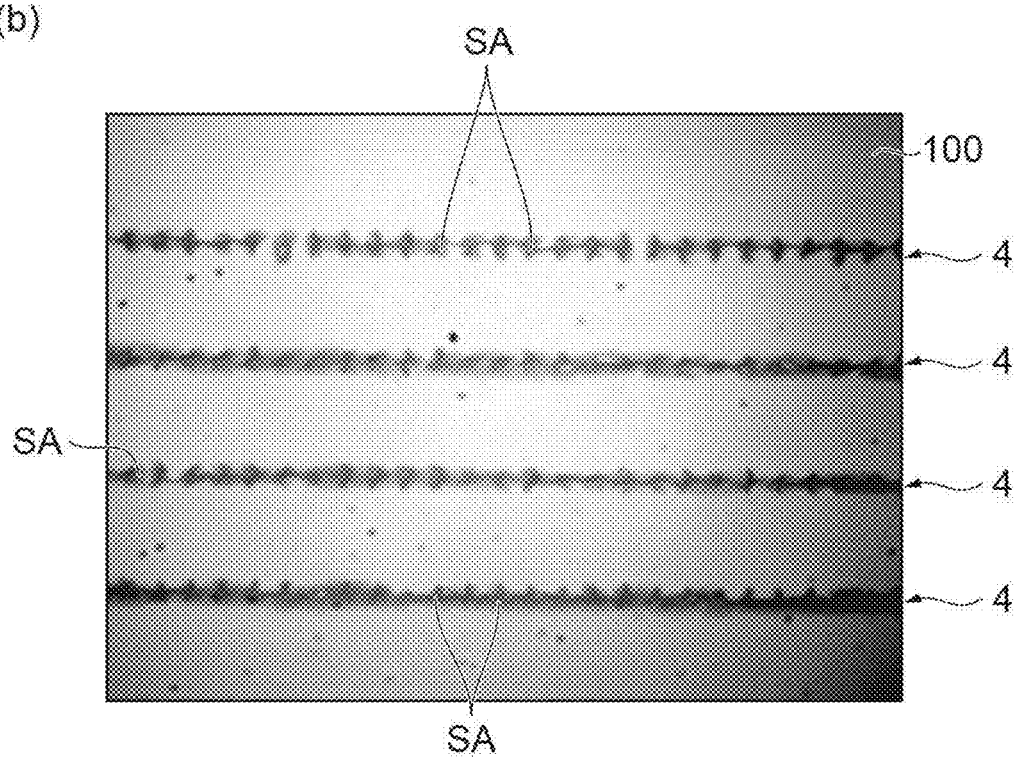

*Fig.18*
(a)
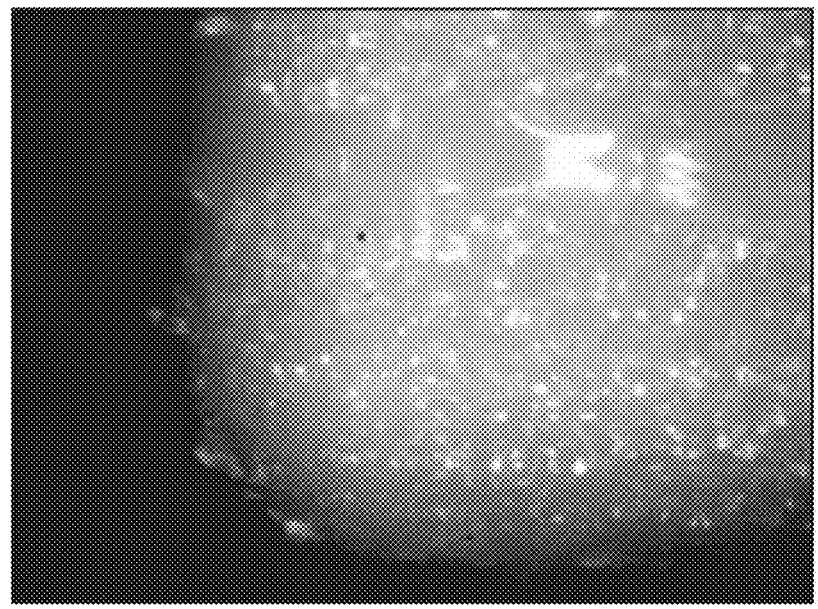
(b)
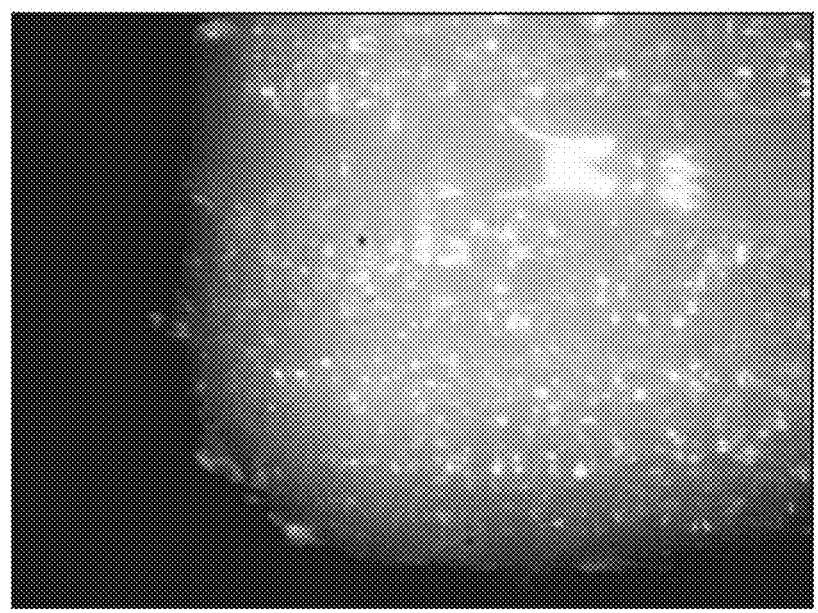

Fig.20
(a)
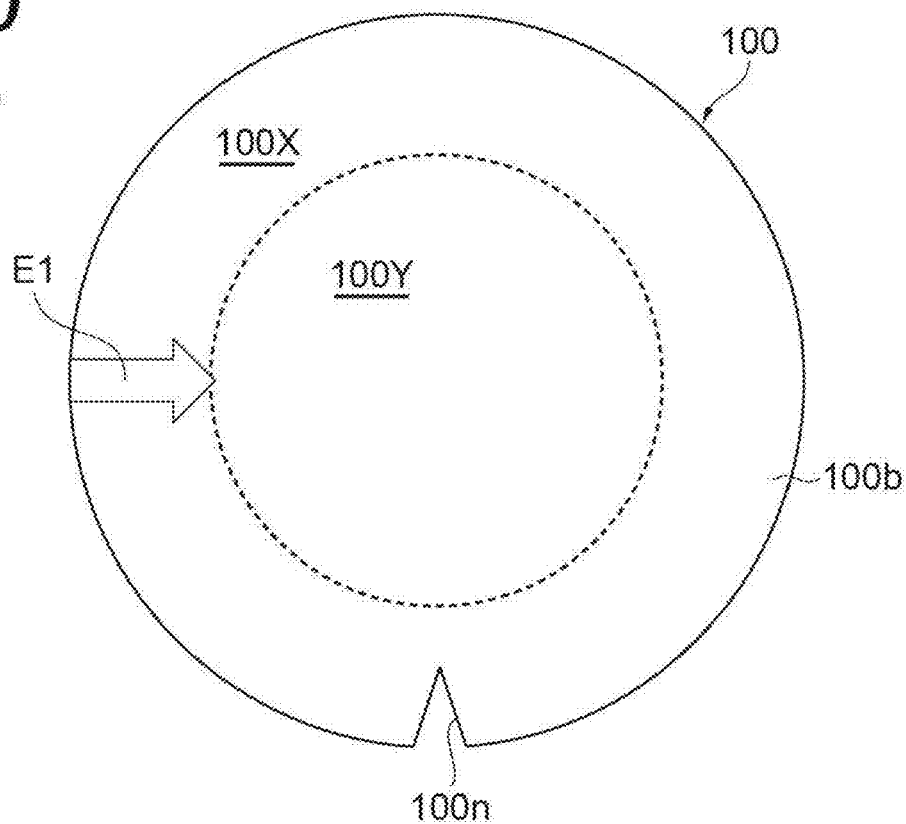
(b)
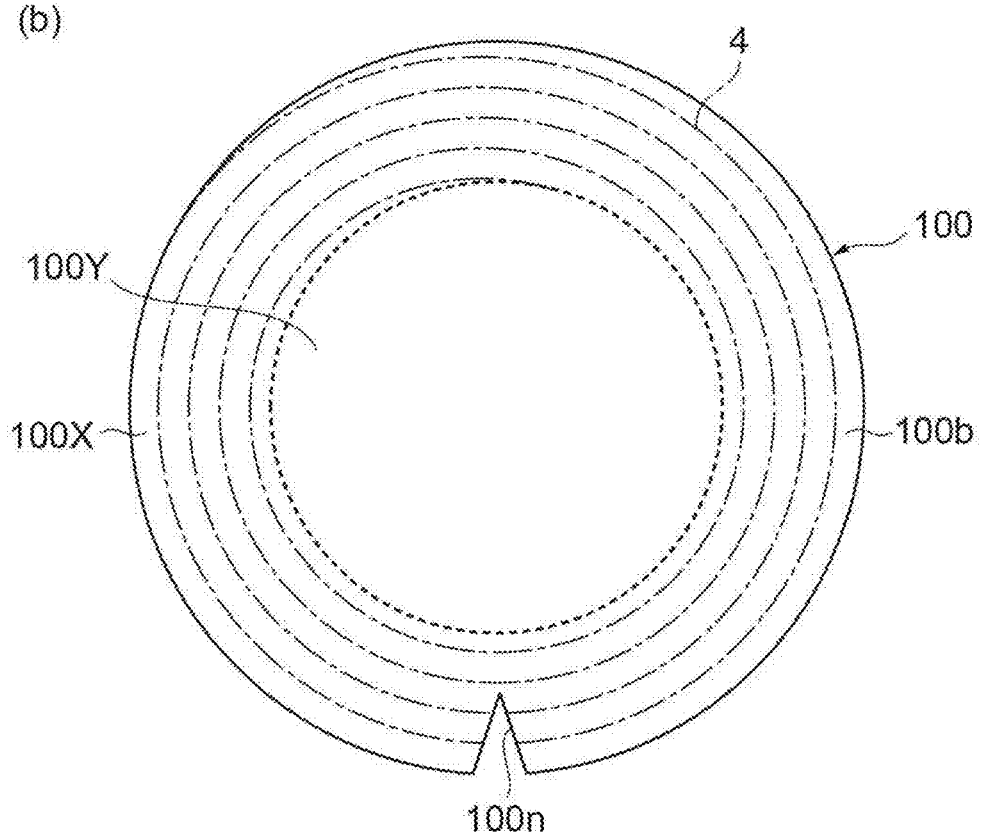

Fig.21
(a)
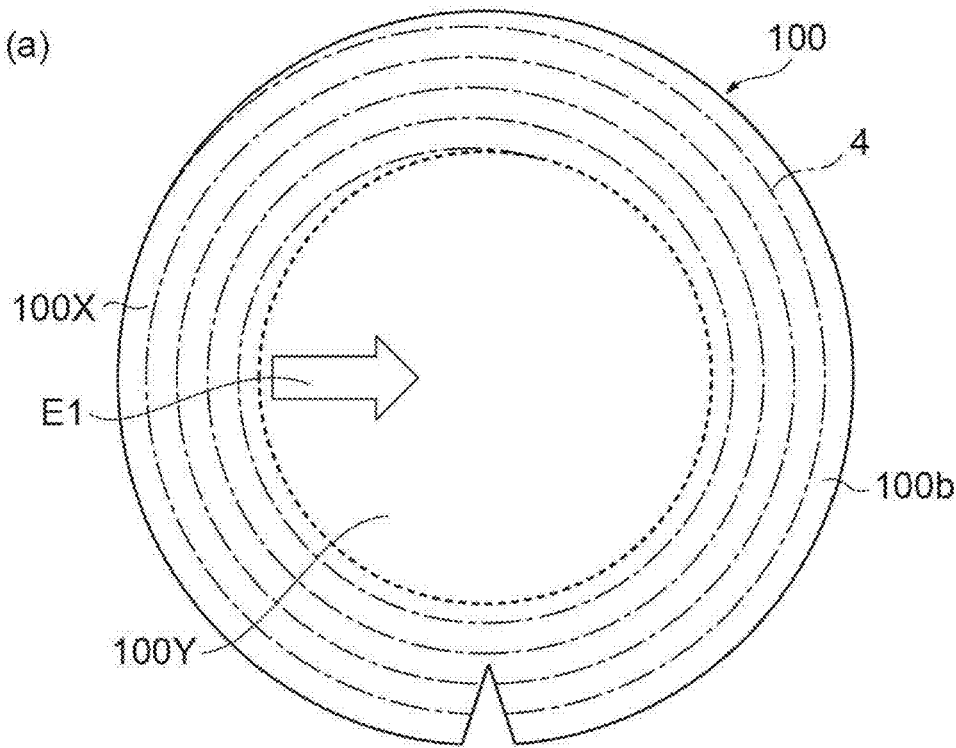
(b)
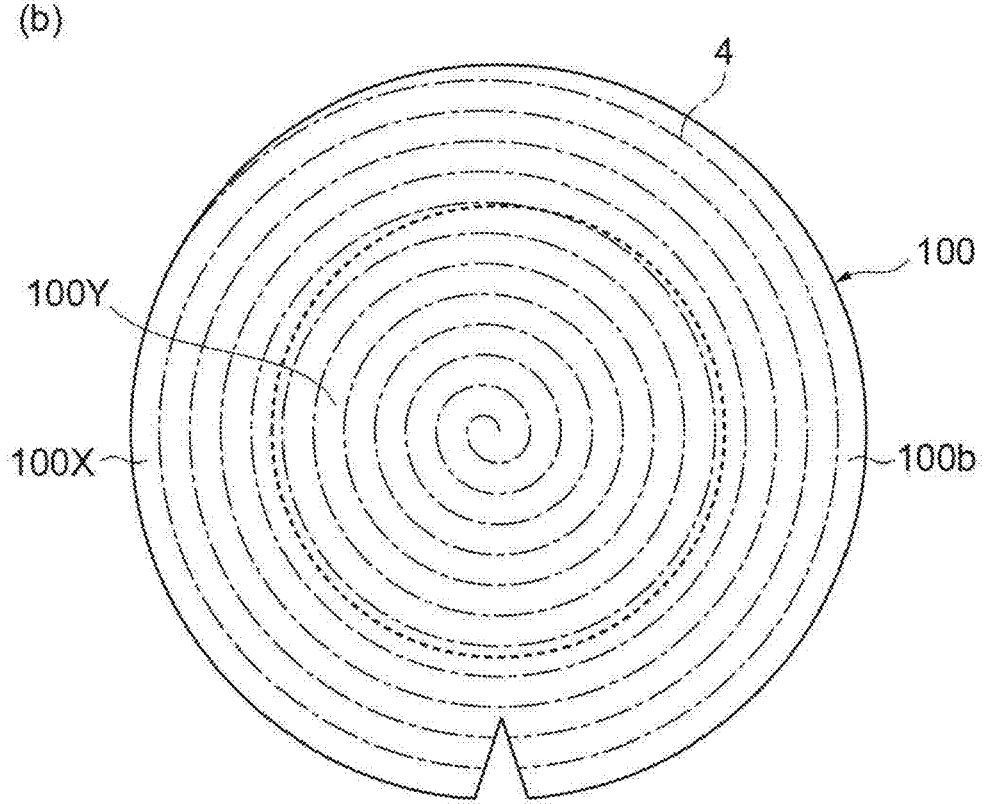

Fig. 23

| | | PROCESSING LINE COUNT: 10 | | PROCESSING LINE COUNT: 50 | | PROCESSING LINE COUNT: 100 | |
|---|---|---|---|---|---|---|---|
| | | OUTER CIRCUMFERENTIAL PORTION | INNER CIRCUMFERENTIAL PORTION | OUTER CIRCUMFERENTIAL PORTION | INNER CIRCUMFERENTIAL PORTION | OUTER CIRCUMFERENTIAL PORTION | INNER CIRCUMFERENTIAL PORTION |
| FORWARD SIDE IN INDEX DIRECTION | ENLARGED IMAGE (x50) | | | | | | |
| | ENLARGED IMAGE (x10) | | | | | | |
| | CRACK WIDTH | 94.4~51.2 μm | 154.2 μm | 31.6 μm | 49.2 μm | 68.8 μm | 72.8 μm |
| REAR SIDE IN INDEX DIRECTION | ENLARGED IMAGE (x50) | | | | | | |
| | ENLARGED IMAGE (x10) | | | | | | |
| | CRACK WIDTH | | 60 μm | | 140 μm | | 163.2 μm |

*Fig.24*
(a)
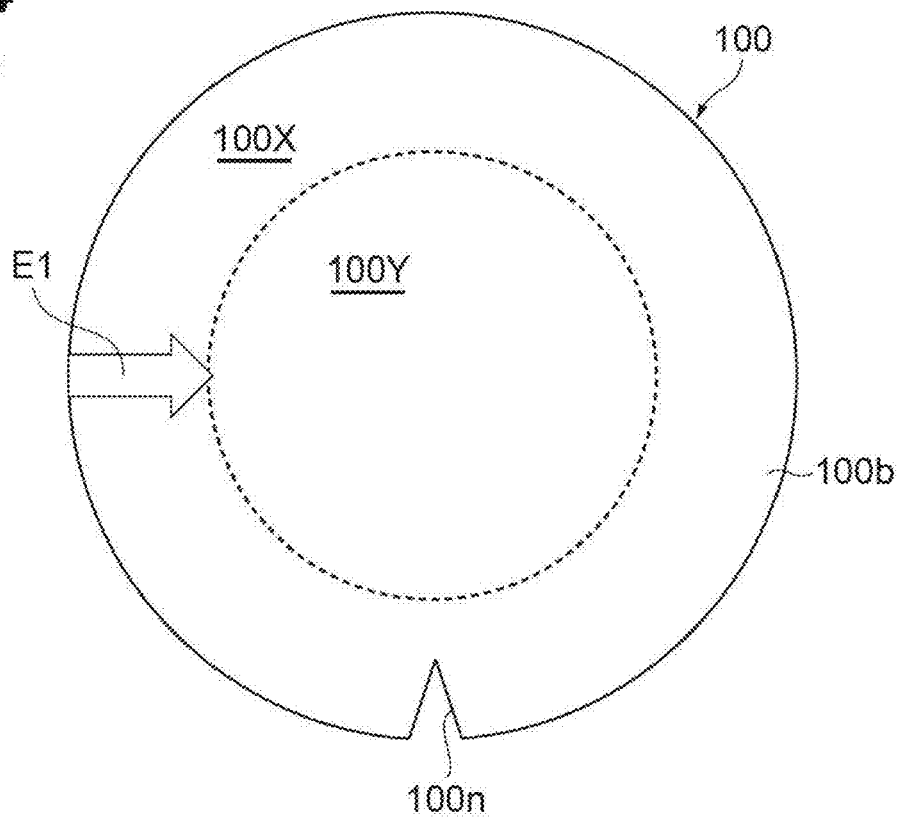
(b)
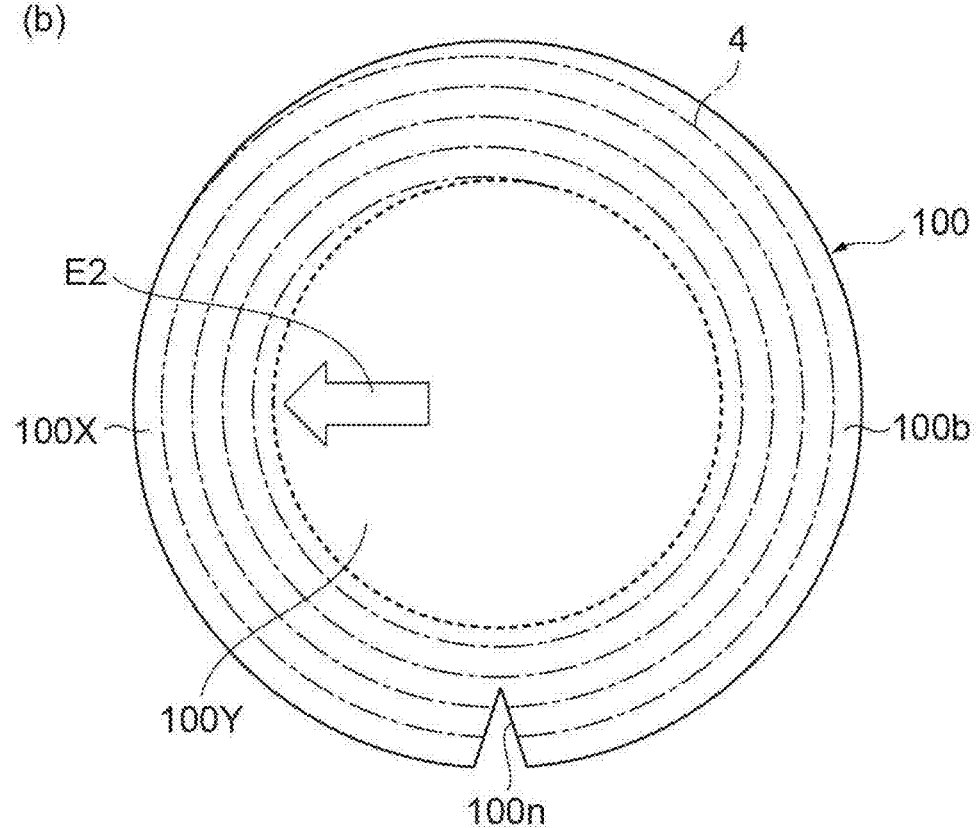

Fig.28

| PE | 6.48 μJ | 9.08 μJ | 12.97 μJ | 16.73 μJ | 25 μJ | 31.3 μJ | 56 μJ | 68 μJ | 81.25 μJ |
|---|---|---|---|---|---|---|---|---|---|
| PROCESSING STATE | SST | SHC | SHC | SHC | SHC | SHC | SHC | SST | SST |
| WHETHER CONTROL CAN BE PERFORMED | NO | NO | YES | YES | YES | NO | NO | NO | NO |

Fig.29
(a)
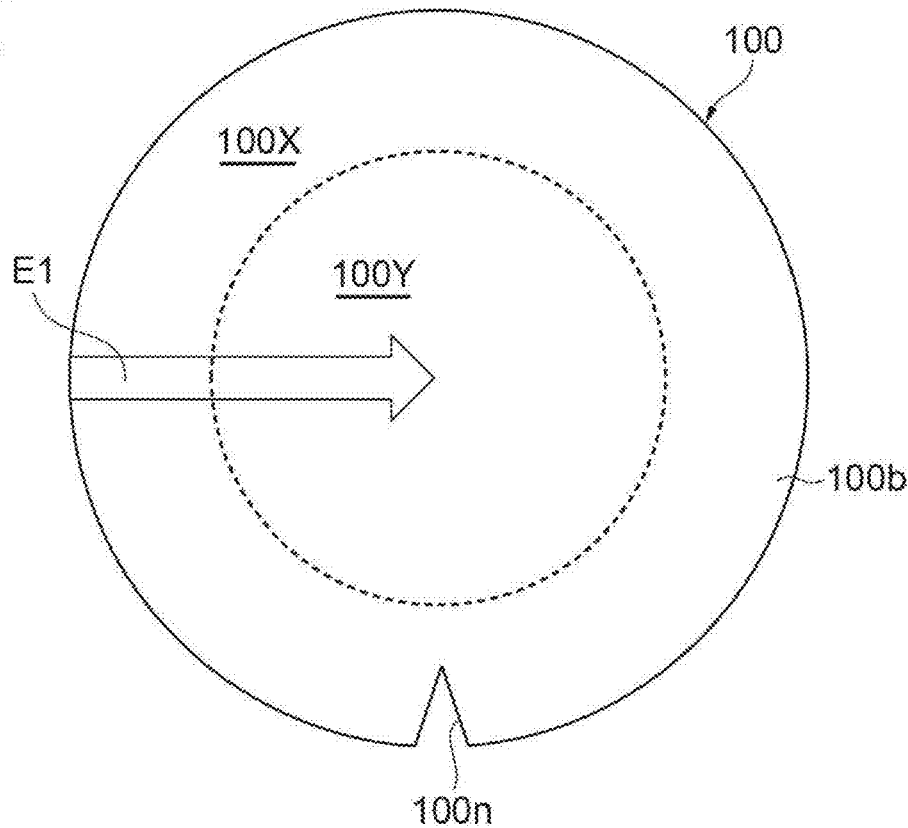
(b)
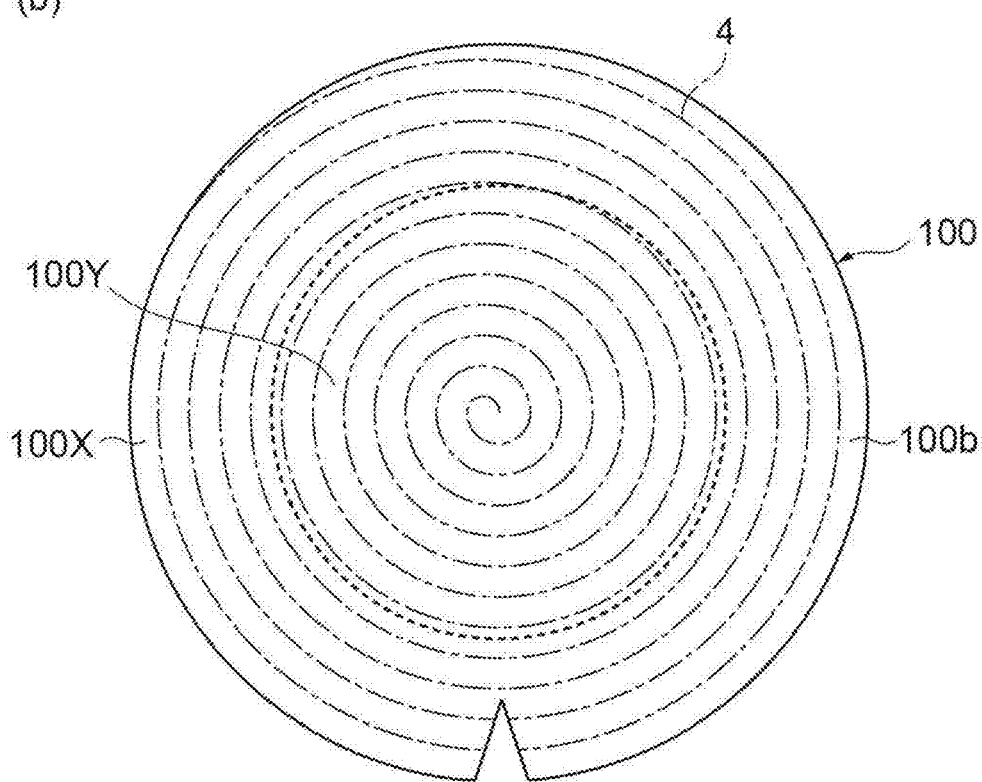

*Fig.36*
(a)
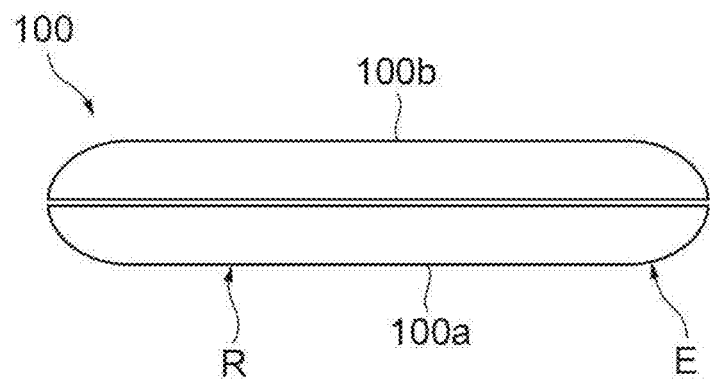
(b)
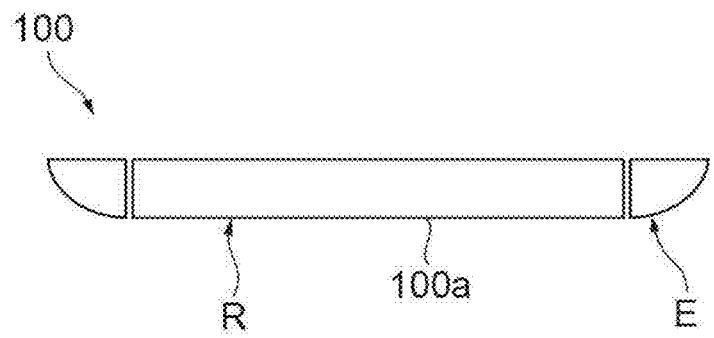

Fig.37
(a)
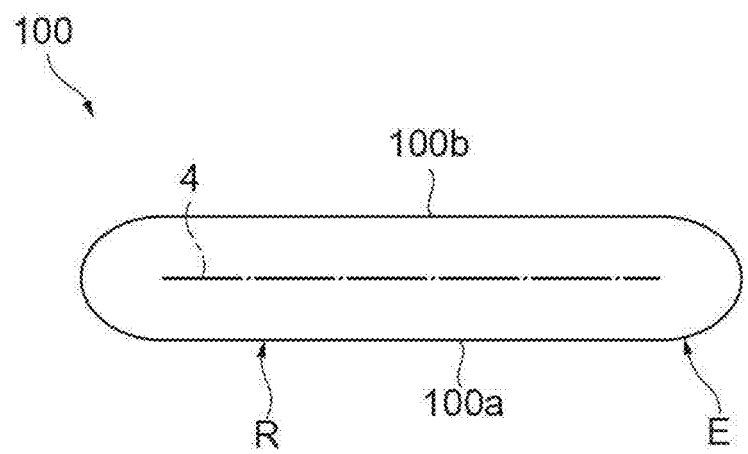
(b)
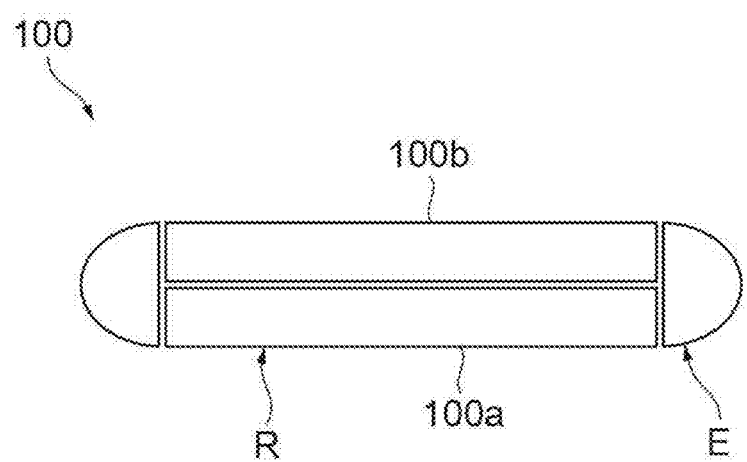

Fig.38
(a)
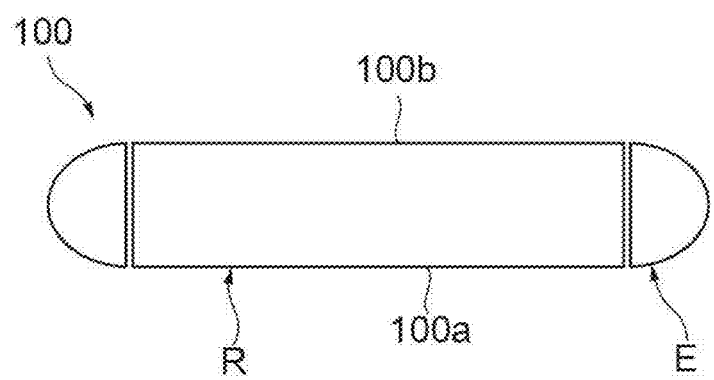
(b)
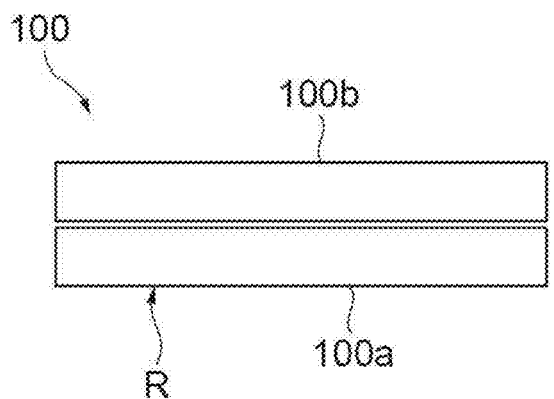

Fig.43
(a)
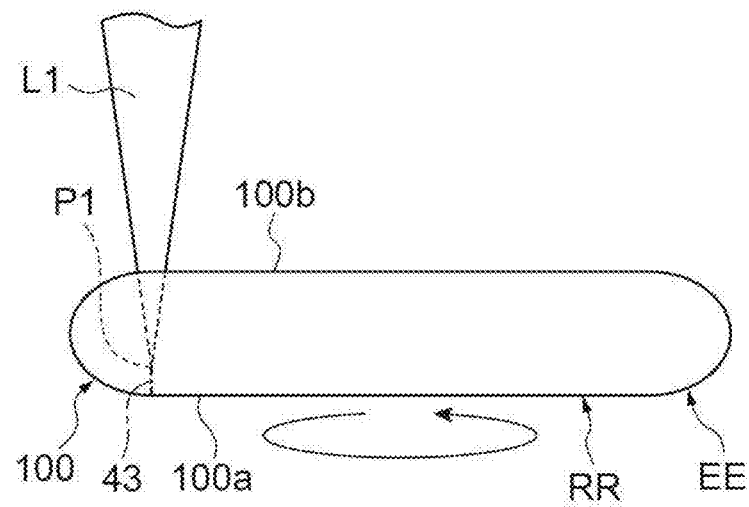
(b)
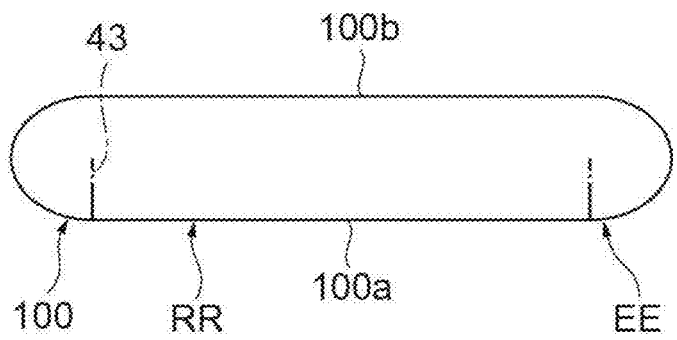

Fig.48
(a)
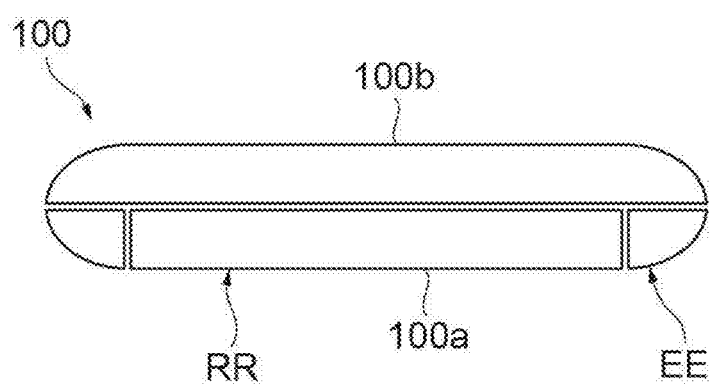
(b)
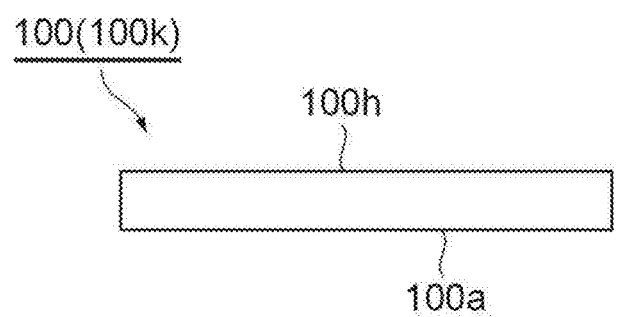

Fig.49
(a)
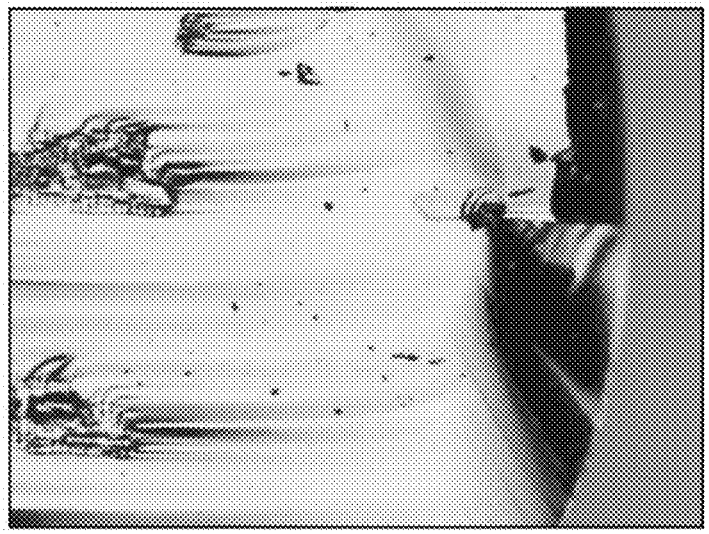
(b)

Fig.51
(a)
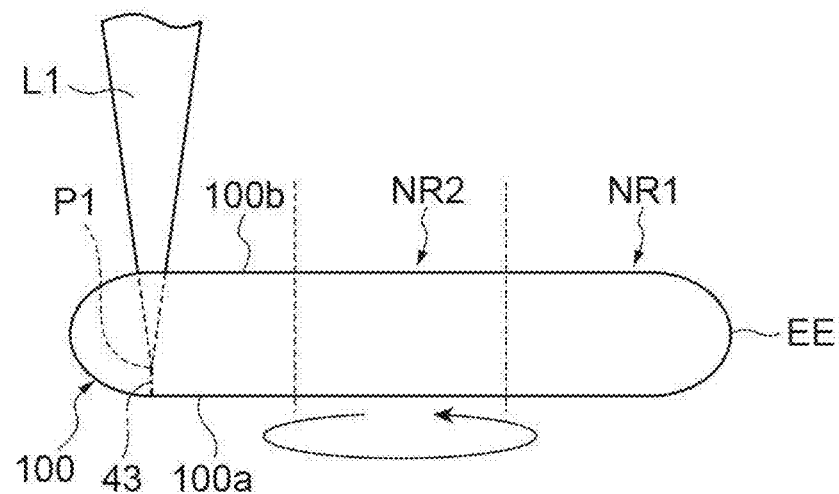
(b)
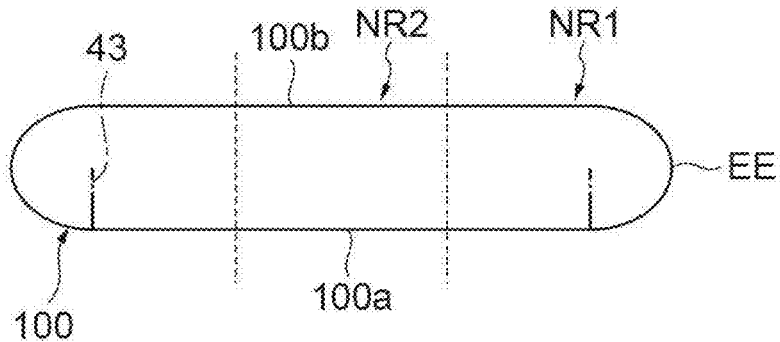

Fig.52
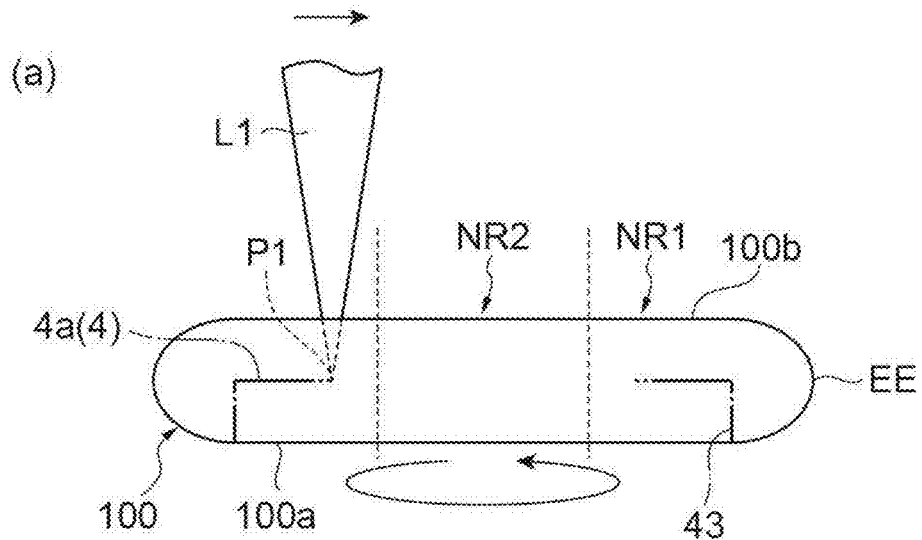
(a)
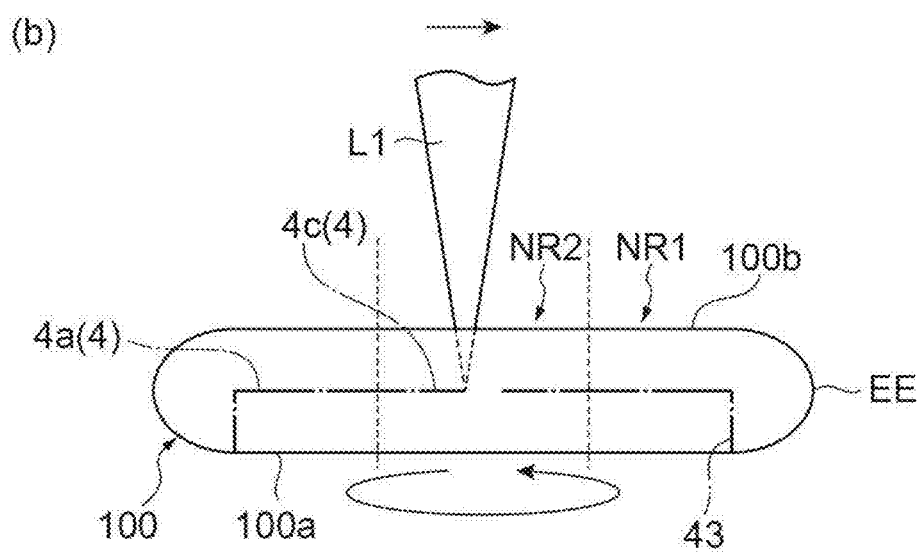
(b)
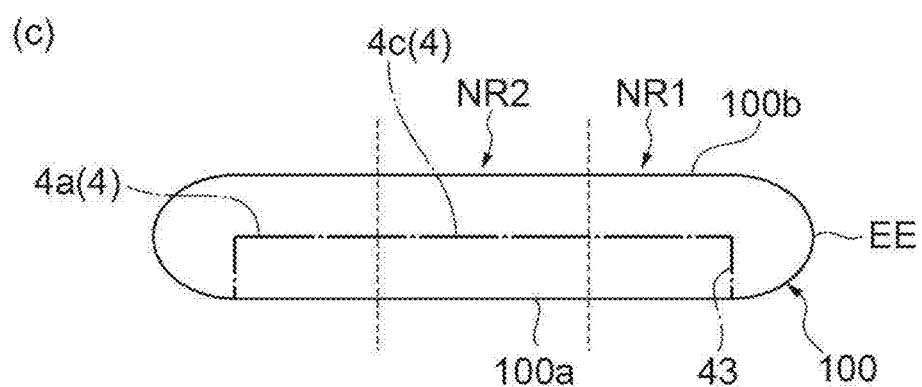
(c)

Fig.54
(a)
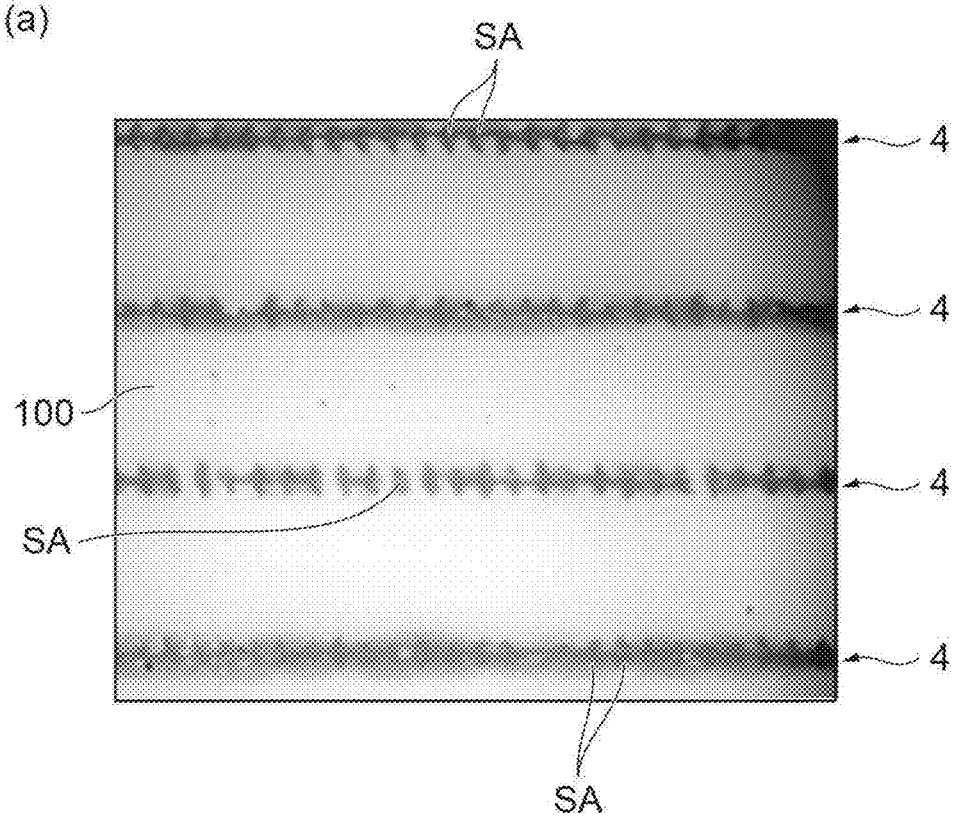
(b)
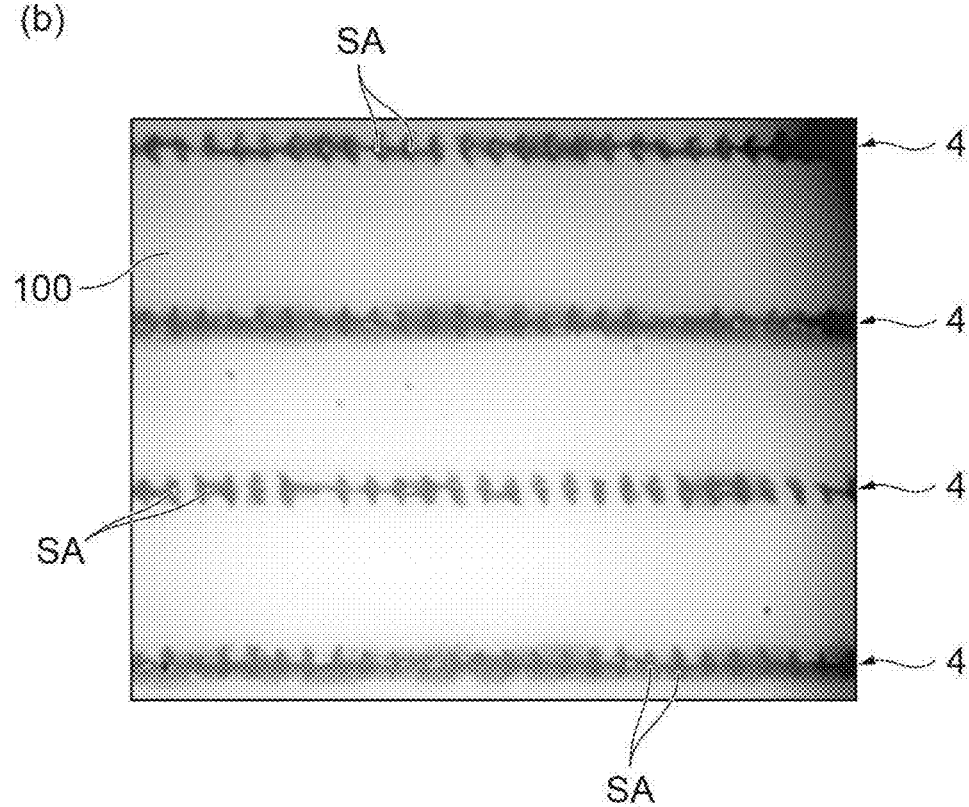

LASER PROCESSING APPARATUS AND LASER PROCESSING METHOD

TECHNICAL FIELD

One aspect of the present invention relates to a laser processing apparatus and a laser processing method.

BACKGROUND ART

Patent Literature 1 describes a laser processing apparatus including a holding mechanism for holding a workpiece and a laser irradiation mechanism for irradiating the workpiece held by the holding mechanism with a laser light. In the laser processing apparatus described in Patent Literature 1, the laser irradiation mechanism including a condensing lens is fixed to a base, and the holding mechanism moves the workpiece in a direction orthogonal to the optical axis of the condensing lens.

CITATION LIST

Patent Literature

Patent Literature 1: Japanese Patent No. 5456510

SUMMARY OF INVENTION

Technical Problem

The laser processing apparatus as described above has been increasingly used in recent years for example, and thus has been desired to implement laser processing meeting various needs such as a better takt time.

In view of this, an object of one aspect of the present invention is to provide a laser processing apparatus and a laser processing method with which laser processing meeting various needs can be performed.

Solution to Problem

A laser processing apparatus according to one aspect of the present invention is a laser processing apparatus that irradiates a target with a laser light to form a modified region along a virtual plane in the target and includes: a support portion configured to support the target; an irradiation portion configured to irradiate the target supported by the support portion with the laser light; a movement mechanism configured to move at least one of the support portion and the irradiation portion to move a position of a focusing point of the laser light along the virtual plane; and a controller configured to control the support portion, the irradiation portion, and the movement mechanism. The controller performs a first processing process of irradiating a first portion in the target with the laser light under a first processing condition, and a second processing process of irradiating a second portion more on an inner side than the first portion in the target with the laser light under a second processing condition different from the first processing condition, after the first processing process.

With the laser processing apparatus, a first processing process can be performed on a first portion of a target with a laser light emitted under a first processing condition, and a second processing process can be performed on a second portion on the inner side of the target with the laser light emitted under a second processing condition. Thus, a laser processing apparatus and a laser processing method with which laser processing meeting various needs can be performed can be provided.

In the laser processing apparatus according to one aspect of the present invention, the first portion may be a portion in the target including a circumferential edge portion including a side surface intersecting with a laser light incident surface of the target.

In the laser processing apparatus according to one aspect of the present invention, in the first processing process, a region in which the modified region is formed in the target may shift in a first direction toward the inner side from a circumferential edge. The inventors of the present invention have made vigorous studies and found that when the modified region is formed along the virtual plane, the advancement direction of the crack extending along the virtual plane from the modified region has a large impact on a shifting direction of the region in the target in which the modified region is formed. Specifically, the inventors have found that the crack is likely to advance stably in the direction opposite to the shifting direction. In view of this, when the region in the first portion, including the bevel portion (the circumferential edge portion including a side surface intersecting with the laser light incident surface in the target), where the modified region is formed shifts in the first direction toward the inner side from the circumferential edge, stable advancement of the cracks in a direction toward the circumferential edge from the inner side, which is a direction opposite to the first direction, is facilitated. As a result, the crack can be formed even in the bevel portion, which is difficult to process, and the target can be reliably peeled. In the second portion more on the inner side than the first portion, the laser processing can be performed under the second processing condition as the desired processing condition, whereby laser processing meeting various needs can be implemented.

In the laser processing apparatus according to one aspect of the present invention, in the first processing process, a crack extending from the modified region along the virtual plane may be formed in the circumferential edge portion. In this case, the cracks are also formed in the circumferential edge portion that is difficult to process.

In the laser processing apparatus according to one aspect of the present invention, in the first processing process, the modified region may be formed toward the inner side from the circumferential edge along a processing line spirally extending toward the inner side from the circumferential edge in the target, or a plurality of the modified regions may be formed along a plurality of linear processing lines arranged in a direction toward the inner side from the circumferential edge in the target, the plurality of modified regions being formed sequentially from the circumferential edge toward the inner side. Thus, shifting of the region in which the modified region is formed in the first portion including the bevel portion in the first direction toward the inner side from the circumferential edge can be specifically implemented.

In the laser processing apparatus according to one aspect of the present invention, the first processing condition and the second processing condition may be conditions under which a first slicing state is established as a processing state when the modified region is formed by emitting the laser light along a single processing line, and the first slicing state may be a state in which cracks extending from a plurality of modified spots included in the modified region advance in a direction along the single processing line. Under such processing conditions, the target can be reliably peeled.

In the laser processing apparatus according to one aspect of the present invention, the first processing condition and the second processing condition may be conditions under which a second slicing state is established as a processing state when the modified region is formed by emitting the laser light along a processing line including a plurality of parallel lines arranged side by side, and the second slicing state may be a state in which the cracks extending from the plurality of modified spots included in the modified region advance in a direction along the parallel lines and a direction intersecting with the parallel lines to be connected to each other. Under such processing conditions, the target can be reliably peeled.

In the laser processing apparatus according to one aspect of the present invention, the first processing condition may be a condition under which the second slicing state is established as a processing state after laser processing of a first specified amount, and the second processing condition may be a condition under which the second slicing state is established as a processing state after laser processing of a second specified amount larger than the first specified amount. In this case, under the second processing condition, the plurality of modified spots included in the modified region formed can be rough, compared with those under the first processing condition, whereby the laser processing can be efficiently performed. Thus, laser processing can be performed with a better takt time.

In the laser processing apparatus according to one aspect of the present invention, the movement mechanism may move at least one of the support portion and the irradiation portion to make the position of the focusing point of the laser light move in a direction intersecting with the virtual plane, and the controller may perform trimming process of forming the modified region by irradiating, with the laser light, a portion more on a side opposite to the laser light incident surface than the virtual plane in the target, along a processing line extending annularly on the inner side of the circumferential edge of the target, before the first processing process. Thus, the trimming processing of removing the portion on the circumferential edge side of the processing line extending annularly can be implemented. With the trimming processing thus being executable before the target is peeled, the laser light can be prevented from being emitted to pass through the cracks produced by the peeling, compared with a case where the trimming processing is performed after the peeling.

In the laser processing apparatus according to one aspect of the present invention, in the second processing process, a region in which the modified region is formed in the target may shift in the first direction. As a result, the target can be reliably peeled.

In the laser processing apparatus according to one aspect of the present invention, in the second processing process, a region in which the modified region is formed in the target may shift in a second direction opposite to the first direction, and a distance of the first portion in the first direction may be equal to or shorter than a predetermined distance set in advance. As a result, the target can be reliably peeled.

The laser processing apparatus according to one aspect of the present invention may further include an input portion configured to receive an input from a user, and the controller may set at least one of the first processing condition and the second processing condition based on the input made on the input portion. Thus, at least one of the first processing condition and the second processing condition can be set as desired.

In the laser processing apparatus according to one aspect of the present invention, the controller may perform a third processing process of irradiating the first portion in the target with the laser light under another processing condition different from the first processing condition, during the first processing process. Also in this case, the target can be reliably peeled.

In the laser processing apparatus according to one aspect of the present invention, the second processing condition may be a condition under which a second slicing state is established as a processing state after laser processing of a first specified amount when the modified region is formed by emitting the laser light along a processing line including a plurality of parallel lines arranged side by side, the first processing condition may be a condition under which a first slicing state or the second slicing state is established as a processing state after laser processing of a second specified amount larger than the first specified amount when the modified region is formed by emitting the laser light along the processing line including the plurality of parallel lines, the first portion may be a portion in the target excluding a circumferential edge portion including a side surface intersecting with a laser light incident surface, the first slicing state may be a state in which cracks extending from a plurality of modified spots included in the modified region advance in a direction along a single processing line, and the second slicing state may be a state in which the cracks extending from the plurality of modified spots included in the modified region advance in a direction along the parallel lines and a direction intersecting with the parallel lines to be connected to each other. In this case, the peeling processing without the crack extending to the circumferential edge portion of the target can be effectively performed.

A laser processing method according to one aspect of the present invention is a laser processing method that irradiates a target with a laser light to form a modified region along a virtual plane in the target and includes: a first processing step of irradiating a first portion in the target including a circumferential edge portion including a side surface intersecting with a laser light incident surface with the laser light under a first processing condition; and a second processing process of irradiating a second portion more on an inner side than the first portion in the target with the laser light under a second processing condition different from the first processing condition, after the first processing step. In the first processing step, a region in which the modified region is formed in the target advances in a first direction toward the inner side from a circumferential edge.

With the laser processing method, when the region in the first portion where the modified region is formed shifts in the first direction toward the inner side from the circumferential edge, stable advancement of the cracks in a direction toward the circumferential edge from the inner side, which is a direction opposite to the first direction, is facilitated. As a result, the crack can be formed even in the bevel portion, which is difficult to process, and the target can be reliably peeled. In the second portion more on the inner side than the first portion, the laser processing can be performed under the second processing condition as the desired processing condition, whereby laser processing meeting various needs can be implemented.

With a laser processing apparatus as described in Patent Literature 1 above may irradiate a target with a laser light to form a modified region along a virtual plane in the target. In this case, a part of the target is peeled, with the modified region provided over the virtual plane and the crack extending from the modified region serving as boundaries. With such peeling processing, when the circumferential edge portion of the target includes a side surface (chamfered surface for increasing strength for example) intersecting with the laser light incident surface for example, the laser light may fail to be sufficiently focused at the circumferential edge portion. As a result, a modified region or a crack is difficult to form along the virtual plane in the circumferential edge portion, and thus the target may fail to be peeled. In view of this, an object of one aspect of the present invention may be providing a laser processing apparatus and a laser processing method with which a target can be reliably peeled.

Advantageous Effects of Invention

With one aspect of the present invention, a laser processing apparatus and a laser processing method with which laser processing meeting various needs can be performed can be provided. The target can be reliably peeled off.

BRIEF DESCRIPTION OF DRAWINGS

FIG. 11(a) is a side view of a target illustrating a method of manufacturing a semiconductor device using the laser processing apparatus according to the first embodiment. FIG. 11(b) is a side view of the target continuing from FIG. 11(a).

FIG. 13(a) is a side view of the target continuing from FIG. 12(b). FIG. 13(b) is a side view of the target continuing from FIG. 13(a).

FIG. 16(a) is an image illustrating a slicing stealth state. FIG. 16(b) is an image illustrating a slicing half cut state.

FIG. 17(a) is another image illustrating the slicing stealth state. FIG. 17(b) is another image illustrating the slicing half cut state.

FIG. 18(a) is an image illustrating a slicing full cut state as a processing state after laser processing of a first specified amount. FIG. 18(b) is an image illustrating the slicing full cut state as the processing state after laser processing of a second specified amount.

FIG. 20(a) is a plan view of the target illustrating the peeling processing according to the first embodiment. FIG. 20(b) is a plan view of the target continuing from FIG. 20(a).

FIG. 21(a) is a plan view of the target continuing from FIG. 20(b). FIG. 21(b) is a plan view of the target continuing from FIG. 21(a).

FIG. 23 is a diagram illustrating a result of monitoring the cracks in the target illustrated in FIG. 22.

FIG. 24(a) is a plan view of the target illustrating peeling processing according to a modification example of the first embodiment. FIG. 24(b) is a plan view of the target continuing from FIG. 24(a).

FIG. 28 is a diagram illustrating a result of experiments for examining optimum pulse energy in the peeling processing.

FIG. 29(a) is a plan view of a target illustrating peeling processing according to a second embodiment. FIG. 29(b) is a plan view of the target continuing from FIG. 29(a).

FIG. 36(a) is a side view of the target illustrating a method of manufacturing a semiconductor device according to a modification example. FIG. 36(b) is a side view of the target continuing from FIG. 36(a).

FIG. 37(a) is a side view of the target illustrating a method of manufacturing a semiconductor device according to another modification example. FIG. 37(b) is a side view of the target continuing from FIG. 37(a).

FIG. 38(a) is a side view of the target illustrating a method of manufacturing a semiconductor device according to further another modification example. FIG. 38(b) is a side view of the target continuing from FIG. 38(a).

FIG. 41(b) is a side view of the target illustrated in FIG. 41(a).

FIG. 43(a) is a side view of a target illustrating a method of manufacturing a semiconductor device using the laser processing apparatus of the modification example. FIG. 43(b) is a side view of the target continuing from FIG. 43(a).

FIG. 48(b) is a side view of the target continuing from FIG. 47. FIG. 48(b) is a side view of the target continuing from FIG. 48(a).

FIG. 49(a) is a diagram illustrating a photograph of a cross section of the circumferential edge portion of the target. FIG. 49(b) is a diagram illustrating a photograph of an enlarged cross section of a part in FIG. 49(a).

FIG. 51(a) is a side view of a target illustrating a method of manufacturing a semiconductor device using the laser processing apparatus of another modification example. FIG. 51(b) is a side view of the target continuing from FIG. 51(a).

FIG. 52(a) is a side view of the target continuing from FIG. 51(b). FIG. 52(b) is a side view of the target continuing from FIG. 52(a). FIG. 52(c) is a side view of the target continuing from FIG. 52(b).

FIG. 54(a) is yet another image illustrating the slicing half cut state. FIG. 54(b) is yet another image illustrating the slicing half cut state.

DESCRIPTION OF EMBODIMENTS

Hereinafter, embodiments will be described in detail with reference to the drawings. The same elements in the figures will be denoted by the same reference signs, and overlapping descriptions will be omitted.

First of all, the basic configuration, operation, effects, and a modification example of a laser processing apparatus will be described.

[Configuration of Laser Processing Apparatus]

Figure 1:
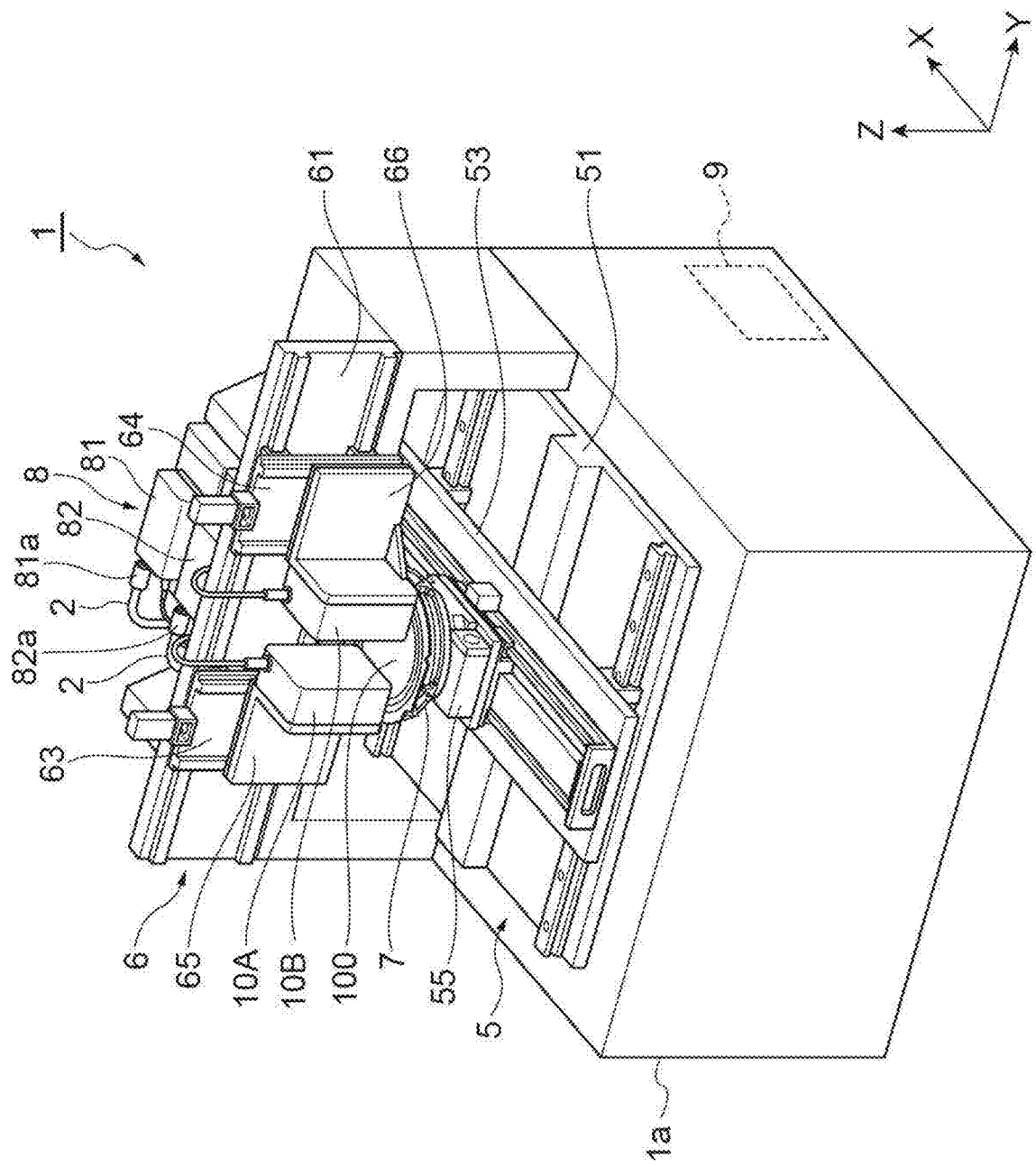
FIG. 1 is a perspective view of a laser processing apparatus of an embodiment.

As illustrated in FIG. 1, a laser processing apparatus 1 includes a plurality of movement mechanisms 5 and 6, a support portion 7, a pair of laser processing heads 10A and 10B, a light source unit 8, and a controller 9. Hereinafter, a first direction is referred to as an X direction, a second direction orthogonal to the first direction is referred to as a Y direction, and a third direction orthogonal to the first direction and the second direction is referred to as a Z direction. In the present embodiment, the X direction and the Y direction are horizontal directions, and the Z direction is a vertical direction.

The movement mechanism 5 includes a fixed portion 51, a moving portion 53, and an attachment portion 55. The fixed portion 51 is attached to a device frame 1a. The moving portion 53 is attached to a rail provided on the fixed portion 51, and can move along the Y direction. The attachment portion 55 is attached to a rail provided on the moving portion 53, and can move along the X direction.

The movement mechanism 6 includes a fixed portion 61, a pair of moving portions 63 and 64, and a pair of attachment portions 65 and 66. The fixed portion 61 is attached to the device frame 1a. The pair of moving portions 63 and 64 are each attached to a rail provided on the fixed portion 61, and can each independently move along the Y direction. The attachment portion 65 is attached to a rail provided on the moving portion 63, and can move along the Z direction. The attachment portion 66 is attached to a rail provided on the moving portion 64, and can move along the Z direction. Thus, the pair of attachment portions 65 and 66 can respectively move along the Y direction and the Z direction relative to the device frame 1a. The moving portions 63 and 64 respectively form first and second horizontal movement mechanisms (horizontal movement mechanism), respectively. The attachment portions 65 and 66 respectively form first and second vertical movement mechanisms (vertical movement mechanism).

The support portion 7 is attached to a rotation shaft provided to the attachment portion 55 of the movement mechanism 5, and can rotate about an axis parallel to the Z direction. Thus, the support portion 7 can move along each of the X direction and the Y direction, and can rotate about the axis parallel to the Z direction. The support portion 7 supports a target 100. The target 100 is, for example, a wafer.

Figure 2:
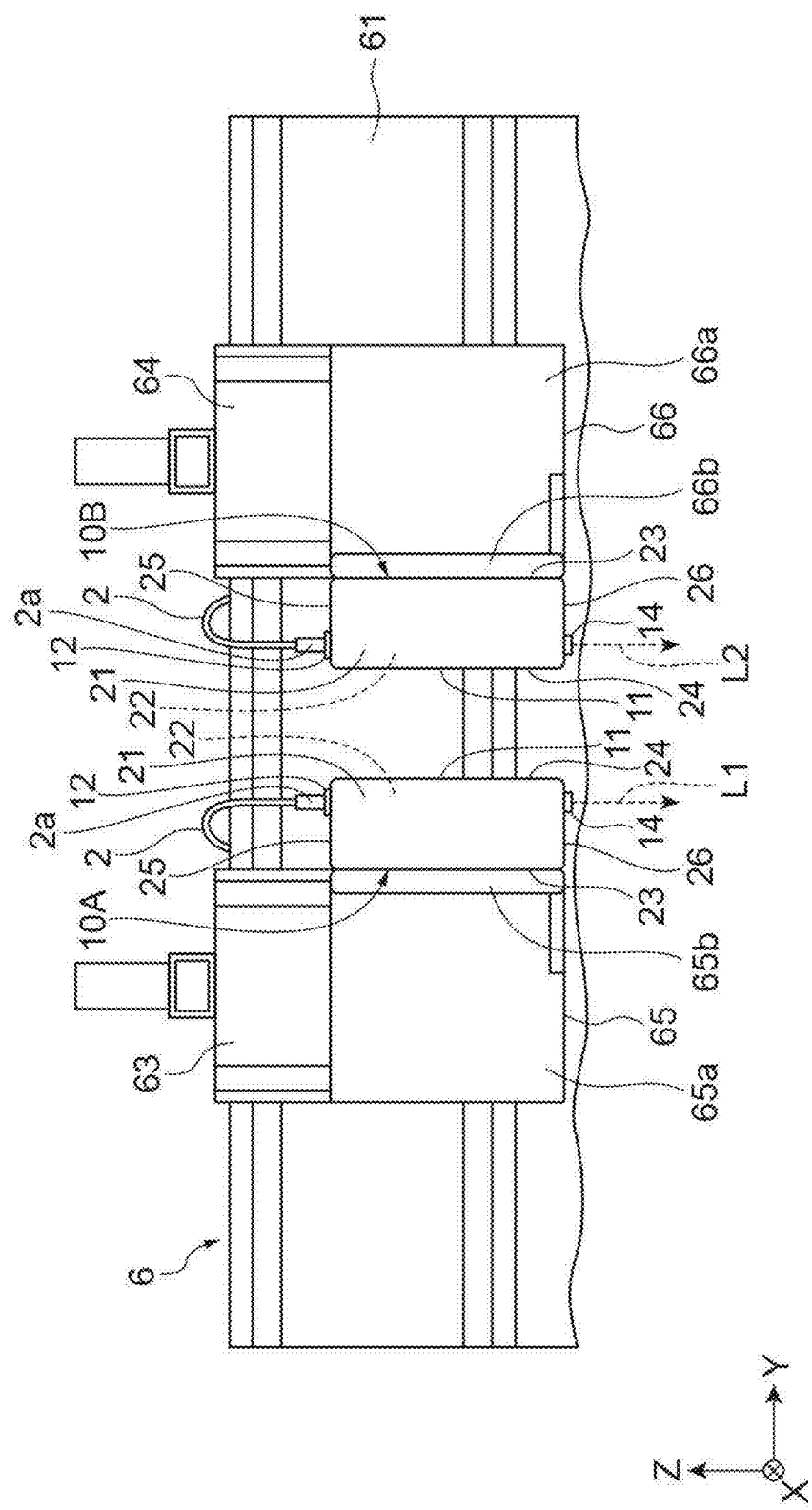
FIG. 2 is a front view of a portion of the laser processing apparatus illustrated in FIG. 1.

As illustrated in FIGS. 1 and 2, the laser processing head 10A is attached to the attachment portion 65 of the movement mechanism 6. The laser processing head 10A irradiates the target 100, supported by the support portion 7, with a laser light L1 (also referred to as "first laser light L1"), while facing the support portion 7 in the Z direction. The laser processing head 10B is attached to the attachment portion 66 of the movement mechanism 6. The laser processing head 10B irradiates the target 100, supported by the support portion 7, with a laser light L2 (also referred to as "second laser light L2"), while facing the support portion 7 in the Z direction. The laser processing heads 10A and 10B serve as an irradiation portion.

The light source unit 8 includes a pair of light sources 81 and 82. The light source 81 outputs the laser light L1. The laser light L1 is emitted from an emission portion 81a of the light source 81, and is guided to the laser processing head 10A by an optical fiber 2. The light source 82 outputs the laser light L2. The laser light L2 is emitted from an emission portion 82a of the light source 82, and is guided to the laser processing head 10B by another optical fiber 2.

The controller 9 controls each part of the laser processing apparatus 1 (such as the support portion 7, the plurality of movement mechanisms 5 and 6, the pair of laser processing heads 10A and 10B, and the light source unit 8). The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

An example of processing by the laser processing apparatus 1 configured as described above will be described. This example processing is an example in which a modified region is formed inside the target 100 along a plurality of lines set to form a grid pattern for cutting the target 100, which is a wafer, into a plurality of chips.

First of all, the movement mechanism 5 moves the support portion 7, supporting the target 100, along each of the X direction and the Y direction to make the support portion 7 face the pair of laser processing heads 10A and 10B in the Z direction. Then, the movement mechanism 5 rotates the support portion 7 about the axis parallel to the Z direction to align the plurality of lines extending in one direction on the target 100 with the X direction.

Then, the movement mechanism 6 moves the laser processing head 10A along the Y direction to position the focusing point (a part of the focusing region) of the laser light L1 on one of the lines extending in one direction. Furthermore, the movement mechanism 6 moves the laser processing head 10B along the Y direction to position the focusing point of the laser light L2 on another one of the lines extending in one direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one line extending in one direction, and to relatively move the focusing point of the laser light L2 along another line extending in one direction. In this manner, the laser processing apparatus 1 forms the modified region inside the target 100 along each of the plurality of lines extending in one direction on the target 100.

Subsequently, the movement mechanism 5 rotates the support portion 7 about an axis parallel to the Z direction so that a plurality of lines extending in the other direction orthogonal to one direction of the target 100 are aligned with the X direction.

Subsequently, the movement mechanism 6 moves the laser processing head 10A along the Y direction to position the focusing point of the laser light L1 on one line extending in the other direction. On the other hand, the movement mechanism 6 moves the laser processing head 10B along the Y direction to position the focusing point of the laser light L2 on another line extending in the other direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one extending in the other direction, and to relatively move the focusing point of the laser light L2 along another line extending in the other direction. In this manner, the laser processing apparatus 1 forms the modified region inside the target 100 along each of the plurality of lines extending in the other direction on the target 100 orthogonal to the one direction.

In one example processing described above, the light source 81 outputs the laser light L1 that transmits through the target 100 by pulse oscillation, and the light source 82 outputs the laser light L2 that transmits through the target 100 by pulse oscillation. When such laser lights are focused inside the target 100, the laser lights are mainly absorbed at the portion corresponding to the focusing points of the laser lights, whereby the modified region is formed inside the target 100. The modified region is a region in which the density, refractive index, mechanical strength, and other physical characteristics are different from those of the surrounding non-modified regions. Examples of the modified region include a melting treatment region, a crack region, a dielectric breakdown region, a refractive index change region, and the like.

When the target 100 is irradiated with the laser light output using the pulse oscillation and the focusing point of the laser light is relatively moved along the line set on the target 100, a plurality of modified spots are formed in an aligned manner along the line. One modified spot is formed by irradiation with one pulse laser light. A line of modified region is a collection of a plurality of modified spots aligned. Adjacent modified spots may be connected to each other or separated from each other depending on the relative moving speed of the focusing point of the laser light with respect to the target 100 and the repetition frequency of the laser light. The shape set to be formed by the is not limited to a grid shape, and may be an annular shape, a linear shape, a curved shape, or a shape that is a combination of at least some of these.

[Configuration of Laser Processing Head]

Figure 3:
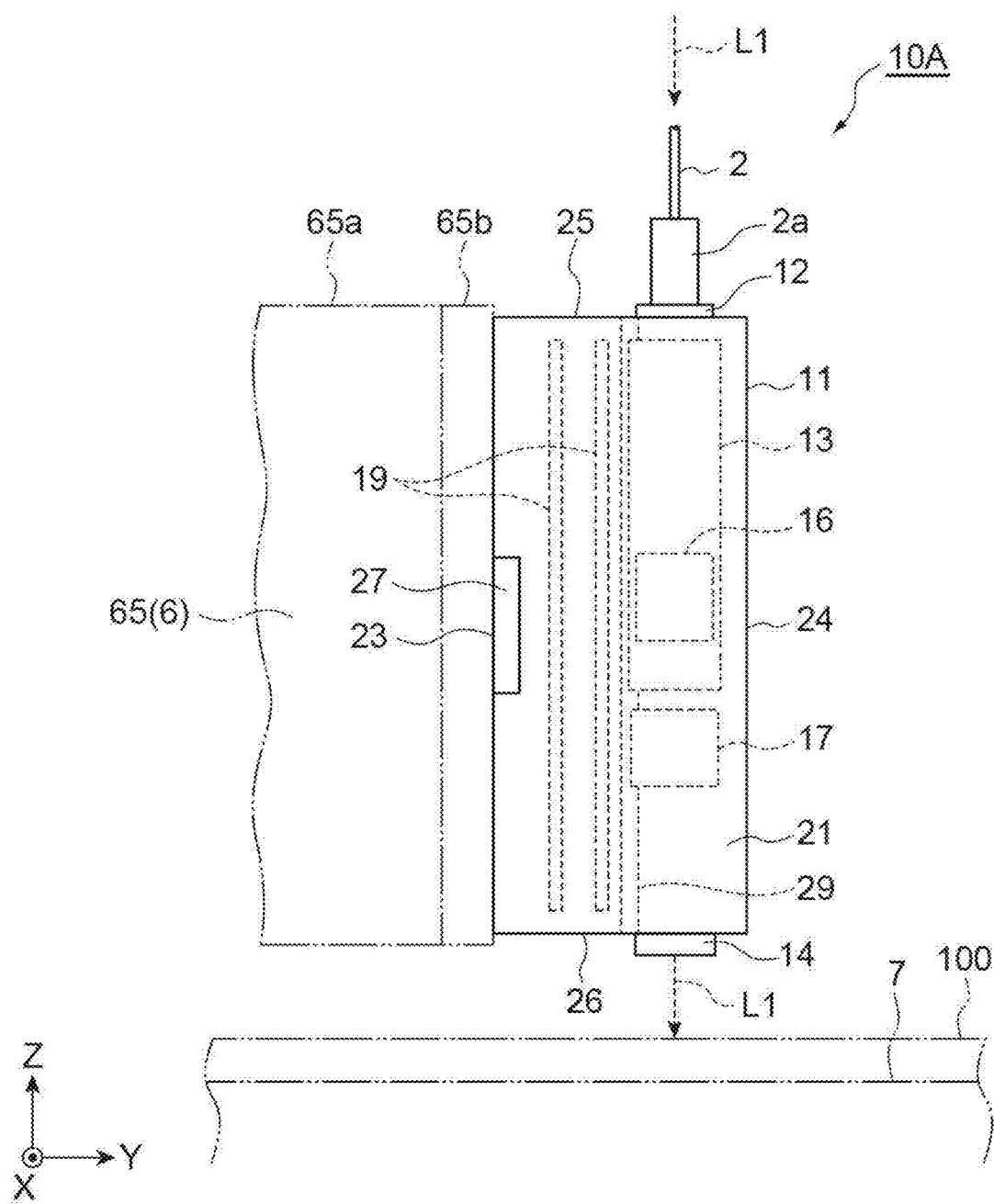
FIG. 3 is a front view of a laser processing head of the laser processing apparatus illustrated in FIG. 1.
Figure 4:
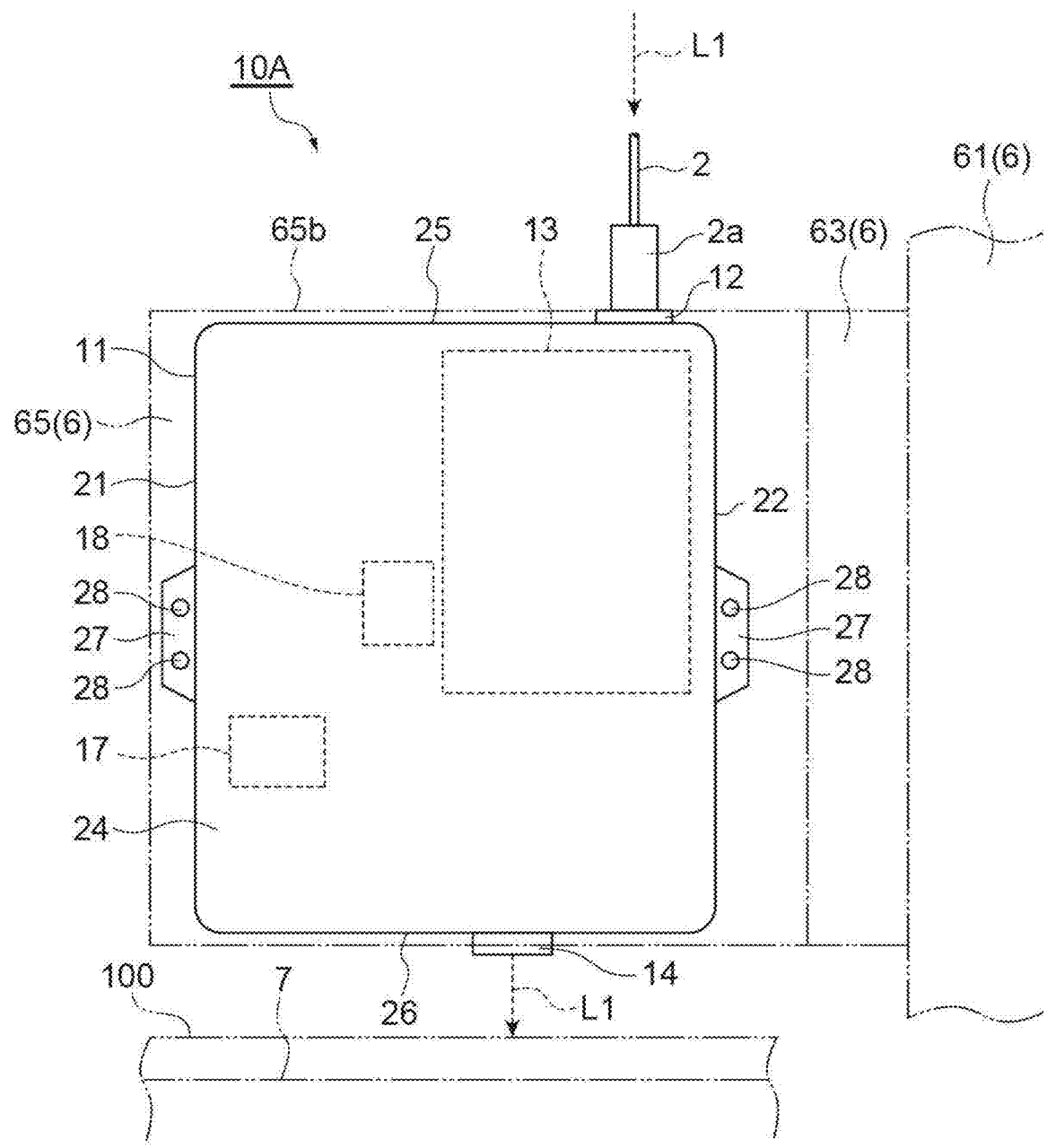
FIG. 4 is a side view of the laser processing head illustrated in FIG. 3.

As illustrated in FIGS. 3 and 4, the laser processing head 10A includes a housing 11, an entrance portion 12, an adjustment unit 13, and a condensing unit 14.

The housing 11 has a first wall portion 21, a second wall portion 22, a third wall portion 23, a fourth wall portion 24, a fifth wall portion 25, and a sixth wall portion 26. The first wall portion 21 and the second wall portion 22 face each other in the X direction. The third wall portion 23 and the fourth wall portion 24 face each other in the Y direction. The fifth wall portion 25 and the sixth wall portion 26 face each other in the Z direction.

The distance between the third wall portion 23 and the fourth wall portion 24 is shorter than the distance between the first wall portion 21 and the second wall portion 22. The distance between the first wall portion 21 and the second wall portion 22 is shorter than the distance between the fifth wall portion 25 and the sixth wall portion 26. The distance between the first wall portion 21 and the second wall portion 22 may the same as the distance between the fifth wall portion 25 and the sixth wall portion 26, or may be longer than the distance between the fifth wall portion 25 and the sixth wall portion 26.

In the laser processing head 10A, the first wall portion 21 is located on the side opposite to the fixed portion 61 of the movement mechanism 6, and the second wall portion 22 is located on the fixed portion 61 side. The third wall portion 23 is located on the attachment portion 65 side of the movement mechanism 6, and the fourth wall portion 24 is located on the side opposite to the attachment portion 65 which is the laser processing head 10B side (see FIG. 2). The fifth wall portion 25 is located on the side opposite to the support portion 7, and the sixth wall portion 26 is located on the support portion 7 side.

The housing 11 is configured to be attached to the attachment portion 65, with the third wall portion 23 arranged on the attachment portion 65 side of the movement mechanism 6. The specific configuration is as follows. The attachment portion 65 includes a base plate 65a and an attachment plate 65b. The base plate 65a is attached to a rail provided on the moving portion 63 (see FIG. 2). The attachment plate 65b stands at an end portion of the base plate 65a on the laser processing head 10B side (see FIG. 2). The housing 11 is attached to the attachment portion 65 by screwing bolts 28 to the attachment plate 65b via supports 27 in a state where the third wall portion 23 is in contact with the attachment plate 65b. The supports 27 are respectively provided to the first wall portion 21 and the second wall portion 22. The housing 11 is detachably attached to the attachment portion 65.

The entrance portion 12 is attached to the fifth wall portion 25. The laser light L1 enters the housing 11 through the entrance portion 12. The entrance portion 12 is offset toward the second wall portion 22 side (one wall portion side) in the X direction, and is offset toward the fourth wall portion 24 side in the Y direction. Specifically, the distance between the entrance portion 12 and the second wall portion 22 in the X direction is shorter than the distance between the entrance portion 12 and the first wall portion 21 in the X direction, and the distance between the entrance portion 12 and the fourth wall portion 24 in the Y direction is shorter than the distance between the entrance portion 12 and the third wall portion 23 in the X direction.

The entrance portion 12 is configured to be connectable with a connection end portion 2a of the optical fiber 2. The connection end portion 2a of the optical fiber 2 is provided with a collimator lens that collimates the laser light L1 emitted from an emission end of the fiber, but is not provided with an isolator that suppresses the return light. The isolator is provided at an intermediate portion of the fiber more on the light source 81 side than the connection end portion 2a. This leads to downsizing of the connection end portion 2a, and of the entrance portion 12. The isolator may be provided at the connection end portion 2a of the optical fiber 2.

The adjustment unit 13 is arranged in the housing 11. The adjustment unit 13 adjusts the laser light L1 entered through the entrance portion 12. Each configuration of the adjustment unit 13 is attached to an optical base 29 provided in the housing 11. The optical base 29 is attached to the housing 11 so as to partition the area inside the housing 11 into a region on the third wall portion 23 side and a region on the fourth wall portion 24 side. The optical base 29 is integrated with the housing 11. Each configuration of the adjustment unit 13 is attached to the optical base 29 on the fourth wall portion 24 side. Details of the configurations of the adjustment unit 13 will be described later.

The condensing unit 14 is arranged in the sixth wall portion 26. Specifically, the condensing unit 14 is arranged in the sixth wall portion 26 while being inserted into a hole 26a formed in the sixth wall portion 26 (see FIG. 5). The condensing unit 14 condenses the laser light L1 adjusted by the adjustment unit 13 and emits it to the outside of the housing 11. The condensing unit 14 is offset toward the second wall portion 22 (one wall portion side) in the X direction, and is offset toward the fourth wall portion 24 in the Y direction. Specifically, the distance between the condensing unit 14 and the second wall portion 22 in the X direction is shorter than the distance between the condensing unit 14 and the first wall portion 21 in the X direction, and the distance between the condensing unit 14 and the fourth wall portion 24 in the Y direction is shorter than the distance between the condensing unit 14 and the third wall portion 23 in the X direction.

Figure 5:
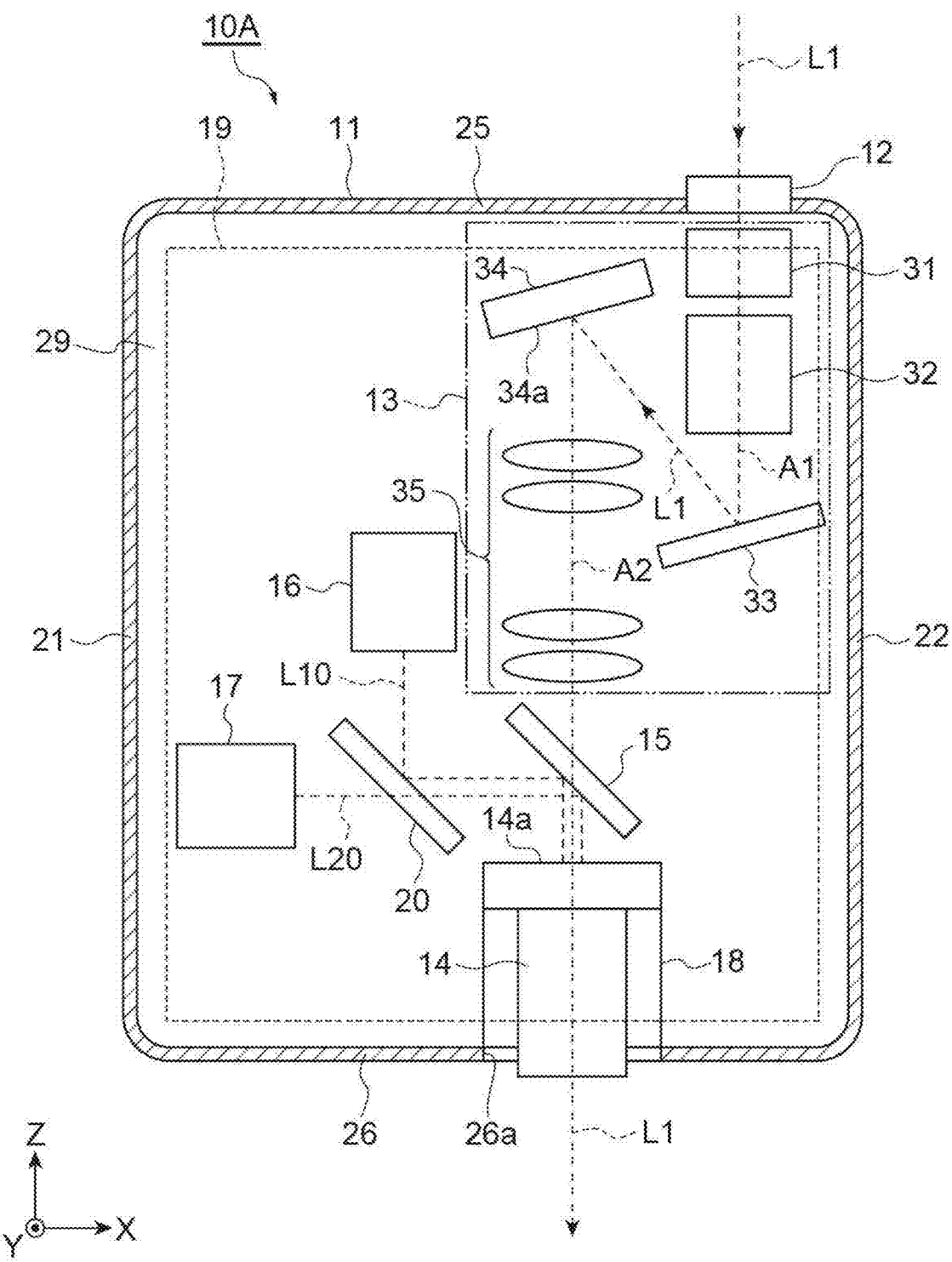
FIG. 5 is a diagram illustrating a configuration of an optical system of the laser processing head illustrated in FIG. 3.

As illustrated in FIG. 5, the adjustment unit 13 includes an attenuator 31, a beam expander 32, and a mirror 33. The entrance portion 12, as well as the attenuator 31, the beam expander 32, and the mirror 33 of the adjustment unit 13 are arranged on a straight line (first straight line) A1 extending along the Z direction. The attenuator 31 and the beam expander 32 are arranged between the entrance portion 12 and the mirror 33 on the straight line A1. The attenuator 31 adjusts the output of the laser light L1 that has entered through the entrance portion 12. The beam expander 32 expands the diameter of the laser light L1 the output of which has been adjusted by the attenuator 31. The mirror 33 reflects the laser light L1 the diameter of which has been expanded by the beam expander 32.

The adjustment unit 13 further includes a reflective spatial light modulator 34 and an imaging optical system 35. The reflective spatial light modulator 34 and the imaging optical system 35 of the adjustment unit 13 as well as the condensing unit 14 are arranged on a straight line (second straight line) A2 extending along the Z direction. The reflective spatial light modulator 34 modulates the laser light L1 reflected by the mirror 33. The reflective spatial light modulator 34 is, for example, a spatial light modulator (SLM) of a reflective liquid crystal (Liquid Crystal on Silicon (LCOS)). The imaging optical system 35 serves as a bilateral telecentric optical system in which a reflecting surface 34a of the reflective spatial light modulator 34 and an entrance pupil surface 14a of the condensing unit 14 are in an imaging relationship. The imaging optical system 35 includes three or more lenses.

The straight line A1 and the straight line A2 are located on a plane orthogonal to the Y direction. The straight line A1 is located on the second wall portion 22 side (one wall portion side) with respect to the straight line A2. In the laser processing head 10A, the laser light L1 enters the housing 11 through the entrance portion 12, travels on the straight line A1, is sequentially reflected by the mirror 33 and the reflective spatial light modulator 34, and then travels on the straight line A2 to be emitted to the outside of the housing 11 through the condensing unit 14. The order of arrangement of the attenuator 31 and the beam expander 32 may be reversed. The attenuator 31 may be arranged between the mirror 33 and the reflective spatial light modulator 34. The adjustment unit 13 may further include other optical components (for example, a steering mirror arranged in front of the beam expander 32 or the like).

The laser processing head 10A further includes a dichroic mirror 15, a measurement unit 16, a monitoring unit 17, a driving unit 18, and a circuit unit 19.

The dichroic mirror 15 is arranged between the imaging optical system 35 and the condensing unit 14 on the straight line A2. That is, the dichroic mirror 15 is arranged between the adjustment unit 13 and the condensing unit 14 in the housing 11. The dichroic mirror 15 is attached to the optical base 29 on the fourth wall portion 24 side. The dichroic mirror 15 transmits the laser light L1. From the sake of suppressing astigmatism, the dichroic mirror 15 may be, for example, a cube type or a two-plate type arranged in a twisted relationship.

The measurement unit 16 is arranged in the housing 11 on the first wall portion 21 side (opposite to one wall portion side) with respect to the adjustment unit 13. The measurement unit 16 is attached to the optical base 29 on the fourth wall portion 24 side. The measurement unit 16 outputs measurement light L10 for measuring the distance between the surface of the target 100 (for example, the surface on the side where the laser light L1 is incident) and the condensing unit 14, and detects the measurement light L10 reflected by the surface of the target 100 via the condensing unit 14. Thus, the surface of the target 100 is irradiated with the measurement light L10 output from the measurement unit 16, via the condensing unit 14, and then, the measurement light L10 reflected by the surface of the target 100 is detected by the measurement unit 16 via the condensing unit 14.

More specifically, the measurement light L10 output from the measurement unit 16 is sequentially reflected by a beam splitter 20 and the dichroic mirror 15 attached to the optical base 29 on the fourth wall portion 24 side, and then is emitted to the outside of the housing 11 from the condensing unit 14. The measurement light L10 reflected on the surface of the target 100 enters the housing 11 from the condensing unit 14 and is sequentially reflected by the dichroic mirror 15 and the beam splitter 20, to be incident on and detected by the measurement unit 16.

The monitoring unit 17 is arranged in the housing 11 on the first wall portion 21 side (opposite to one wall portion side) with respect to the adjustment unit 13. The monitoring unit 17 is attached to the optical base 29 on the fourth wall portion 24 side. The monitoring unit 17 outputs monitoring light L20 for monitoring the surface of the target 100 (for example, the surface on the side where the laser light L1 is incident), and detects the monitoring light L20 reflected by the surface of the target 100, via the condensing unit 14. Thus, the surface of the target 100 is irradiated with the monitoring light L20 output from the monitoring unit 17, via the condensing unit 14, and then, the monitoring light L20 reflected by the surface of the target 100 is detected by the monitoring unit 17 via the condensing unit 14.

More specifically, the monitoring light L20 output from the monitoring unit 17 transmits through the beam splitter 20 and is reflected by the dichroic mirror 15, to be emitted to the outside of the housing 11 from the condensing unit 14. The monitoring light L20 reflected by the surface of the target 100 enters the housing 11 through the condensing unit 14, and is reflected by the dichroic mirror 15 to be transmitted through the beam splitter 20 and to be incident on and detected by the monitoring unit 17. Wavelengths of the laser light L1, the measurement light L10, and the monitoring light L20 are different from each other (at least their center wavelengths are shifted from each other).

The driving unit 18 is attached to the optical base 29 on the fourth wall portion 24 side. The driving unit 18 moves the condensing unit 14, arranged on the sixth wall portion 26, along the Z direction using, for example, driving force of a piezoelectric element.

The circuit unit 19 is arranged on the third wall portion 23 side with respect to the optical base 29, in the housing 11. Specifically, in the housing 11, the circuit unit 19 is arranged on the third wall portion 23 side with respect to the adjustment unit 13, the measurement unit 16, and the monitoring unit 17. The circuit unit 19 is, for example, a plurality of circuit boards. The circuit unit 19 processes a signal output from the measurement unit 16 and a signal input to the reflective spatial light modulator 34. The circuit unit 19 controls the driving unit 18 based on the signal output from the measurement unit 16. As an example, the circuit unit 19 controls the driving unit 18 to maintain a constant distance between the surface of the target 100 and the condensing unit 14 (to maintain a constant distance between the surface of the target 100 and the focusing point of the laser light L1) based on the signal output from the measurement unit 16. The housing 11 is provided with a connector (not illustrated) to which wiring for electrically connecting the circuit unit 19 to the controller 9 (see FIG. 1) or the like is connected.

Similar to the laser processing head 10A, the laser processing head 10B includes the housing 11, the entrance portion 12, the adjustment unit 13, the condensing unit 14, the dichroic mirror 15, the measurement unit 16, the monitoring unit 17, the driving unit 18, and the circuit unit 19. Note that, as illustrated in FIG. 2, the configurations of the laser processing head 10B are in a plane-symmetrical relationship with the configurations of the laser processing head 10A, about a virtual plane that passes through the midpoint between the pair of attachment portions 65 and 66 and is orthogonal to the Y direction.

For example, the housing (first housing) 11 of the laser processing head 10A is attached to the attachment portion 65 with the fourth wall portion 24 positioned on the laser processing head 10B side with respect to the third wall portion 23, and with the sixth wall portion 26 positioned on the support portion 7 side with respect to the fifth wall portion 25. On the other hand, the housing (second housing) 11 of the laser processing head 10B is attached to the attachment portion 66 with the fourth wall portion 24 positioned on the laser processing head 10A side with respect to the third wall portion 23, and with the sixth wall portion 26 positioned on the support portion 7 side with respect to the fifth wall portion 25.

The housing 11 of the laser processing head 10B is configured to be attached to the attachment portion 66 with the third wall portion 23 arranged on the attachment portion 66 side. The specific configuration is as follows. The attachment portion 66 includes a base plate 66a and an attachment plate 66b. The base plate 66a is attached to a rail provided on the moving portion 63. The attachment plate 66b stands at an end portion of the base plate 66a on the laser processing head 10A side. The housing 11 of the laser processing head 10B is attached to the attachment portion 66 with the third wall portion 23 being in contact with the attachment plate 66b. The housing 11 of the laser processing head 10B is detachably attached to the attachment portion 66.

[Operation and Effect]

The laser processing head 10A has no light source, for outputting the laser light L1, provided in the housing 11. Thus, the housing 11 can be downsized. In the housing 11, the distance between the third wall portion 23 and the fourth wall portion 24 is shorter than the distance between the first wall portion 21 and the second wall portion 22, and the condensing unit 14 arranged on the sixth wall portion 26 is offset toward the fourth wall portion 24 in the Y direction. With this configuration, when the housing 11 moves along a direction orthogonal to the optical axis of the condensing unit 14, even if another configuration (the laser processing head 10B, for example) exists on the fourth wall portion 24 side, the condensing unit 14 can be brought near the other configuration. Therefore, the laser processing head 10A is suitable for moving the condensing unit 14 along the direction orthogonal to its optical axis.

In the laser processing head 10A, the entrance portion 12 is provided in the fifth wall portion 25 and is offset toward the fourth wall portion 24 in the Y direction. With this configuration, another configuration (the circuit unit 19 for example) can be arranged in a region, of a region in the housing 11, on the third wall portion 23 side with respect to the adjustment unit 13, or such a region can be used for the other like purposes. Thus, the region can be effectively used.

In the laser processing head 10A, the condensing unit 14 is offset toward the second wall portion 22 in the X direction. With this configuration, when the housing 11 moves along a direction orthogonal to the optical axis of the condensing unit 14, for example, even if another configuration exists on the second wall portion 22 side, the condensing unit 14 can be brought near the other configuration.

In the laser processing head 10A, the entrance portion 12 is provided in the fifth wall portion 25 and is offset toward the second wall portion 22 in the X direction. With this configuration, another configuration (the measurement unit 16 and the monitoring unit 17 for example) can be arranged in a region, of a region in the housing 11, on the first wall portion 21 side with respect to the adjustment unit 13, or such a region can be used for the other like purposes. Thus, the region can be effectively used.

In the laser processing head 10A, the measurement unit 16 and the monitoring unit 17 are arranged in the region, of the region in the housing 11, on the first wall portion 21 side with respect to the adjustment unit 13. The circuit unit 19 is arranged in the region in the housing 11, on the third wall portion 23 side with respect to the adjustment unit 13. The dichroic mirror 15 is arranged between the adjustment unit 13 and the condensing unit 14 in the housing 11. With this configuration, the region inside the housing 11 can be effectively used. Furthermore, in the laser processing apparatus 1, processing can be performed based on a result of measuring the distance between the surface of the target 100 and the condensing unit 14. Furthermore, in the laser processing apparatus 1, processing can be performed based on a result of monitoring the surface of the target 100.

In the laser processing head 10A, the circuit unit 19 controls the driving unit 18 based on the signal output from the measurement unit 16. With this configuration, the position of the focusing point of the laser light L1 can be adjusted based on a result of measuring the distance between the surface of the target 100 and the condensing unit 14.

Furthermore, in the laser processing head 10A, the entrance portion 12 as well as the attenuator 31, the beam expander 32, and the mirror 33 of the adjustment unit 13 are arranged on the straight line A1 extending along the Z direction. Furthermore, the reflective spatial light modulator 34, the imaging optical system 35, and the condensing unit 14 of the adjustment unit 13 as well as the condensing unit 14 are arranged on the straight line A2 extending along the Z direction. With this configuration, the adjustment unit 13 including the attenuator 31, the beam expander 32, the reflective spatial light modulator 34, and the imaging optical system 35 can be compactly configured.

In the laser processing head 10A, the straight line A1 is positioned on the second wall portion 22 side with respect to the straight line A2. With this configuration, when other optical systems using the condensing unit 14 (the measurement unit 16 and the monitoring unit 17 for example) are configured in the region, of the region in the housing 11, on the first wall portion 21 side with respect to the adjustment unit 13, the degree of freedom in configuration of the other optical systems can be improved.

The above actions and effects are similarly provided by the laser processing head 10B.

In the laser processing apparatus 1, the condensing unit 14 of the laser processing head 10A is offset toward the laser processing head 10B in the housing 11 of the laser processing head 10A, and the condensing unit 14 of the laser processing head 10B is offset toward the laser processing head 10A in the housing 11 of the laser processing head 10B. With this configuration, when the pair of laser processing heads 10A and 10B move along the Y direction, the condensing unit 14 of the laser processing head 10A and the condensing unit 14 of the laser processing head 10B can be brought close to each other. Therefore, with the laser processing apparatus 1, the target 100 can be efficiently processed.

In the laser processing apparatus 1, the pair of attachment portions 65 and 66 respectively move along the Y direction and the Z direction. With this configuration, the target 100 can be processed more efficiently.

In the laser processing apparatus 1, the support portion 7 moves along each of the X direction and the Y direction, and rotates about the axis parallel to the Z direction. With this configuration, the target 100 can be processed more efficiently.

MODIFICATION EXAMPLES

Figure 6:
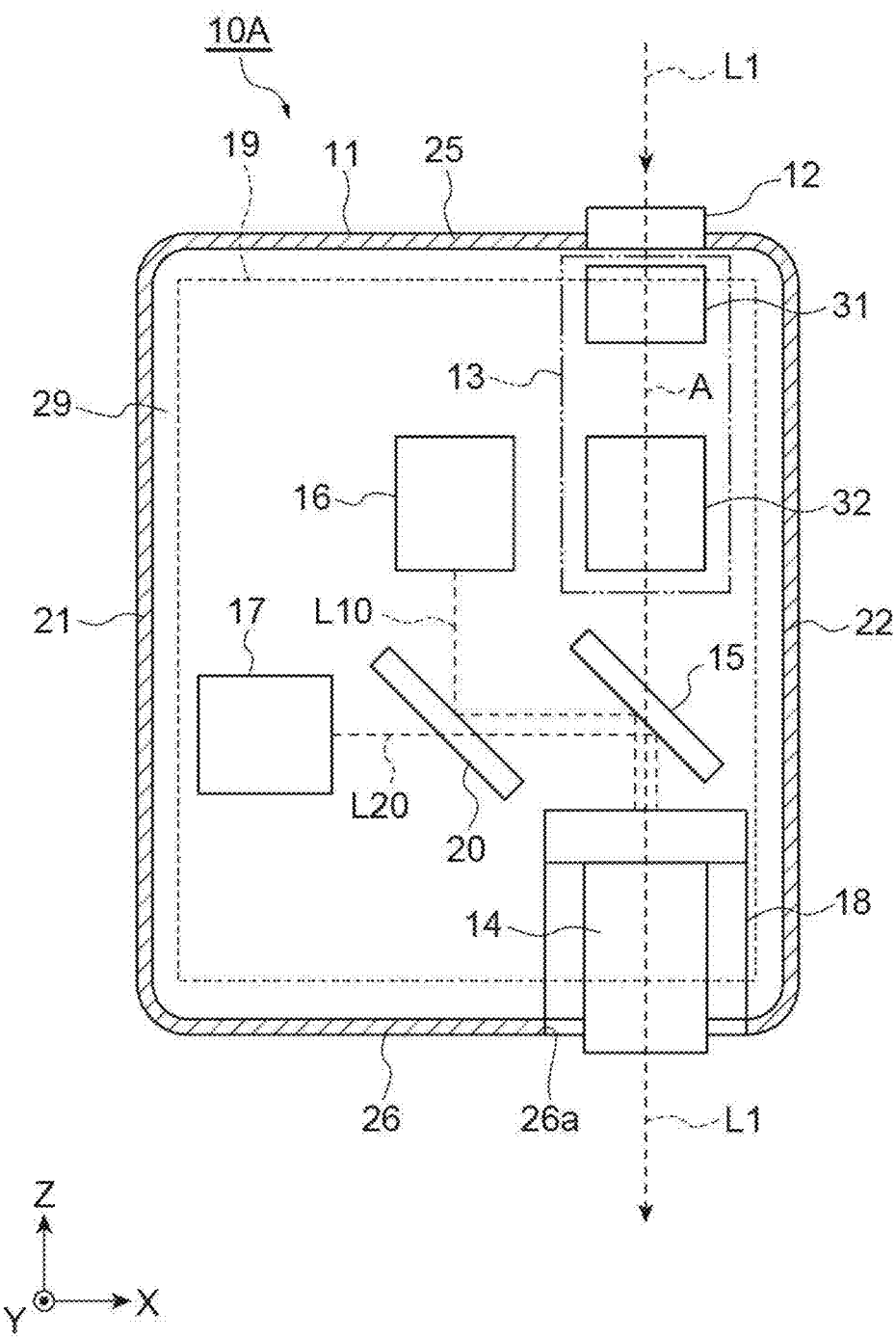
FIG. 6 is a diagram illustrating a configuration of an optical system of a laser processing head of a modification example.

For example, as illustrated in FIG. 6, the entrance portion 12, the adjustment unit 13, and the condensing unit 14 may be arranged on a straight line A extending along the Z direction. With this configuration, the adjustment unit 13 can be configured compactly. In this case, the adjustment unit 13 may not include the reflective spatial light modulator 34 and the imaging optical system 35. Further, the adjustment unit 13 may include the attenuator 31 and the beam expander 32. With this configuration, the adjustment unit 13 including the attenuator 31 and the beam expander 32 can be compactly configured. The order of arrangement of the attenuator 31 and the beam expander 32 may be reversed.

The housing 11 may have any configuration to be attached to the attachment portion 65 (or the attachment portion 66) with at least one of the first wall portion 21, the second wall portion 22, the third wall portion 23, and the fifth wall portion 25 arranged on the attachment portion 65 (or the attachment portion 66) side of the laser processing apparatus 1. The condensing unit 14 may have any configuration as long as it is at least offset toward the fourth wall portion 24 in the Y direction. With such configurations, when the housing 11 moves along the Y direction, for example, even if another configuration exists on the fourth wall portion 24 side, the condensing unit 14 can be brought near the other configuration. When the housing 11 moves along the Z direction, the condensing unit 14 can be brought close to the target 100, for example.

The condensing unit 14 may be offset toward the first wall portion 21 in the X direction. With this configuration, when the housing 11 moves along a direction orthogonal to the optical axis of the condensing unit 14, even if another configuration exists on the first wall portion 21 side, for example, the condensing unit 14 can be brought near the other configuration. In this case, the entrance portion 12 may be offset toward the first wall portion 21 in the X direction. With this configuration, another configuration (the measurement unit 16 and the monitoring unit 17 for example) can be arranged in a region, of a region in the housing 11, on the second wall portion 22 side with respect to the adjustment unit 13, or such a region can be used for the other like purposes. Thus, the region can be effectively used.

Figure 7:
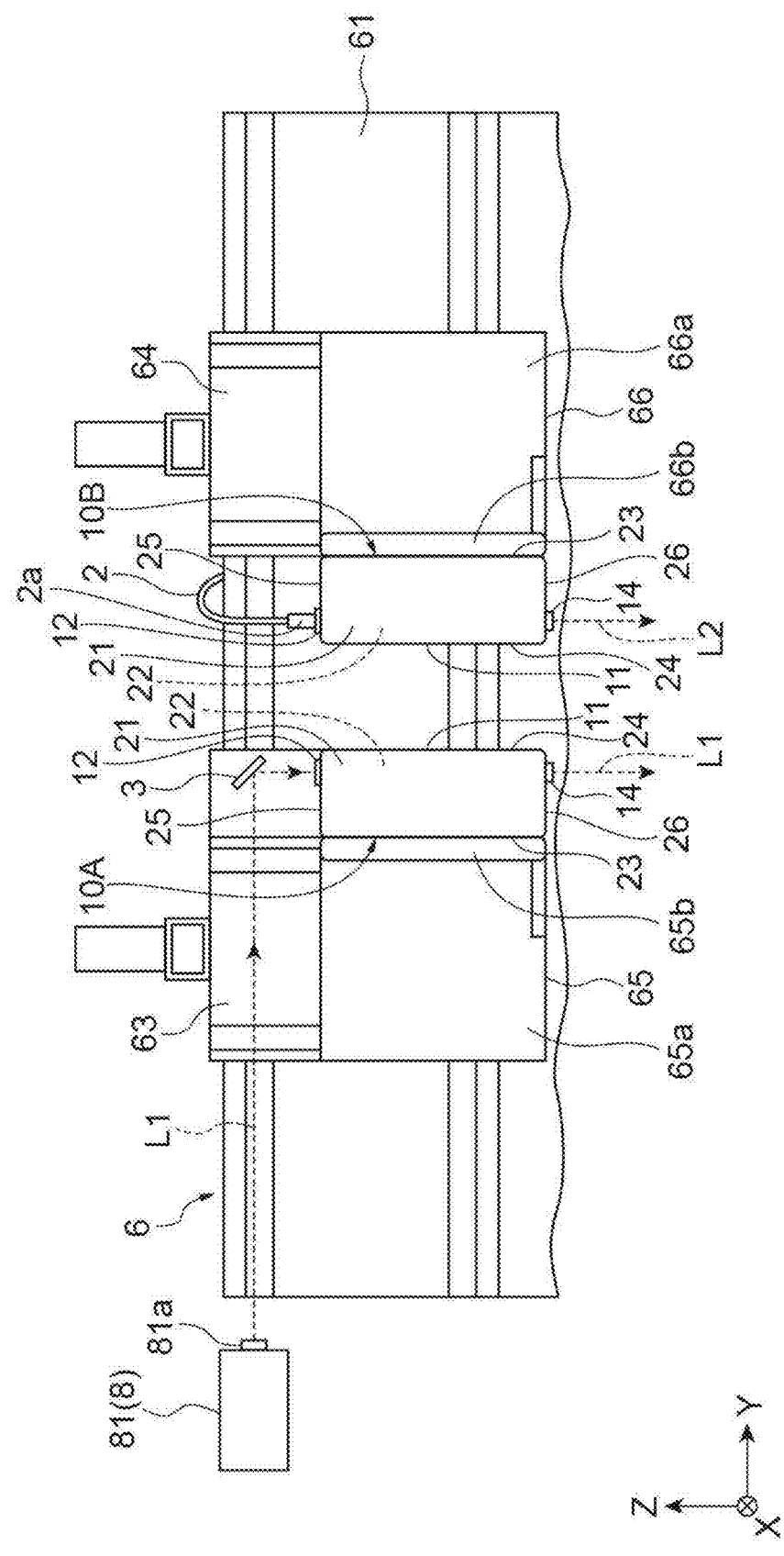
FIG. 7 is a front view of a portion of the laser processing apparatus of the modification example.

Further, at least one of the guiding of the laser light L1 from the emission portion 81a of the light source unit 8 to the entrance portion 12 of the laser processing head 10A and guiding of the laser light L2 from the emission portion 82a of the light source unit 8 to the entrance portion 12 of the laser processing head 10B may be implemented by a mirror. FIG. 7 is a front view of a portion of the laser processing apparatus 1 in which the laser light L1 is guided by a mirror. In the configuration illustrated in FIG. 7, a mirror 3 that reflects the laser light L1 is attached to the moving portion 63 of the movement mechanism 6, to face the emission portion 81a of the light source unit 8 in the Y direction and face the entrance portion 12 of the laser processing head 10A in the Z direction.

With the configuration illustrated in FIG. 7, the state where the mirror 3 faces the emission portion 81a of the light source unit 8 in the Y direction is maintained, even when the moving portion 63 of the movement mechanism 6 moves along the Y direction. Furthermore, the state where the mirror 3 faces the entrance portion 12 of the laser processing head 10A in the Z direction is maintained, even when the attachment portion 65 of the movement mechanism 6 moves along the Z direction. Thus, the laser light L1 emitted from the emission portion 81a of the light source unit 8 can reliably enter the entrance portion 12 of the laser processing head 10A, regardless of the position of the laser processing head 10A. Furthermore, a light source such as a high output ultrashort pulse laser, guiding for which using the optical fiber 2 is otherwise difficult, can be used.

Furthermore, with the configuration illustrated in FIG. 7, the mirror 3 may be attached to the moving portion 63 of the movement mechanism 6 to have at least one of angle and position adjustable. With this configuration, the laser light L1 emitted from the emission portion 81a of the light source unit 8 can reliably enter the entrance portion 12 of the laser processing head 10A.

Furthermore, the light source unit 8 may include a single light source. In this case, the light source unit 8 may be configured to emit a part of a laser light, output from one light source, from the emission portion 81a and emit the remaining part of the laser light from an emission portion 82b.

Furthermore, the laser processing apparatus 1 may include one laser processing head 10A. Also in the laser processing apparatus 1 including one laser processing head 10A, when the housing 11 moves along the Y direction orthogonal to the optical axis of the condensing unit 14, even if another configuration exists on the fourth wall portion 24 side, for example, the condensing unit 14 can be brought near the other configuration. Thus, also with the laser processing apparatus 1 including one laser processing head 10A, the target 100 can be efficiently processed. Furthermore, in the laser processing apparatus 1 including one laser processing head 10A, when the attachment portion 65 moves along the Z direction, the target 100 can be processed more efficiently. Furthermore, in the laser processing apparatus 1 provided with one laser processing head 10A, when the support portion 7 moves along the X direction and rotates about the axis parallel to the Z direction, the target 100 can be processed more efficiently.

Figure 8:
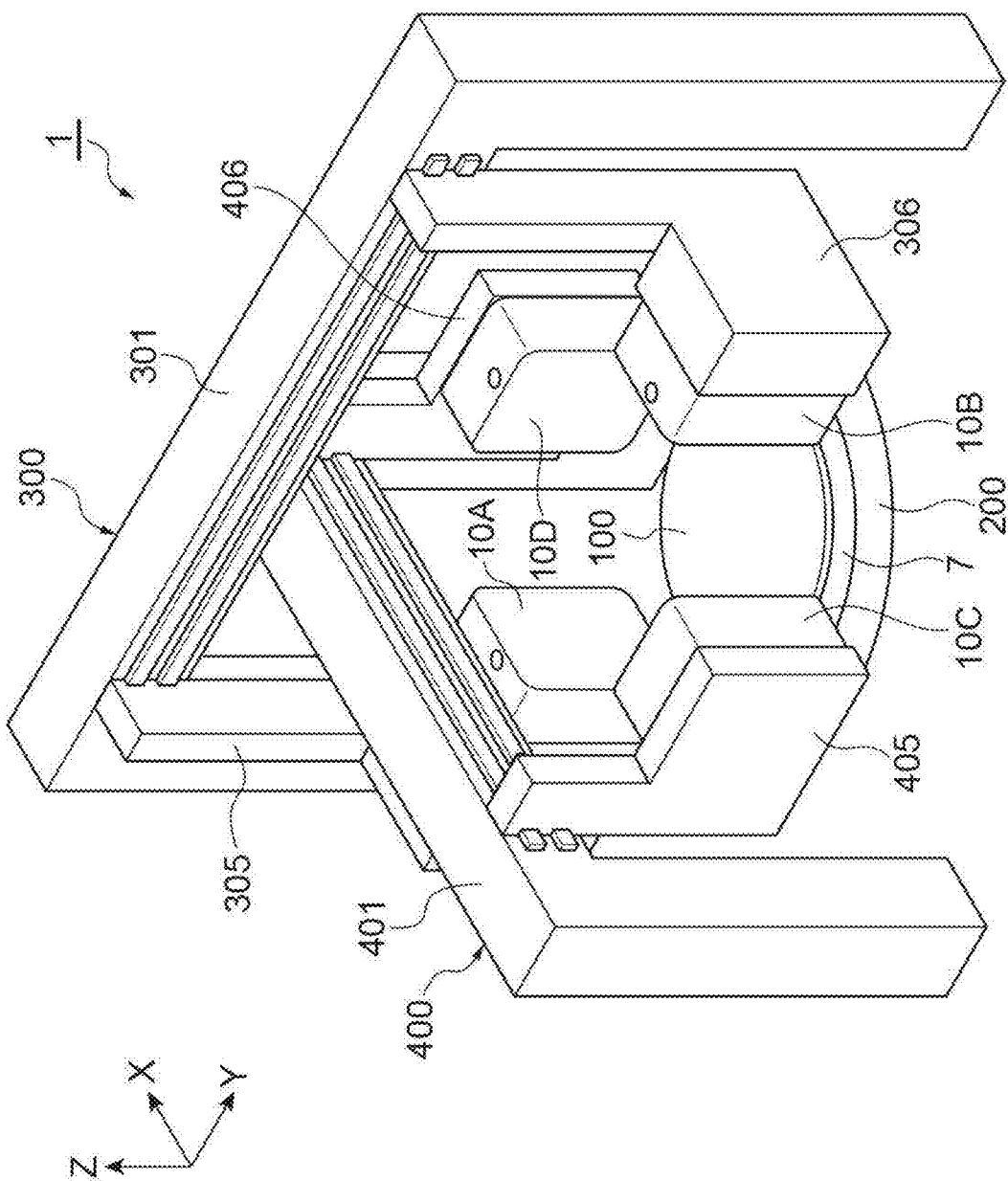
FIG. 8 is a perspective view of the laser processing apparatus of the modification example.

The laser processing apparatus 1 may include three or more laser processing heads. FIG. 8 is a perspective view of a laser processing apparatus 1 including two pairs of laser processing heads. The laser processing apparatus 1 illustrated in FIG. 8 includes a plurality of movement mechanisms 200, 300, and 400, the support portion 7, the pair of laser processing heads 10A and 10B, a pair of laser processing heads 10C and 10D, and a light source unit (not illustrated).

The movement mechanism 200 moves the support portion 7 along the each of the X direction, the Y direction, and the Z direction, and rotates the support portion 7 about an axis parallel to the Z direction.

The movement mechanism 300 includes a fixed portion 301 and a pair of attachment portions (a first attachment portion and a second attachment portion) 305 and 306. The fixed portion 301 is attached to a device frame (not illustrated). The pair of attachment portions 305 and 306 are each attached to a rail provided on the fixed portion 301, and can move in the Y direction independently from each other.

The movement mechanism 400 includes a fixed portion 401 and a pair of attachment portions (a first attachment portion and a second attachment portion) 405 and 406. The fixed portion 401 is attached to a device frame (not illustrated). The pair of attachment portions 405 and 406 are each attached to a rail provided on the fixed portion 401, and can move in the X direction independently from each other. The rail of the fixed portion 401 is arranged to three-dimensionally intersect with the rail of the fixed portion 301.

The laser processing head 10A is attached to the attachment portion 305 of the movement mechanism 300. The laser processing head 10A irradiates the target 100, supported by the support portion 7, with a laser light, while facing the support portion 7 in the Z direction. The laser light emitted from the laser processing head 10A is guided by the optical fiber 2 from the light source unit (not illustrated). The laser processing head 10B is attached to the attachment portion 306 of the movement mechanism 300. The laser processing head 10B irradiates the target 100, supported by the support portion 7, with a laser light, while facing the support portion 7 in the Z direction. The laser light emitted from the laser processing head 10B is guided by the optical fiber 2 from the light source unit (not illustrated).

The laser processing head 10C is attached to the attachment portion 405 of the movement mechanism 400. The laser processing head 10C irradiates the target 100, supported by the support portion 7, with a laser light, while facing the support portion 7 in the Z direction. The laser light emitted from the laser processing head 10C is guided by the optical fiber 2 from the light source unit (not illustrated). The laser processing head 10D is attached to the attachment portion 406 of the movement mechanism 400. The laser processing head 10D irradiates the target 100, supported by the support portion 7, with a laser light, while facing the support portion 7 in the Z direction. The laser light emitted from the laser processing head 10D is guided by the optical fiber 2 from the light source unit (not illustrated).

The configuration of the pair of laser processing heads 10A and 10B in the laser processing apparatus 1 illustrated in FIG. 8 is the same as the configuration of the pair of laser processing heads 10A and 10B in the laser processing apparatus 1 illustrated in FIG. 1. The configuration of the pair of laser processing heads 10C and 10D in the laser processing apparatus 1 illustrated in FIG. 8 is the same as the configuration of the pair of laser processing heads 10A and 10B, in the laser processing apparatus 1 illustrated in FIG. 1, rotated by 90° about an axis parallel to the Z direction.

For example, the housing (first housing) 11 of the laser processing head 10C is attached to the attachment portion 65 with the fourth wall portion 24 positioned on the laser processing head 10D side with respect to the third wall portion 23, and with the sixth wall portion 26 positioned on the support portion 7 side with respect to the fifth wall portion 25. The condensing unit 14 of the laser processing head 10C is offset toward the fourth wall portion 24 (that is, toward the laser processing head 10D) in the Y direction.

The housing (second housing) 11 of the laser processing head 10D is attached to the attachment portion 66 with the fourth wall portion 24 positioned on the laser processing head 10C side with respect to the third wall portion 23, and with the sixth wall portion 26 positioned on the support portion 7 side with respect to the fifth wall portion 25. The condensing unit 14 of the laser processing head 10D is offset toward the fourth wall portion 24 (that is, toward the laser processing head 10C) in the Y direction.

With the above configuration, in the laser processing apparatus 1 illustrated in FIG. 8, when the pair of laser processing heads 10A and 10B each move along the Y direction, the condensing unit 14 of the laser processing head 10A and the condensing unit 14 of the laser processing head 10B can be brought close to each other. Furthermore, when the pair of laser processing heads 10C and 10D each move along the X direction, the condensing unit 14 of the laser processing head 10C and the condensing unit 14 of the laser processing head 10D can be brought close to each other.

The laser processing head and the laser processing apparatus are not limited to those for forming the modified region in the target 100, and thus may be those for implementing other types of laser processing.

Next, each embodiment will be described. Hereinafter, the description already given for the above-described embodiment will not be redundantly given.

First Embodiment

Figure 9:
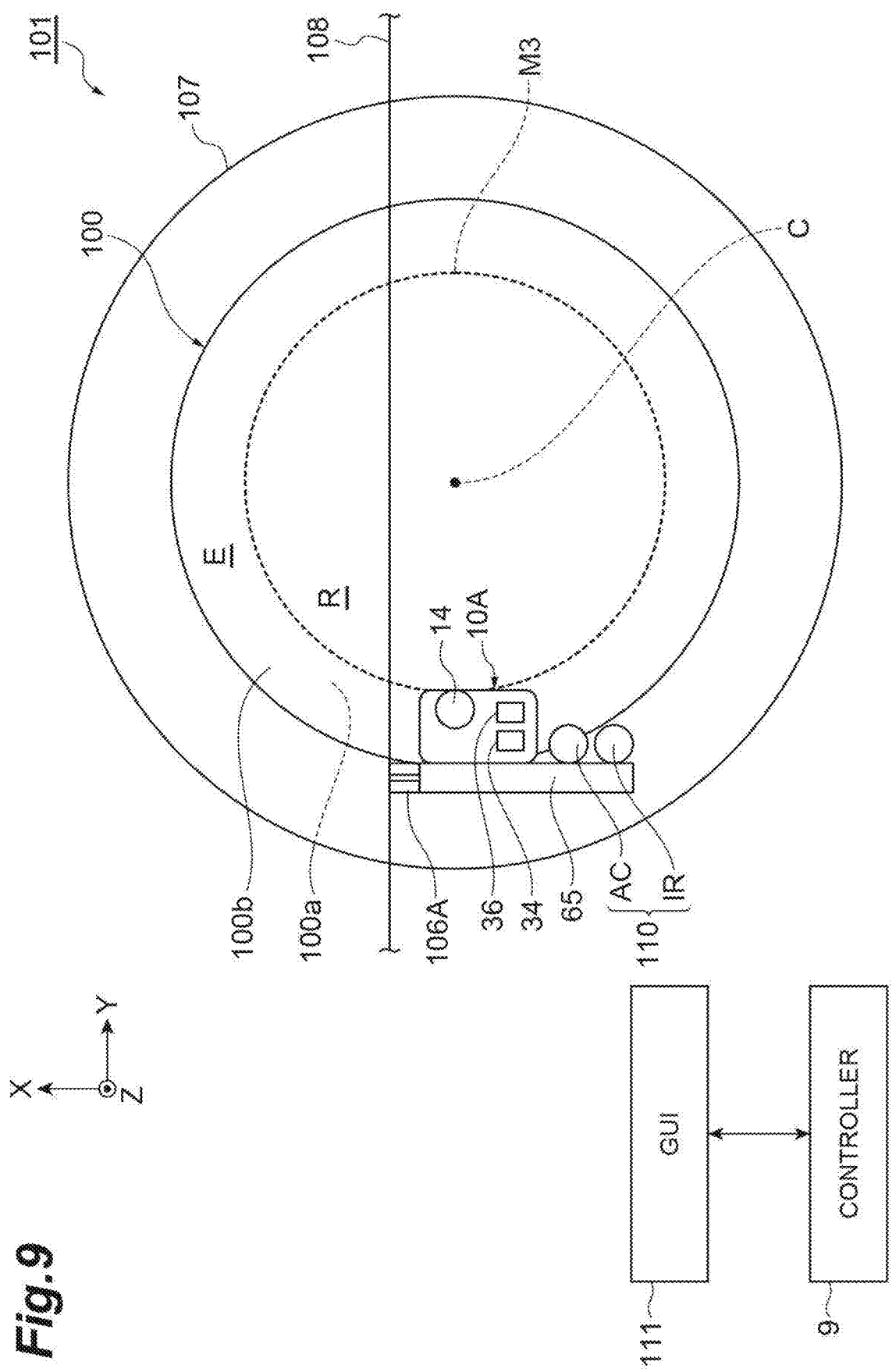
FIG. 9 is a plan view of a schematic configuration of a laser processing apparatus according to a first embodiment.

A laser processing apparatus 101 illustrated in FIG. 9 forms a modified region in the target 100 by irradiating the target 100 with a laser light, with a focusing point (at least a part of the focusing region) set in the target 100. The laser processing apparatus 101 performs trimming processing and peeling processing on the target 100 to obtain (manufacture) a semiconductor device. The trimming processing is a process for removing an unnecessary portion in the target 100. The peeling processing is a process for peeling a part of the target 100.

The target 100 includes, for example, a semiconductor wafer formed in a disk-shape. The target is not particularly limited, and may be formed of various materials and may have various shapes. A functional element (not illustrated) is formed on a front surface 100a of the target 100. Examples of the functional element include, a light receiving element such as a photodiode, a light emitting element such as a laser diode, a circuit element such as a memory, and the like.

Figure 10:
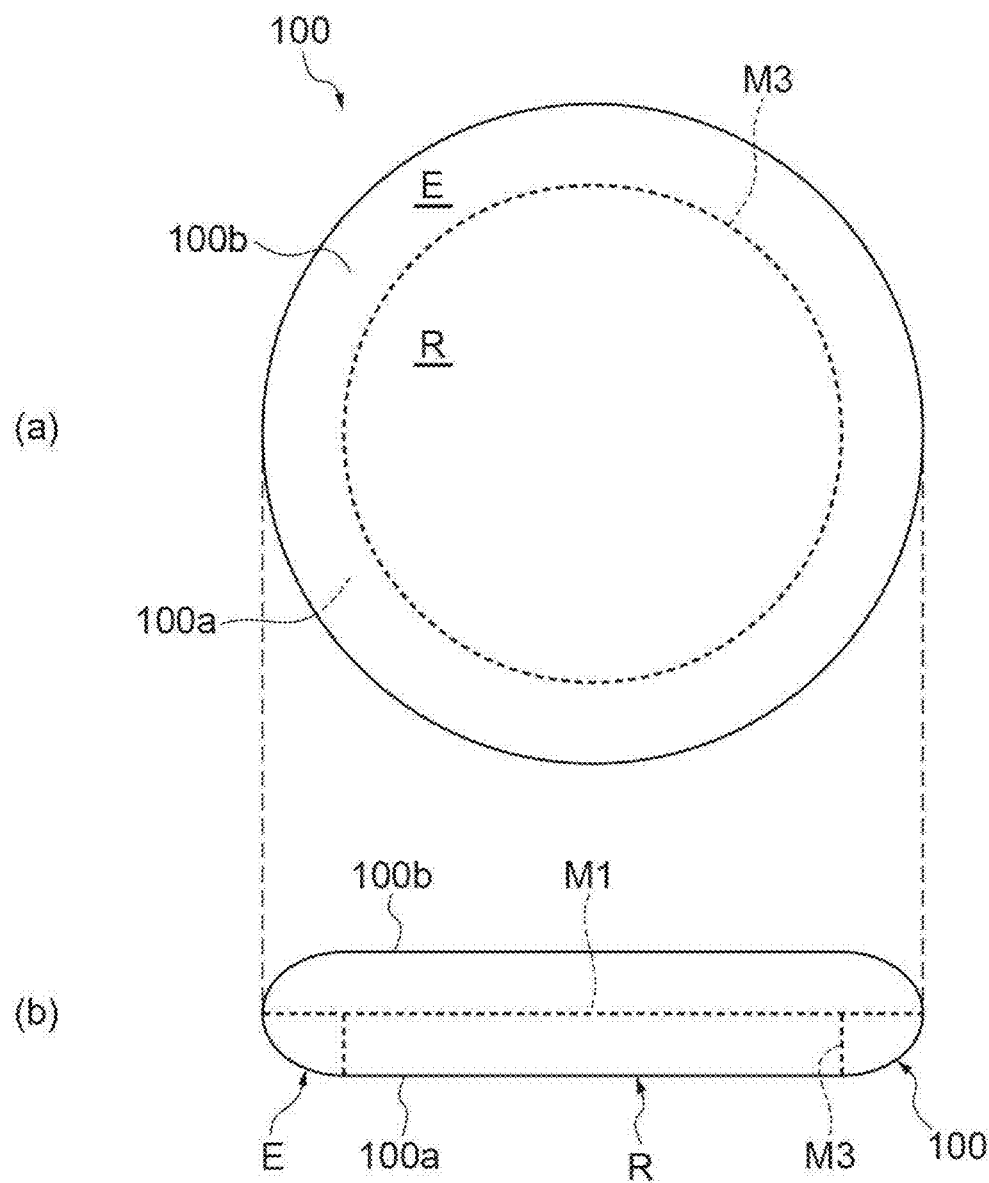
FIG. 10(a) is a plan view of an example of a target.
FIG. 10(b) is a side view of the target illustrated in FIG. 10(a).

As illustrated in FIGS. 10(a) and 10(b), an effective region R and a removal region E are set in the target 100. The effective region R is the part corresponding to the semiconductor device to be obtained. For example, the effective region R is a disk-shaped portion including a center portion in the target 100 as viewed in a thickness direction. The removal region E is a region outside the effective region R in the target 100. The removal region E is an outer edge portion in the target 100 other than the effective region R. For example, the removal region E is an annular portion surrounding the effective region R. The removal region E includes a circumferential edge portion (bevel portion of the outer edge) in the target 100 as viewed in the thickness direction.

A virtual plane M1 is set in the target 100 as a scheduled peeling plane. The virtual plane M1 is a plane on which a modified region is scheduled to be formed. The virtual plane M1 is a plane facing a back surface 100b, which is a laser light incident surface of the target 100. The virtual plane M1 is a plane parallel to the back surface 100b, and has a circular shape, for example. The virtual plane M1 is a virtual region, and is not limited to a flat plane, and may be a curved plane or a three-dimensional plane. The effective region R, the removal region E, and the virtual plane M1 can be set by the controller 9. The effective region R, the removal region E, and the virtual plane M1 may be designated by coordinates.

A line M3 is set in the target 100 as a scheduled trimming line. The line M3 is the line along which the modified region scheduled to be formed. The line M3 extends annularly on the inner side of the outer edge of target 100. The line M3 herein extends in an annular shape. The line M3 is set as a boundary between the effective region R and the removal region E, in a portion that is more on the opposite side of the laser light incident surface than the virtual plane M1 in the target 100. The line M3 can be set by the controller 9. The line M3 is a virtual line, but it may be a line actually drawn. The line M3 may be designated by coordinates.

As illustrated in FIG. 9, the laser processing apparatus 101 includes a stage 107, the laser processing head 10A, a first Z-axis rail 106A, a Y-axis rail 108, an image capturing unit 110, a graphical user interface (GUI) 111, and the controller 9. The stage 107 is a support portion on which the target 100 is placed. The stage 107 has the same configuration as the above support portion 7 (see FIG. 1). The target 100 is placed on the stage 107 of the present embodiment, with the back surface 100b of the target 100 facing upward, that is, the laser light incident surface side (with the front surface 100a facing down toward the stage 107). The stage 107 has a rotation axis C provided at the center thereof. The rotation axis C is an axis extending along the Z direction. The stage 107 can rotate about the rotation axis C. The stage 107 is drivingly rotated by driving force of a known driving device such as a motor.

The laser processing head 10A irradiates the target 100 placed on the stage 107 with the first laser light L1 (see FIG. 11(a)) along the Z direction to form the modified region in the target 100. The laser processing head 10A is attached to the first Z-axis rail 106A and the Y-axis rail 108. The laser processing head 10A can be moved linearly in the Z direction along the first Z-axis rail 106A, by driving force of a known driving device such as a motor. The laser processing head 10A can be moved linearly in the Y direction along the Y-axis rail 108, by driving force of a known driving device such as a motor. The laser processing head 10A serves as an irradiation portion.

The laser processing head 10A includes the reflective spatial light modulator 34 as described above. The laser processing head 10A includes a ranging sensor 36. The ranging sensor 36 emits a distance measurement laser light to the laser light incident surface of the target 100, and detects the distance measurement light reflected by the laser light incident surface to detect displacement data on the laser light incident surface of the target 100. When the ranging sensor 36 is a sensor having an axis different from that of the first laser light L1, a sensor employing as a triangular distance measuring method, a laser confocal method, a white confocal method, a spectral interference method, an astigmatism method or the like may be used. When the ranging sensor 36 is a sensor coaxial with the first laser light L1, a sensor employing an astigmatism method or the like can be used. The circuit unit 19 (see FIG. 3) of the laser processing head 10A is driven by the driving unit 18 (see FIG. 5) to make the condensing unit 14 follow the laser light incident surface, based on the displacement data acquired by the ranging sensor 36. With this configuration, the condensing unit 14 moves along the Z direction based on the displacement data so that a constant distance between the laser light incident surface of the target 100 and a first focusing point, which is the focusing point of the first laser light L1, is maintained.

The first Z-axis rail 106A is a rail extending along the Z direction. The first Z-axis rail 106A is attached to the laser processing head 10A via the attachment portion 65. The laser processing head 10A moves on the first Z-axis rail 106A along the Z direction so that the first focusing point of the first laser light L1 moves along the Z direction (a direction orthogonal to the virtual plane M1). The first Z-axis rail 106A corresponds to the rail of the above movement mechanism 6 (see FIG. 1) or the above movement mechanism 300 (see FIG. 8).

The Y-axis rail 108 is a rail extending along the Y direction. The Y-axis rail 108 is attached to the first Z-axis rail 106A. The laser processing head 10A moves on the Y-axis rail 108 along the Y direction so that the first focusing point of the first laser light L1 moves along the Y direction (a direction along the virtual plane M1). The Y-axis rail 108 corresponds to the rail of the above movement mechanism 6 (see FIG. 1) or the above movement mechanism 300 (see FIG. 8).

The image capturing unit 110 captures an image of the target 100 in a direction along the incident direction of the first laser light L1. The image capturing unit 110 includes an alignment camera AC and an imaging unit IR. The alignment camera AC and the imaging unit IR are attached to the attachment portion 65 together with the laser processing head 10A. The alignment camera AC, for example, captures an image of a device pattern or the like using light transmitted through the target 100. The image thus obtained is used for aligning the irradiation position of the first laser light L1 with respect to the target 100.

The imaging unit IR captures an image of the target 100 using light transmitted through the target 100. For example, when the target 100 is a wafer containing silicon, the imaging unit IR uses light in the near infrared region. The imaging unit IR includes a light source, an objective lens, and a photodetector. The light source outputs light that transmits through the target 100. The light source includes, for example, a halogen lamp and a filter, and outputs light in the near infrared region, for example. The light output from the light source is guided by an optical system such as a mirror, and passes through the objective lens to be emitted onto the target 100.

The objective lens transmits the light reflected on the surface of the target 100 opposite to the laser light incident surface. Thus, the objective lens transmits the light that has propagated (transmitted) through the target 100. The numerical aperture (NA) of the objective lens is, for example, 0.45 or more. The objective lens includes a correction ring. The correction ring corrects aberrations that occur in light in the target 100, for example, by adjusting the distances among a plurality of lenses forming the objective lens. The photodetector detects the light that has passed through the objective lens. The photodetector includes, for example, an InGaAs camera and detects light in the near infrared region. The imaging unit IR can capture an image of at least one of the modified region formed inside the target 100 and a crack extending from the modified region. Thus, with the laser processing apparatus 101, a processing state of laser processing can be checked non-destructively by using the imaging unit IR. The imaging unit IR forms a processing state monitoring unit that monitors (internal monitoring) the processing state of laser processing inside the target 100.

The GUI 111 displays various types of information. The GUI 111 includes, for example, a touch panel display. Various settings related to processing conditions are input to the GUI 111 through operations such as touching performed by the user. The GUI 111 forms an input portion that receives input from a user.

The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. The controller 9 controls each unit of the laser processing apparatus 101 to realize various functions.

The controller 9 at least controls the stage 107, the laser processing head 10A, and the above movement mechanism 6 (see FIG. 1) or the above movement mechanism 300 (see FIG. 1). The controller 9 controls the rotation of the stage 107, the emission of the first laser light L1 from the laser processing head 10A, and the movement of the first focusing point of the first laser light L1. The controller 9 can perform various controls based on rotation information (hereinafter, also referred to as "θ information") on the rotation amount of the stage 107. The θ information may be acquired from a driving amount of the driving device for rotating the stage 107, or may be acquired by a separate sensor or the like. The θ information can be obtained by various known methods. The θ information here includes the rotation angle based on a state where the target 100 is positioned at a 0° direction position.

The controller 9 controls starting and stopping of the emission of the first laser light L1 in the laser processing head 10A based on the θ information in a state where the first focusing point is positioned at a position along the line M3 (a circumferential edge of the effective region R) in the target 100, while rotating the stage 107, to perform trimming process for forming the modified region along the circumferential edge of the effective region R. The trimming process is processing by the controller 9 for implementing the trimming processing. In the trimming process of the present embodiment, before a peeling process (first processing process described later), the first laser light L1 is emitted along the line M3 on a portion in the target 100 more on the side opposite to the laser light incident surface than the virtual plane M1, to form the modified region.

The controller 9 emits the first laser light L1 from the laser processing head 10A while rotating the stage 107, and controls the movement of the first focusing point in the Y direction, to perform the peeling process for forming the modified region along the virtual plane M1 in the target 100. The peeling process is processing by the controller 9 for implementing peeling processing. The controller 9 controls the displaying of the GUI 111. The trimming process and the peeling process are performed based on various settings input from the GUI 111.

Switching between the formation of the modified region and stopping of the formation can be implemented as follows. For example, by switching between starting and stopping (ON/OFF) of the emission (output) of the first laser light L1 in the laser processing head 10A, switching between the formation of the modified region and the stopping of the formation can be implemented. Specifically, when a laser oscillator includes a solid-state laser, high speed switching between start and stop of the emission of the first laser light L1 can be implemented, through switching between ON and OFF of a Q switch provided in an oscillator (such as acousto-optic modulator (AOM) and electro-optic modulator (EOM)). When the laser oscillator includes a fiber laser, high speed switching between start and stop of the emission of the first laser light L1 can be implemented, through switching between ON and OFF of the output of a semiconductor laser forming a seed laser and an amplifier (excitation) laser. When the laser oscillator uses an external modulation element, high speed switching between ON and OFF of emission of the first laser light L1 is implemented, through switching between ON and OFF of the external modulation element (such as AOM or EOM) provided outside the oscillator.

Alternatively, switching between the formation of the modified region and stopping of the formation may be implemented as follows. For example, switching between the formation of the modified region and stopping of the formation may be implemented by opening and closing the optical path of the first laser light L1, through control on a mechanical mechanism such as a shutter. The formation of the modified region may be stopped by switching the first laser light L1 to continuous wave (CW) light. The formation of the modified region may be stopped by displaying, on a liquid crystal layer of the reflective spatial light modulator 34, a pattern (a laser scattering stain finished pattern for example) with which the focusing state of the first laser light L1 enters a state where the modification cannot be performed. The formation of the modified region may be stopped by controlling an output adjustment unit such as an attenuator to lower the output of the first laser light L1 to disable the formation of the modified region. The formation of the modified region may be stopped by switching a polarization direction. The formation of the modified region may be stopped by scattering (deflecting) the first laser light L1 to a direction other than the optical axis to cut the light.

Next, an example of a method of manufacturing (obtaining) a semiconductor device by performing the trimming processing and the peeling processing on the target 100 using the laser processing apparatus 101 will be described below. The manufacturing method described below is a method reusable for a removed portion (a portion in the target 100 that is not used as a semiconductor device) removed from the target 100 by the trimming processing and the peeling processing.

First of all, the target 100 is placed on the stage 107 with the back surface 100b facing the laser light incident surface side. The front surface 100a side of the target 100 on which the functional element is mounted is protected with a support substrate or a tape material adhered thereon.

Then, the trimming processing is implemented. Specifically, as illustrated in FIG. 11(a), the first laser light L1 is emitted from the laser processing head 10A, with a first focusing point P1 positioned at a position on the line M3 of the target 100, while rotating the stage 107 at a constant rotation speed. The first laser light L1 is emitted repeatedly with the position of the first focusing point P1 in the Z direction changed. Specifically, as illustrated in FIGS. 10(b) and 11(b), a modified region 43 is formed in a portion in the target 100 more on the side opposite to the laser light incident surface than the virtual plane M1, along the line M3, before the peeling process.

Figure 12:
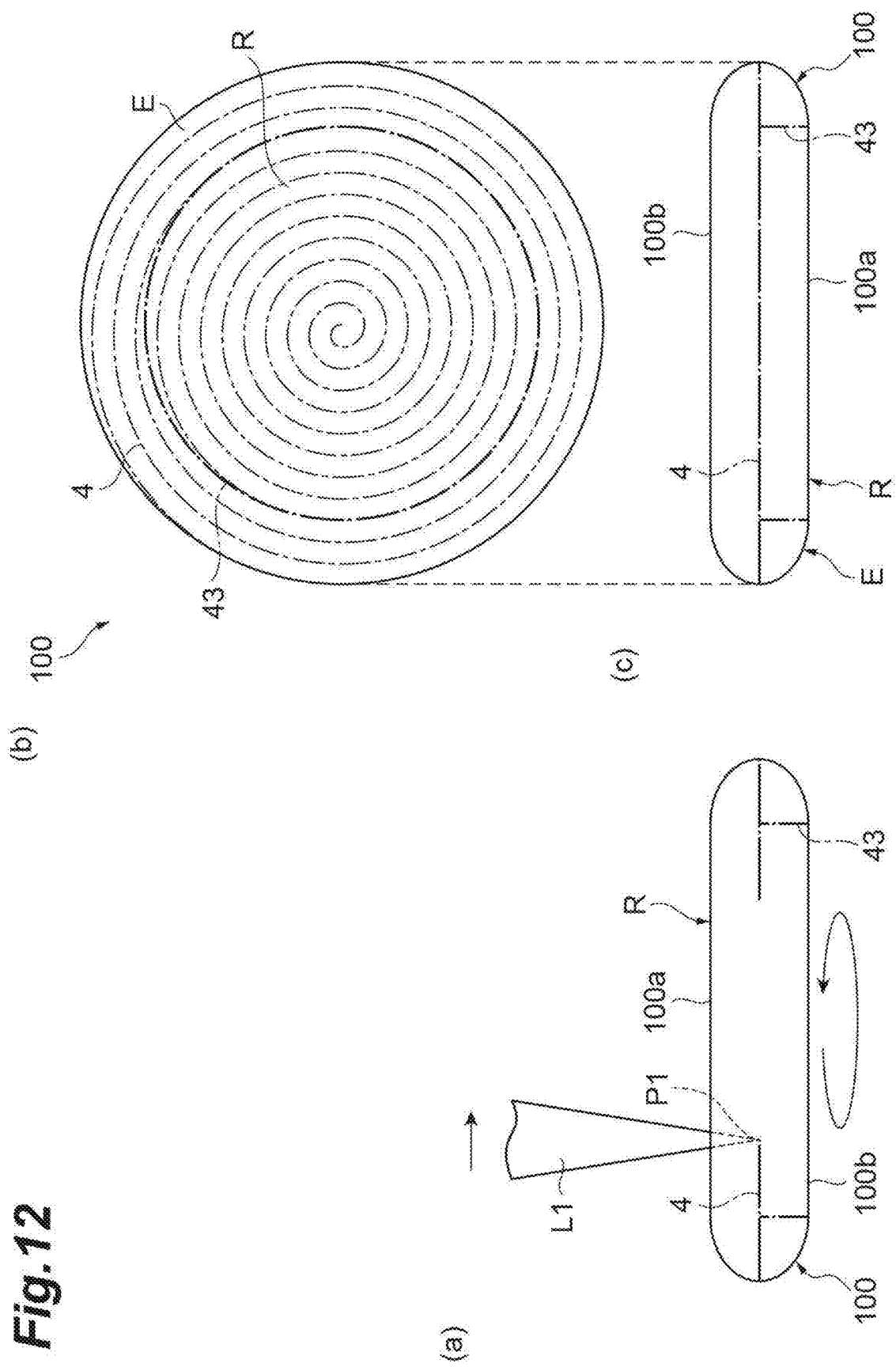
FIG. 12(a) is a side view of the target continuing from FIG. 11(b).
FIG. 12(b) is a plan view of the target continuing from FIG. 12(a).
FIG. 12(c) is a side view of the target illustrated in FIG. 12(b).

Then, the peeling processing is performed. Specifically, as illustrated in FIG. 12(a), the first laser light L1 is emitted from the laser processing head 10A while the stage 107 rotates at a constant rotation speed. Meanwhile, the laser processing head 10A moves along the Y-axis rail 108 so that the first focusing point P1 moves along the Y direction from the outer edge side of the virtual plane M1 toward the inner side. As a result, as illustrated in FIGS. 12(b) and 12(c), a modified region 4 of a spiral shape (involute curve) around the position of the rotation axis C (see FIG. 9) along the virtual plane M1 inside the target 100 is formed. The modified region 4 formed includes a plurality of modified spots. Thus, as illustrated in FIG. 13(a), a part of the target 100 is peeled with the modified region 4 over the virtual plane M1 and cracks extending from modified spots in the modified region 4 serving as boundaries. Furthermore, the removal region E is removed with the modified region 43 along the line M3 and cracks extending from the modified spots in the modified region 43 serving as boundaries.

The peeling of the target 100 and the removal of the removal region E may be performed using, for example, a suction jig. The peeling of the target 100 may be performed on the stage 107, or may be performed after moving the target 100 to an area dedicated for peeling. The target 100 may be peeled by using air blow or a tape material. When the target 100 cannot be peeled by using external stress only, the modified regions 4 and 43 may be selectively etched with an etching solution (such as KOH or TMAH) that reacts with the target 100. As a result, the target 100 can be easily peeled. Although the stage 107 is rotated at a constant rotation speed, the rotation speed may be variable. For example, the rotation speed of the stage 107 may be varied to achieve a constant pitch between the modified spots included in the modified region 4.

Then, as illustrated in FIG. 13(b), a peeled surface 100h of the target 100 is finished by grinding or polishing with an abrasive such as a grindstone. When the target 100 is peeled by etching, the polishing can be simplified. As a result of the above, a semiconductor device 100k is obtained.

Next, the peeling processing of the present embodiment will be described more in detail.

Figure 14:
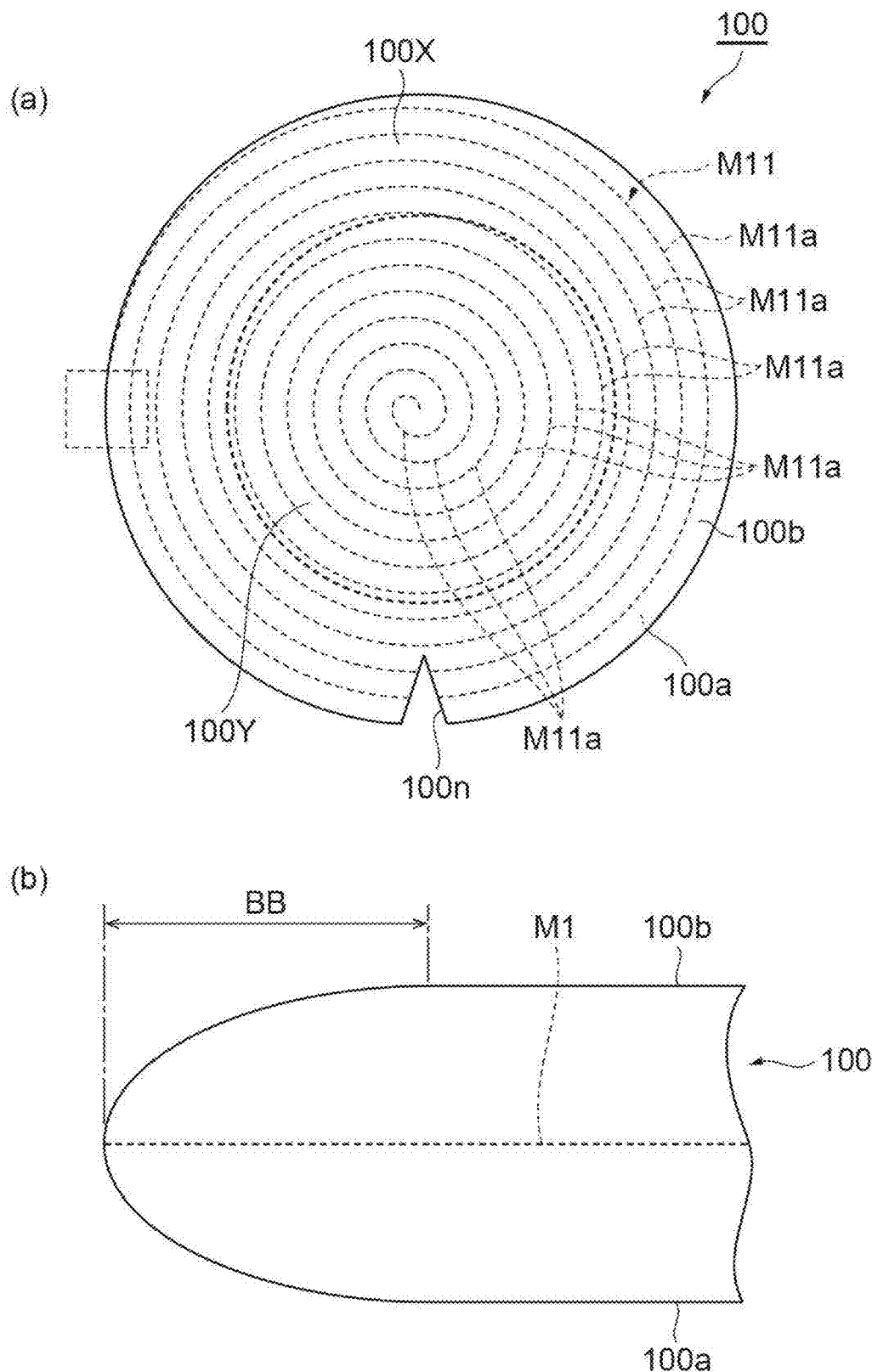
FIG. 14(a) is a plan view of a target which is a subject of peeling processing according to the first embodiment.
FIG. 14(b) is an enlarged side view of a portion within a broken line frame in FIG. 14(a).

As illustrated in FIG. 14(a), a line (processing line) M11 is set for the target 100 of the peeling processing. The line M11 is a line along which the modified region 4 is scheduled to be formed. The line M11 extends spirally from the circumferential edge side toward the inner side in the target 100. In other words, the line M11 extends in a spiral form (involute curve) around the position of the rotation axis C (see FIG. 9) of the stage 107. The line M11 is a processing line including a plurality of parallel lines M11a arranged side by side. For example, one orbital part in the spiral shape forms each of the parallel lines M11a. The line M11 is a virtual line, but it may be a line actually drawn. The line M11 may be designated by coordinates.

As illustrated in FIGS. 14(a) and 14(b), the target 100 has a bevel portion (circumferential edge portion) BB having a side surface intersecting with the back surface 100b, which is the laser light incident surface. The bevel portion BB is, for example, a surface chamfered for improving strength. The bevel portion BB has a curved surface (R surface) at the corner of the circumferential edge of the target 100. The bevel portion BB is, for example, a portion in the target 100 extending from the circumferential edge toward the inner side by 200 to 300 μm.

The target 100 is provided with an alignment target 100n. For example, the alignment target 100n has a certain relationship in a θ direction (rotation direction of the stage 107 about the rotation axis C) with respect to the 0° direction position of the target 100. The 0° direction position is the reference position of the target 100 in the θ direction. For example, the alignment target 100n is a notch formed on the circumferential edge side of the target 100. The alignment target 100*n* is not particularly limited, and may be an orientation flat of the target 100 or a pattern of the functional element.

The controller 9 performs the first processing process of irradiating a bevel peripheral portion (first portion) 100X including the bevel portion BB with the first laser light L1 under a first processing condition. After the first processing process, the controller 9 performs a second processing process of irradiating an inner circumferential portion (second portion) 100Y more on the inner side than the bevel peripheral portion 100X in the target 100 with the first laser light L1, under a second processing condition different from the first processing condition. The first processing process and the second processing process are included in the peeling process. The sizes of the bevel peripheral portion 100X and the inner circumferential portion 100Y in the target can be input via the GUI 111.

Figure 15:
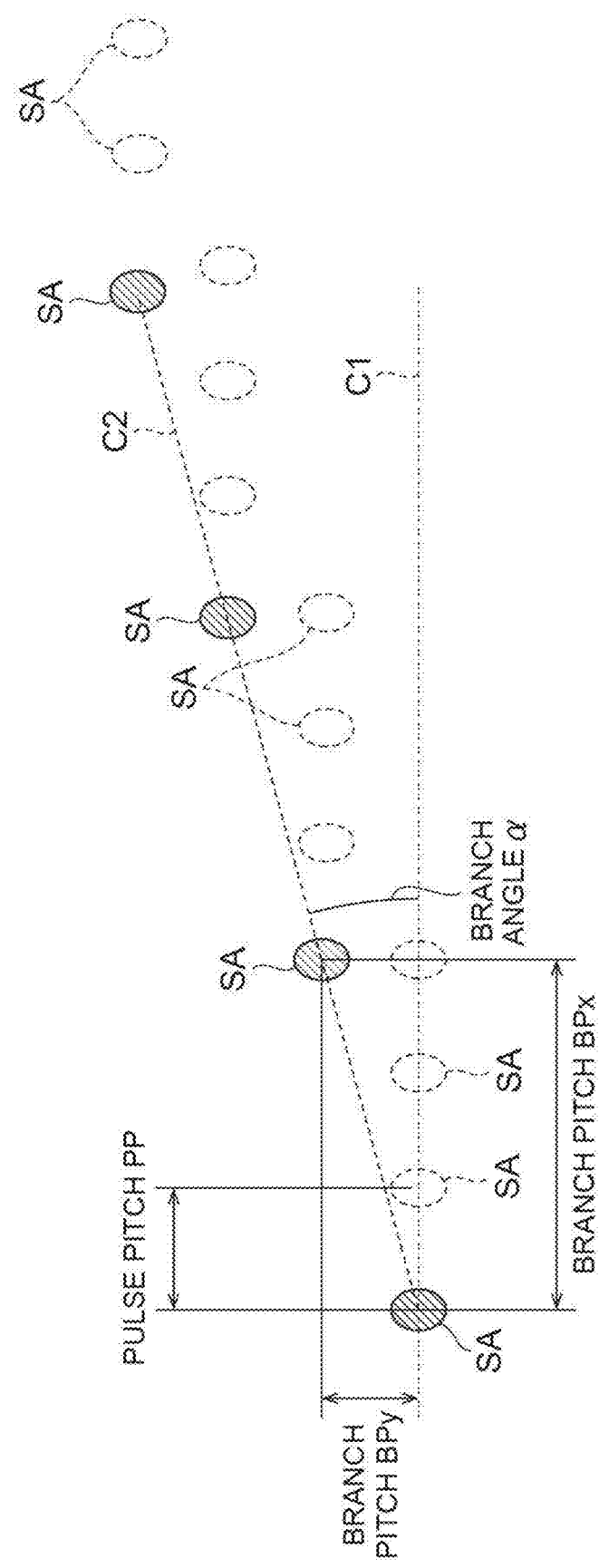
FIG. 15 is a plan view illustrating a plurality of modified spots formed in the peeling processing according to the first embodiment.

In the first processing process and the second processing process, as illustrated in FIG. 15, the first laser light L1 is branched so that a plurality of modified spots SA arranged in a single row along an inclined direction C2 inclined with respect to an orthogonal direction orthogonal to an extending direction C1 (processing proceeding direction) of the line M11 are formed on the virtual plane M1. The branching of the first laser light L1 can be implemented by using, for example, the reflective spatial light modulator 34 (see FIG. 5).

In the illustrated example, the first laser light L1 is branched into four to form four modified spots SA. A branch pitch BPx and a branch pitch BPy are an interval between a pair of adjacent ones of the four modified spots SA as a result of the branching, respectively in the extending direction C1 of the line M11 and the orthogonal direction with respect to the extending direction C1. A pulse pitch PP is an interval, in the extending direction C1, between a pair of modified spots SA formed by irradiation of two sequential pulses of the first laser light L1. A branch angle α is angle between the extending direction C1 and the inclined direction C2.

In the first processing process and the second processing process, the target 100 is irradiated with the first laser light L1, while the position of the first focusing point P1 moves relative to the target 100 along the spiral line M11 from the circumferential edge toward the inner side. Thus, the modified region 4 is formed along the line M11. That is, in the first and the second processing processes, the region of the target 100 in which the modified region 4 is formed, shifts in the first direction from the circumferential edge toward the inner side.

The first processing condition and the second processing condition are condition under which a slicing half cut state (a first slicing state) described later is achieved as the processing state in the target 100 (hereinafter, simply referred to as "processing state"), when the modified region 4 is formed by emitting the first laser light L1 along a single processing line. The first processing condition and the second processing condition are conditions under which a slicing full cut state (second slicing state) described later is achieved as the processing state, when the modified region 4 is formed by emitting the first laser light L1 along the line M11 that is a processing line including a plurality of parallel lines arranged side by side.

The first processing condition is a condition under which the slicing full cut state is achieved as the processing state after the laser processing of a first specified amount. The second processing condition is a condition under which the slicing full cut state is established as the processing state after the laser processing of a second specified amount larger than the first specified amount. Specific parameters of the first processing condition and the second processing condition include the number of branches of the first laser light L1, the branch pitches BPy and BPx, the pulse energy, the pulse pitch and the pulse width, the processing speed, and the like. The processing condition in which the slicing half cut state is achieved as the processing state is a processing condition the parameters of which are set as appropriate based on a known technique, to achieve the slicing half cut state as the processing state. The processing condition in which the slicing full cut state is achieved as the processing state is a processing condition the parameters of which are set as appropriate based on a known technique, to achieve the slicing full cut state as the processing state. For example, the first processing conditions include the number of branches of 4, the branch pitch BPy of 20 µm, the branch pitch BPx of 30 µm, the pulse energy of 16.73 µJ, the processing speed of 800 mm/s, the pulse pitch of 10 µm, and the pulse width of 700 ns. For example, the second processing condition is the same as the first processing condition except that the branch pitch BPy is 30 µm.

Now, the processing state confirmed during the peeling processing will be described below.

FIGS. 16(*a*) and 17(*a*) are images illustrating a slicing stealth state. FIGS. 16(*b*) and 17(*b*) are images illustrating a slicing half cut state. FIG. 18(*a*) is an image illustrating the slicing full cut state as the processing state after the laser processing of the first specified amount. FIG. 18(*b*) is an image illustrating the slicing full cut state as the processing state after laser processing of a second specified amount.

FIGS. 16(*a*) to 18(*b*) are images at the position of the virtual plane M1, captured by the imaging unit IR from the laser light incident surface. FIGS. 16(*a*) and 16(*b*) illustrate a processing state in a case where the modified region 4 is formed by emitting the first laser light L1 along a single processing line (parallel lines). FIGS. 17(*a*) and 18(*b*) illustrate a processing state in a case where the modified region 4 is formed by emitting the first laser light L1 along a plurality of processing lines. The processing line is set to extend linearly in a left and right direction in the figure. It can be seen in FIGS. 16(*a*) to 18(*b*) that the processing state changes in three stages depending on the pulse energy, the branch pitch, and the like.

As illustrated in FIGS. 16(*a*) and 17(*a*), the slicing stealth (SST) state is a state in which cracks do not advance from the plurality of modified spots (bruise) SA included in the modified region 4, or the cracks are not connected to each other. The slicing stealth state is a state in which only the modified spot SA can be monitored. The slicing stealth state does not involve advancement of the cracks, and thus does not transition to the slicing full cut state even when the number of processing lines is increased.

As illustrated in FIGS. 16(*b*) and 17(*b*), the slicing half cut (SHC) state is a state in which the cracks extending from the plurality of modified spots SA included in the modified region 4 advance in a direction along the processing line. In the image that in the slicing half cut state, the modified spots SA and the stain along the processing line can be confirmed. When the number of processing lines increases to make the processing state transition to the slicing half cut state, the transition to the slicing full cut state is established. The number of the processing lines for achieving transition to the slicing full cut state differs depending on the processing condition. It can be understood that for establishing the slicing full cut state, the slicing half cut state needs to be established as the processing state in a case where the modified region 4 is formed by emitting the first laser light L1 along a single processing line.

The slicing full cut (SFC) state is a state in which cracks extending from the plurality of modified spots SA included in the modified region 4 advance in directions along and orthogonal to the plurality of processing lines to be connected to each other. The slicing full cut state is a state in which the cracks extending from the modified spots SA advance in upper and lower and left and right directions on the image to be connected between the plurality of processing lines. As illustrated in FIGS. 18(a) and 18(b), the slicing full cut state is a state in which the modified spot SA cannot be confirmed on the image (a state in which the space or gap formed by the cracks is confirmed). The slicing full cut state is a state established when cracks formed between the plurality of processing lines are connected with each other, and thus cannot be established when the modified region 4 is formed by emitting the first laser light L1 along a single processing line.

The slicing full cut state includes a first slicing full cut state and a second slicing full cut state. The first slicing full cut state is a slicing full cut state established after the laser processing of the first specified amount (see FIG. 18(a)). The second slicing full cut state is a slicing full cut state established after the laser processing of the second specified amount larger than the first specified amount (see FIG. 18(a)).

The first specified amount of laser processing is, for example, a case where the modified region 4 is formed by irradiating the first laser light L1 along a plurality of parallel lines of less than 100 lines. For example, the laser processing of the first specified amount corresponding to a case where a width of a region in which the modified region 4 is formed in the target 100 in an index direction is smaller than 12 mm. The index direction is a direction orthogonal to the extending direction of the processing line as viewed from the laser light incident surface. The laser processing of the second specified amount corresponds to a case where the modified region 4 is formed by emitting the first laser light L1 along a plurality of, that is, 100 or more processing lines, for example. For example, the laser processing of the second specified amount corresponding to a case where a width of a region in which the modified region 4 is formed in the target 100 in an index direction is equal to or larger than 12 mm. The first specified amount and the second specified amount are not particularly limited, and may be of various parameter amounts. The first specified amount and the second specified amount may be processing time for example. The first specified amount and the second specified amount may be a combination of a plurality of parameter amounts.

FIGS. 16(a) to 18(b) are images captured by the imaging unit IR, which are similarly obtained using a normal IR camera. The results in FIGS. 16(a) to 18(b) are not particularly limited to the shape, size, and the like of the target 100, and results similar to those in FIGS. 16(a) to 18(b) are obtained regardless of whether the target 100 is a whole wafer or small piece wafer. The results in FIGS. 16(a) to 18(b) are the results of performing the laser processing only (results of performing the laser processing under the assumption that no stress is applied). Even when the modified region 4 is formed by emitting the first laser light L1 along the plurality of processing lines less than 100 lines, the slicing full cut state may be established with the stress applied to the target 100.

The controller 9 sets the first processing condition and the second processing condition based on an input from the user via the GUI 111. The display and input of the GUI 111 will be described later. The controller 9 causes the GUI 111 to display an image capturing result obtained by the imaging unit IR, that is, the processing state inside the target 100.

The imaging unit IR is for monitoring whether the slicing half cut state is established as the processing state in a case where the modified region 4 is formed along the line M11 of a spiral shape. The imaging unit IR is for monitoring whether the slicing full cut state (that is, the first slicing full cut state) is established as the processing state after the laser processing of the first specified amount in the first processing process. The imaging unit IR is for monitoring whether the slicing full cut state (that is, the second slicing full cut state) is established as the processing state after the laser processing of the second specified amount in the second processing process. The monitoring of a state includes: implementing an operation of monitoring the state; and/or acquiring information with which whether the state is established (for example, image acquisition).

Based on the monitoring result obtained by the imaging unit IR, the controller 9 determines whether the second slicing full cut state is established as the processing state after the laser processing of the first specified amount in the first processing process, and whether the second slicing full cut state is established as the processing state after the laser processing of the second specified amount in the second processing process. The determination of the processing state can be implemented using various known image processing methods. The determination of the processing state may be implemented using a learned model (artificial intelligence (AI)) obtained by deep learning. These apply to other determinations performed by the controller 9.

Figure 19:
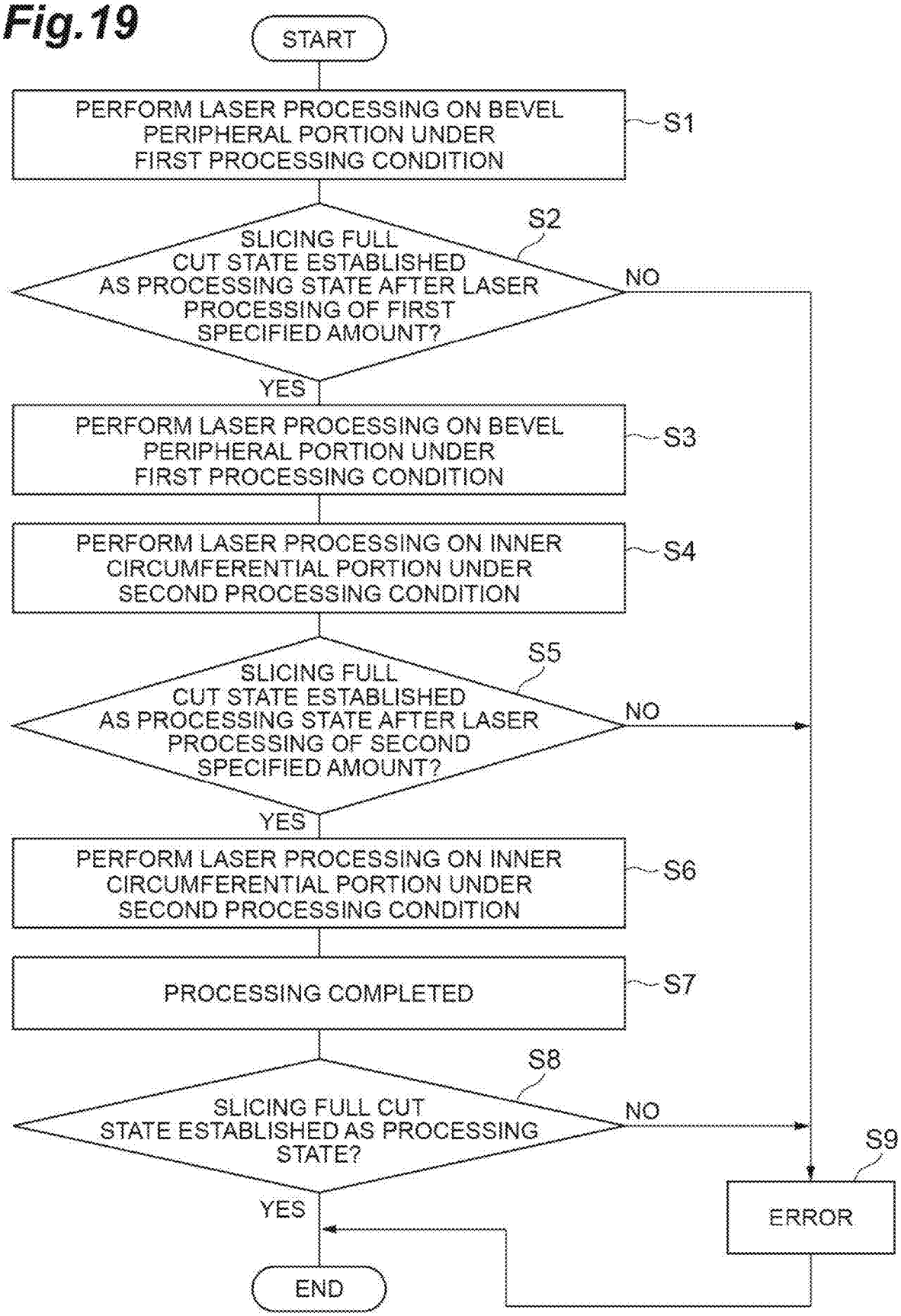
FIG. 19 is a flowchart illustrating the peeling processing according to the first embodiment.

Next, the above-mentioned peeling processing will be described in detail with reference to a flowchart illustrated in FIG. 19.

With the peeling processing of the present embodiment, the target 100 is peeled by performing the second processing process, after the cracks reach the bevel portion BB as a result of the first processing process. Specifically, the controller 9 controls the parts of the laser processing apparatus 101 to perform the following processes.

First of all, the stage 107 is rotated and the laser processing head 10A is moved along the Y-axis rail 108 and the first Z-axis rail 106A, to make the alignment camera AC positioned immediately above the alignment target 100n of the target 100, and make the alignment camera AC focused on the alignment target 100n. The alignment camera AC captures an image. The 0 degree direction position of the target 100 is acquired based on the image captured by the alignment camera AC. The diameter of the target 100 is acquired based on the image captured by the alignment camera AC. The diameter of the target 100 may be set by an input from the user.

Then, as illustrated in FIGS. 9 and 20(a), the stage 107 is rotated to position the target 100 at the 0 degree direction position. The laser processing head 10A is moved along the Y-axis rail 108 to position the first focusing point P1 at a predetermined peeling start position in the Y direction. The laser processing head 10A is moved along the first Z-axis rail 106A to position the first focusing point P1 on the virtual plane M1 in the Z direction. For example, the predetermined peeling start position may be a predetermined position separated from the target 100.

Then, the rotation of the stage 107 starts. The ranging sensor starts following the back surface 100b. Before the following by the ranging sensor, the position of the first focusing point P1 is confirmed to be within a measurable range of the ranging sensor in advance. The laser processing head 10A starts emitting the first laser light L1 when a constant rotation speed (constant speed) of the stage 107 is achieved.

The laser processing head 10A moves along the Y-axis rail 108 so that the first focusing point P1 moves toward the inner circumferential side along the Y direction, while the bevel peripheral portion 100X is being irradiated with the first laser light L1 under the first processing condition (step S1, first processing step). In step S1 described above, the region of the target 100 in which the modified region 4 is formed shifts in the first direction E1 from the circumferential edge toward the inner side. In step S1 described above, the laser processing is performed with the index direction set to be the first direction E1. In step S1 described above, the modified region 4 is formed with the first focusing point P1 moving toward the inner side from the circumferential edge, along the spiral line M11. In step S1 described above, a timing at which the first laser light L1 starts to be emitted may be a timing when the optical axis of the first laser light L1 is still positioned outside the target 100, or when the optical axis is positioned in the bevel peripheral portion 100X.

After the first processing step of the first specified amount, the rotation of the stage 107, the emission of the first laser light L1, and the like stop, and the first processing step is terminated. Based on the image capturing result obtained by the imaging unit IR, whether the slicing full cut state is established as the processing state after the processing of the first specified amount is determined (step S2). When the result of the determination in step S2 described above is Yes, the rotation of the stage 107, the emission of the first laser light L1, and the like start again, and the first processing step is resumed (step S3). As a result, the modified region 4 is formed along the line M11 of a spiral shape in the bevel peripheral portion 100X, whereby the slicing full cut state is established as the processing state (see FIG. 20(b)).

Then, as illustrated in FIGS. 9 and 21(a), the laser processing head 10A moves along the Y-axis rail 108 to move the first focusing point P1 toward the inner circumferential side along the Y direction, while the inner circumferential portion 100Y is being irradiated with the first laser light L1 under the second processing condition, with the stage 107 rotating (step S4, second processing step). In step S4 described above, the laser processing is performed with the index direction set to be the first direction E1. In step S4 described above, the modified region 4 is formed with the first focusing point P1 moving toward the inner side from the circumferential edge, along the spiral line M11.

After the second processing step of the second specified amount, the rotation of the stage 107, the emission of the first laser light L1, and the like stop, and the second processing step is terminated. Based on the image capturing result obtained by the imaging unit IR, whether the slicing full cut state is established as the processing state after the processing of the second specified amount is determined (step S5). When the result of the determination in step S5 described above is Yes, the rotation of the stage 107, the emission of the first laser light L1, and the like start again, and the second processing step is resumed (step S6). As a result, the modified region 4 is formed along the line M11 of a spiral shape in the inner circumferential portion 100Y, whereby the slicing full cut state is established as the processing state (see FIG. 21(b)).

As a result, the modified region 4 is formed along the line M11 over the entirety of the virtual plane M1, and thus the processing is completed (step S7). Based on the image capturing result obtained by the imaging unit IR, whether the slicing full cut state is established as the processing state after the completion of the processing over the entirety of the virtual plane M1 is determined (step S8). When the result of the determination in step S8 described above is Yes, the peeling processing is deemed to be completed normally, and the process ends normally. On the other hand, when the result of the determination in step S2 described above is No, when the result of the determination in step S5 described above is No, or when the result of the determination in step S8 described above is No, the processing state is determined to be erroneous, and the error in the processing state is notified through the GUI 111 for example (step S9). For example, after step S9 described above, the first processing condition and the second processing condition are reset by a separate step (for example, a process in a fourth embodiment described later).

When the width of the bevel peripheral portion 100X in the index direction is 35 mm or less, the bevel portion BB may be warped during the second processing process. When the width of the bevel peripheral portion 100X in the index direction is greater than 35 mm, the bevel portion BB may be warped during the first processing process.

Figure 22:
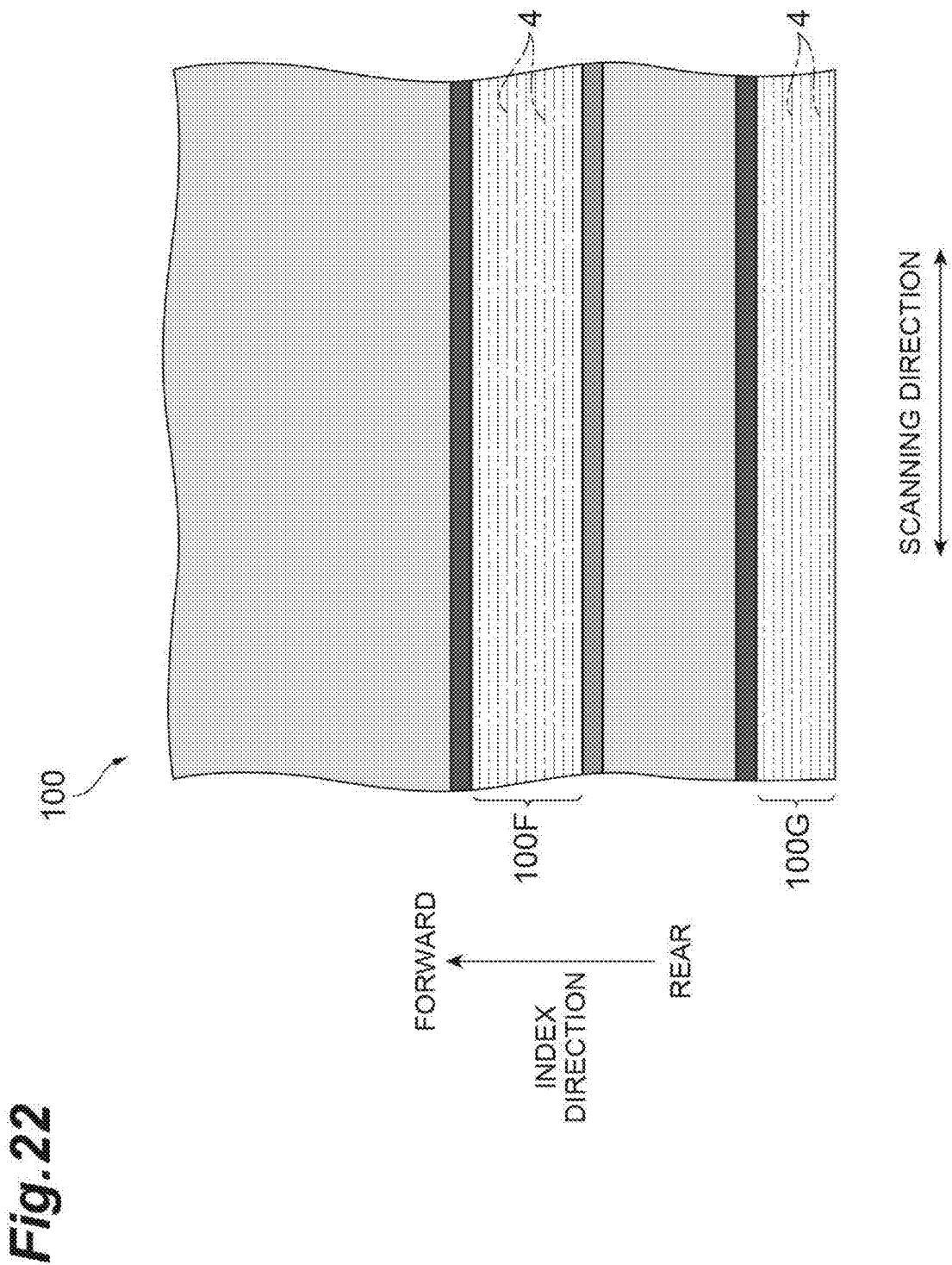
FIG. 22 is a plan view of the target illustrating cracks extending from a modified region.

FIG. 22 is a plan view of the target 100 illustrating cracks extending from the modified region 4 formed along the virtual plane M1. FIG. 23 is a diagram illustrating the monitoring result of the cracks in the target 100 illustrated in FIG. 22. FIG. 22 illustrates the target 100 as viewed from the laser light incident surface. In this experiment, in the target 100, the modified region 4 was formed along a plurality of linear processing lines arranged side by side in an outer circumferential portion 100G and an inner circumferential portion 100F on the inner circumferential side of the outer circumferential portion 100E The monitoring was performed on cracks on a rear side of the inner circumferential portion 100F in the index direction (the outer circumferential portion 100G side), on the forward side of the inner circumferential portion 100F in the index direction, and on the forward side of the outer circumferential portion 100G in the index direction, while changing the processing line count, which is the number of processing lines set.

In the figure, the left and right direction is a scanning direction (extending direction of the processing line), and an upward and downward direction is the index direction. The first laser light L1 has the number of branches of 4, the branch pitch BPy of 20 μm, the branch pitch BPx of 30 μm, the pulse energy of 16.73 μJ, the processing speed of 800 mm/s, the pulse pitch of 10 μm, and the pulse width of 700 ns. The target 100 is a silicon wafer with a (100) plane serving as the principal plane. The thickness of the target 100 is 775 μm.

As illustrated in FIGS. 22 and 23, the crack advancement amount varies greatly on the forward side in the index direction, regardless of the processing line count. On the rear side in the index direction, the crack advancement amount increases as the processing line count increases. It can be seen that the crack advances in the direction opposite to the index direction (rear side in the index direction). It can be seen that the crack advancement amount of the crack depends on the processing line count. Thus, it can be found that when the modified region 4 is formed along the virtual plane M1, the advancement direction of the crack extending along the virtual plane M1 from the modified region 4 has a large impact on a shifting direction (index direction) of the region in the target 100 in which the modified region 4 is formed. Specifically, it can be found that the crack is likely to advance stably in the direction opposite to the shifting direction.

Laser processing was performed on a wafer including the bevel portion BB under a processing condition I, to establish the slicing full cut state as the processing state. The results of the experiment are as follows. The width of a modified area is the width in the index direction. "x" means No Good, "Δ" means Good, and "○" means Very Good.

Processing Condition I>

Number of branches 4, branch pitch BPy 20 μm, branch pitch BPx 30 μm, processing speed 800 mm, frequency 80 kHz <Experimental Results>

Width of modified area 10 mm (processing line count 500): cracks reaching bevel portion BB x Width of modified area 20 mm (processing line count 1000): cracks reaching bevel portion BB x Width of modified area 25 mm (processing line count 1252): cracks reaching bevel portion BB x Width of modified area 30 mm (processing line count 1500): cracks reaching bevel portion BB Δ

Width of modified area 35 mm (processing line count 1752): cracks reaching bevel portion BB ○ (warp amount 0.3 mm)

Laser processing was performed on a wafer including the bevel portion BB under a processing condition II, to establish the slicing half cut state as the processing state. The results of the experiment are as follows. The results of the experiment are as follows. The width of a modified area is the width in the index direction. "x" means No Good, "Δ" means Good, and "○" means Very Good.

Processing Condition II>

Number of branches 4, branch pitch BPy 30 μm, branch pitch BPx 30 μm, processing speed 800 mm, frequency 80 kHz <Experimental Results>

Width of modified area 10 mm (processing line count 333): cracks reaching bevel portion BB x Width of modified area 20 mm (processing line count 666): cracks reaching bevel portion BB x Width of modified area 25 mm (processing line count 833): cracks reaching bevel portion BB x Width of modified area 30 mm (processing line count 1000): cracks reaching bevel portion BB x Width of modified area 100 mm (processing line count 3333): cracks reaching bevel portion BB x From these experimental results, it can be found that the crack can reach the bevel portion BB when the slicing full cut state is established as the processing state of the modified area. It can also be found that the crack is difficult to reach the bevel portion BB when the slicing half cut state is established as the processing state of the modified area. Thus, for the cracks to advance to the bevel portion BB, the slicing full cut state is at least required to be established as the processing state of the modified area.

As described above, in the laser processing apparatus 101 and the laser processing method, the region in which the modified region 4 is formed in the bevel peripheral portion 100X shifts in the first direction E1 toward the inner side from the circumferential edge. Thus, the first direction E1 is the index direction of the first laser light L1. This configuration facilitates stable advancement of the cracks in a direction toward the circumferential edge from the inner side, which is a direction opposite to the first direction E1. Stable advancement of the cracks in the direction toward the circumferential edge from the inner side, which is the direction opposite to the first direction E1 in the modified region 4 is facilitated. As a result, the crack can be formed even in the bevel portion BB, which is difficult to process, and the target 100 can be reliably peeled. In the inner circumferential portion 100Y more on the inner side than the bevel peripheral portion 100X, laser processing under the second processing condition as the desired processing condition can be performed, whereby laser processing meeting various needs such as better takt time can be implemented.

In the first processing process of the laser processing apparatus 101 and the first processing step of the laser processing method, the modified region 4 is formed from the circumferential edge toward the inner side along the line M11 that spirally extends from the circumferential edge toward the inner side in the target 100, or a plurality of modified regions 4 are sequentially formed from the circumferential edge toward the inner side along a plurality of linear parallel lines arranged toward the inner side from the circumferential edge in the target 100. Thus, shifting of the region in which the modified region 4 is formed in the bevel peripheral portion 100X including the bevel portion BB in the first direction E1 toward the inner side from the circumferential edge can be specifically implemented.

In the laser processing apparatus 101 and the laser processing method, the first processing condition and the second processing condition are conditions for establishing the slicing half cut state as the processing state, when the modified region is formed by emitting the laser light along a single processing line. Under such processing conditions, the target 100 can be reliably peeled.

In the laser processing apparatus 101 and the laser processing method, the first processing condition and the second processing condition are conditions under which the slicing full cut state is established as the processing state when the modified region 4 is formed by emitting the first laser light L1 along the processing line including a plurality of parallel lines (the spiral line M11 and a plurality of linear lines). Under such processing conditions, the target 100 can be reliably peeled.

In the laser processing apparatus 101 and the laser processing method, the first processing condition is a condition under which the slicing full cut state is established as the processing state after the laser processing of the first specified amount. The second processing condition is a condition under which the slicing full cut state is established as the processing state after the laser processing of a second specified amount larger than the first specified amount. In this case, under the second processing condition, the plurality of modified spots SA included in the modified region 4 formed can be sparse, compared with those under the first processing condition, whereby the laser processing can be efficiently performed. Laser processing can be performed with a better takt time.

In the laser processing apparatus 101 and the laser processing method, before the peeling processing (peeling process), the trimming processing (trimming process) is performed to form the modified region 43 in a portion, in the target 100, more on the front surface 100a side than the virtual plane M1, along the line M3 annularly extending on the inner side of the circumferential edge of the target 100. Thus, the trimming processing of removing the portion on the circumferential edge side of the line M3 can be implemented. With the trimming processing thus being executable before the target 100 is peeled, the first laser light L1 can be prevented from being emitted to pass through the cracks produced by the peeling, compared with a case where the trimming processing is performed after the peeling. Furthermore, the device and the method are reusable on a removed portion removed from the target 100 by the trimming processing and the peeling processing.

In the second processing process of the laser processing apparatus 101 and the second processing step of the laser processing method, the region in which the modified region 4 is formed in the target 100 shifts in the first direction E1. Thus, the first direction E1 is the index direction of the first laser light L1 in the second processing process and in the second processing step. As a result, the target 100 can be reliably peeled.

As described above, it can be found that the target 100 is difficult to peel, if the slicing full cut state is not established as the processing state when the modified region 4 is formed along the processing line including a plurality of parallel lines. Thus, in the laser processing apparatus 101 and the laser processing method, whether the slicing full cut state is established as the processing state when the modified region 4 is formed along the line M11 is monitored. With a result of the monitoring, whether the target 100 can be peeled can be easily recognized.

In the laser processing apparatus 101 and the laser processing method, in the first processing process (first processing step), whether the slicing full cut state is established as the processing state after the laser processing of the first specified amount is monitored. In the second processing process (second processing step), whether the slicing full cut state is established as the processing state after the laser processing of the second specified amount is monitored. With this configuration, whether the target 100 can be peeled can be easily monitored by the first processing process (first processing step). Whether the target 100 can be peeled can be easily monitored by the second processing process (second processing step).

In the laser processing apparatus 101, based on the monitoring result obtained by the imaging unit IR, the controller 9 determines whether the slicing full cut state is established as the processing state after the laser processing of the first specified amount in the first processing process, and whether the slicing full cut state is established as the processing state after the laser processing of the second specified amount in the second processing process. In this case, the controller 9 can automatically determine whether the slicing full cut state is established as the processing state, from the monitoring result.

In the laser processing apparatus 101 and the laser processing method, whether the slicing full cut state is established as the processing state after the processing is further monitored. With this configuration, it can be recognized that the target 100 can be peeled after the processing has been completed. Step S8 above in which whether the slicing full cut state is established as the processing state after the completion of the processing is determined as well as the related processes may be omitted.

Note that in the present embodiment, the imaging unit IR may monitor whether the slicing half cut state is established as the processing state when the modified region 4 is formed along a single processing line. For example, when the processing line includes a plurality of lines, the processing state when the modified region 4 is formed along any one of the lines may be monitored. For example, when the processing line is the line M11 of a spiral shape, the processing state when the modified region 4 is formed along a line of one circle part of the processing line may be monitored.

In this case, the controller 9 may determine whether the slicing half cut state is established as the processing state when the modified region 4 is formed along a single processing line, based on a result of the monitoring by the imaging unit IR. With this configuration, whether the slicing half cut state is established as the processing state can be automatically determined from the monitoring result. When the processing state when the modified region 4 is formed along one processing line is not the slicing half cut state (is the slicing stealth state), it is determined that there is an error in the processing state. Then, for example, the error in the processing state may be notified via the GUI 111, and the processing condition may be separately reset.

In the present embodiment, the first processing process (first process method) is performed on the bevel peripheral portion 100X, and the second processing process (second processing process) is performed on the inner circumferential portion 100Y. Alternatively, the first processing process (the first processing process) may be performed entirely over the target 100 without performing the second processing process (second processing process).

In the second processing process (second processing step) according to the present embodiment, as illustrated in FIGS. 24(a) and 24(b), the region in which the modified region 4 is formed may be shifted in a second direction E2. Specifically, the laser processing is performed on the bevel peripheral portion 100X with the first direction E1 being the index direction, and the modified region 4 is formed in the bevel peripheral portion 100X, along the line M11 toward the inner circumference from the outer edge in a spiral shape. Then, the laser processing is performed on the inner circumferential portion 100Y with the second direction E2 being the index direction, and the modified region 4 is formed in the inner circumferential portion 100Y along the line M11 toward the outer edge from the inner circumference in a spiral shape.

With the index direction of the first laser light L1 thus being the second direction E2 in the second processing process (second processing step), the target 100 can be reliably peeled. In this case, the distance of the bevel peripheral portion 100X in the index direction may be equal to or shorter than a predetermined distance set in advance. The distance equal to or shorter the predetermined distance is, for example, 35 mm or less, and is specifically 20 mm. As a result, the target 100 can be peeled without having cracks.

In the present embodiment, the order of the first processing process (first processing step) and the second processing process (second processing step) may be changed, that is, the first processing process may be performed after the second processing process. In this case, cracks are likely to be formed while the bevel peripheral portion 100X during the processing, but the bevel peripheral portion 100X can be at least peeled. In the present embodiment, as long as the index direction of the first processing process is the first direction E1, the other processing conditions (such as the order of the first and the second processing processes and the processing state of the first and second processing processes) are not particularly limited. With the processing conditions described above, the target 100 can be reliably peeled.

In the laser processing apparatus 101 and the laser processing method, an input from the user is received by the GUI 111, and the controller 9 can set at least one of the first processing condition and the second processing condition based on the input on the GUI 111. The first processing condition and the second processing condition can be set as desired. An example of a setting screen displayed on the GUI 111 will be described below.

Figure 25:
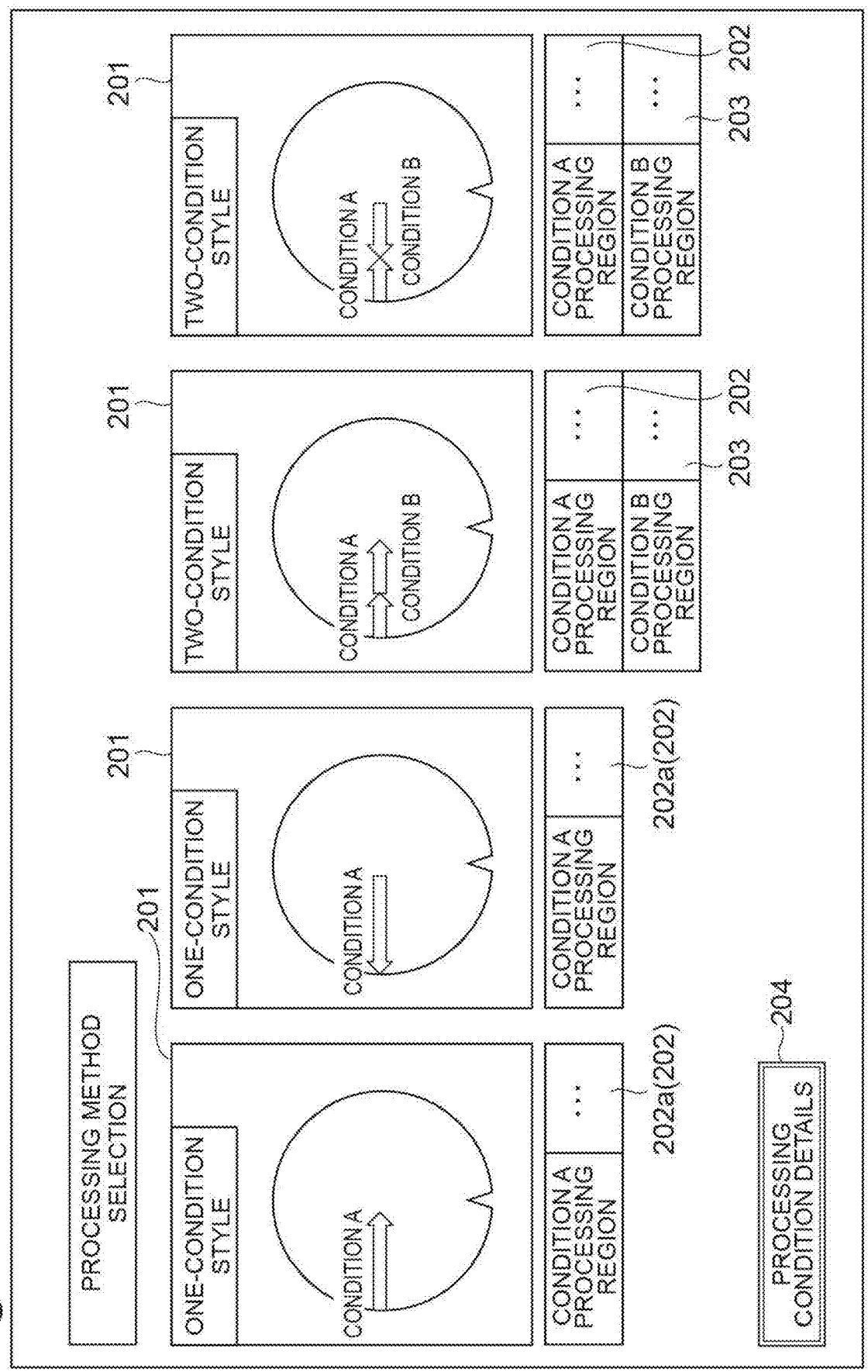
FIG. 25 is a diagram illustrating an example of a setting screen of a GUI.

FIG. 25 is a diagram illustrating an example of the setting screen of the GUI 111. The setting screen illustrated in FIG. 25 is used for mass production, and for determining the processing condition by the user. The setting screen illustrated in FIG. 25 includes a processing method selection button 201 for setting any one of a plurality of processing methods, an input field 202 for setting the size of the bevel peripheral portion 100X, an input field 203 for setting the size of the inner circumferential portion 100Y, and a detail button 204 for transitioning to detail setting. The plurality of processing methods are different from each other in in the index direction in the first processing process, the index direction in the second processing process, and whether the second processing process is performed or not. When the second processing process is not performed (that is, when the first processing process is performed as the processing over the entirety), an option for the entirety is prepared in an input field 202a.

Figure 26:
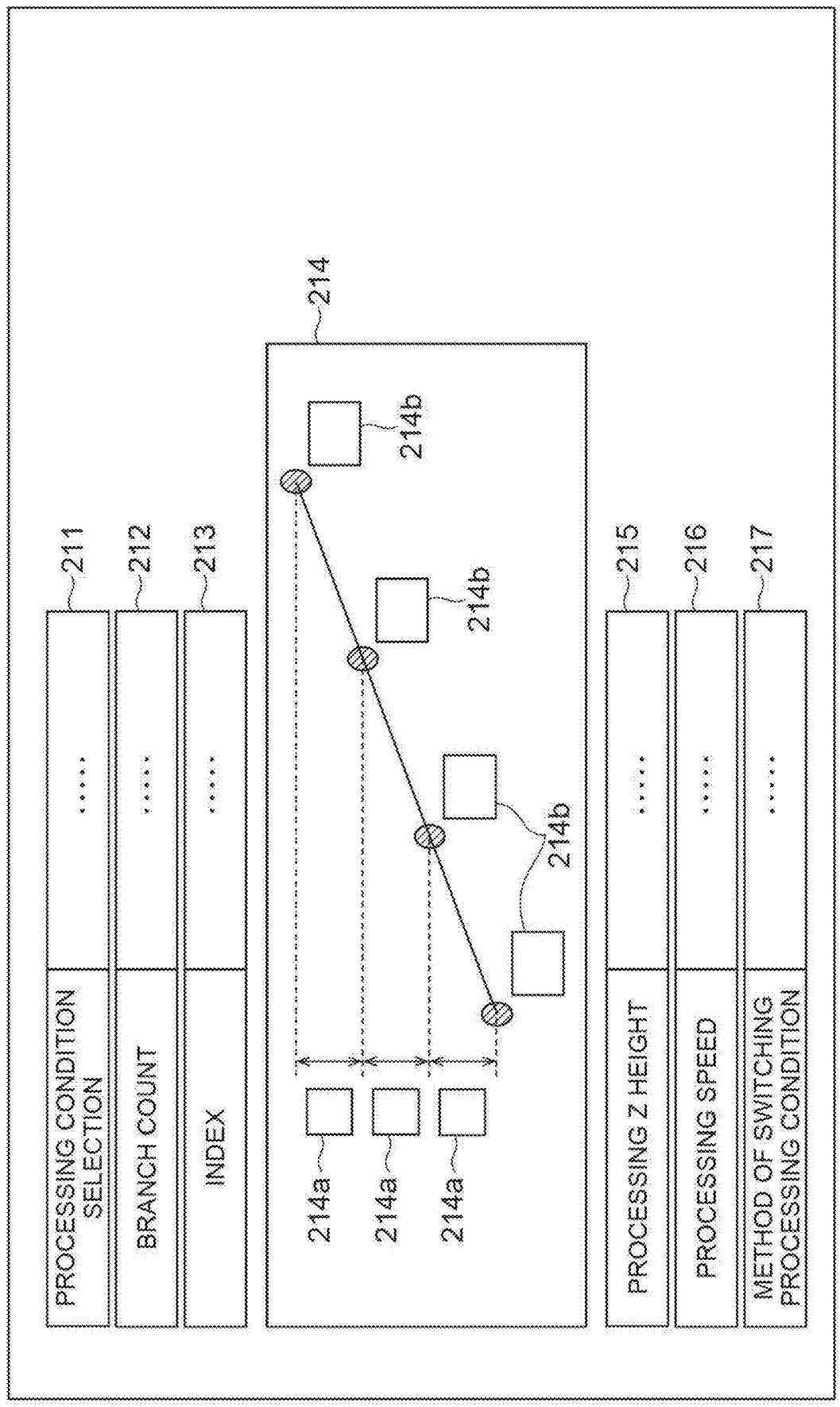
FIG. 26 is a diagram illustrating another example of the setting screen of the GUI.

FIG. 26 is a diagram illustrating another example of the setting screen of the GUI 111. The setting screen illustrated in FIG. 26 is, for example, a screen for the detail setting displayed when the detail button 204 (see FIG. 25) is touched by the user for example. The setting screen illustrated in FIG. 26 includes: a processing condition selection button 211 for selecting a processing condition; a branch count field 212 for inputting or selecting the number of branches of the first laser light L1; an index field 213 for inputting an index that is a distance of movement to the next processing line after the laser processing along a single processing line; an image diagram 214 for inputting or displaying the branch count and the index; a processing Z height field 215 for inputting the position of the modified spot SA in the Z direction; a processing speed field 216 for inputting processing speed; and a condition switching method button 217 for selecting a method of switching the processing condition.

With the processing condition selection button 211, any of the first processing condition and the second processing condition to be set can be selected. When the branch count is 1, the laser processing head 10A moves automatically in the index direction by a distance corresponding to the value input to the index field 213. When the branch count is more than 1, the laser processing head 10A automatically moves in the index direction by the index based on the following formula.

Index=(branch count)×index input value

The image diagram 214 includes a display portion 214a for the index input value and an output input field 214b for inputting the output of each modified spot SA. The processing speed field 216 may be for rotation speed, because the stage 107 actually rotates. In the processing speed field 216, the input processing speed may be automatically replaced with the rotation speed to be displayed. With the condition switching method button 217, whether the second processing process automatically performed sequentially when the first processing process is completed, or whether the first processing process is performed sequentially after the state monitoring is implemented with the device temporarily stopped after the first processing process has been completed.

Figure 27:
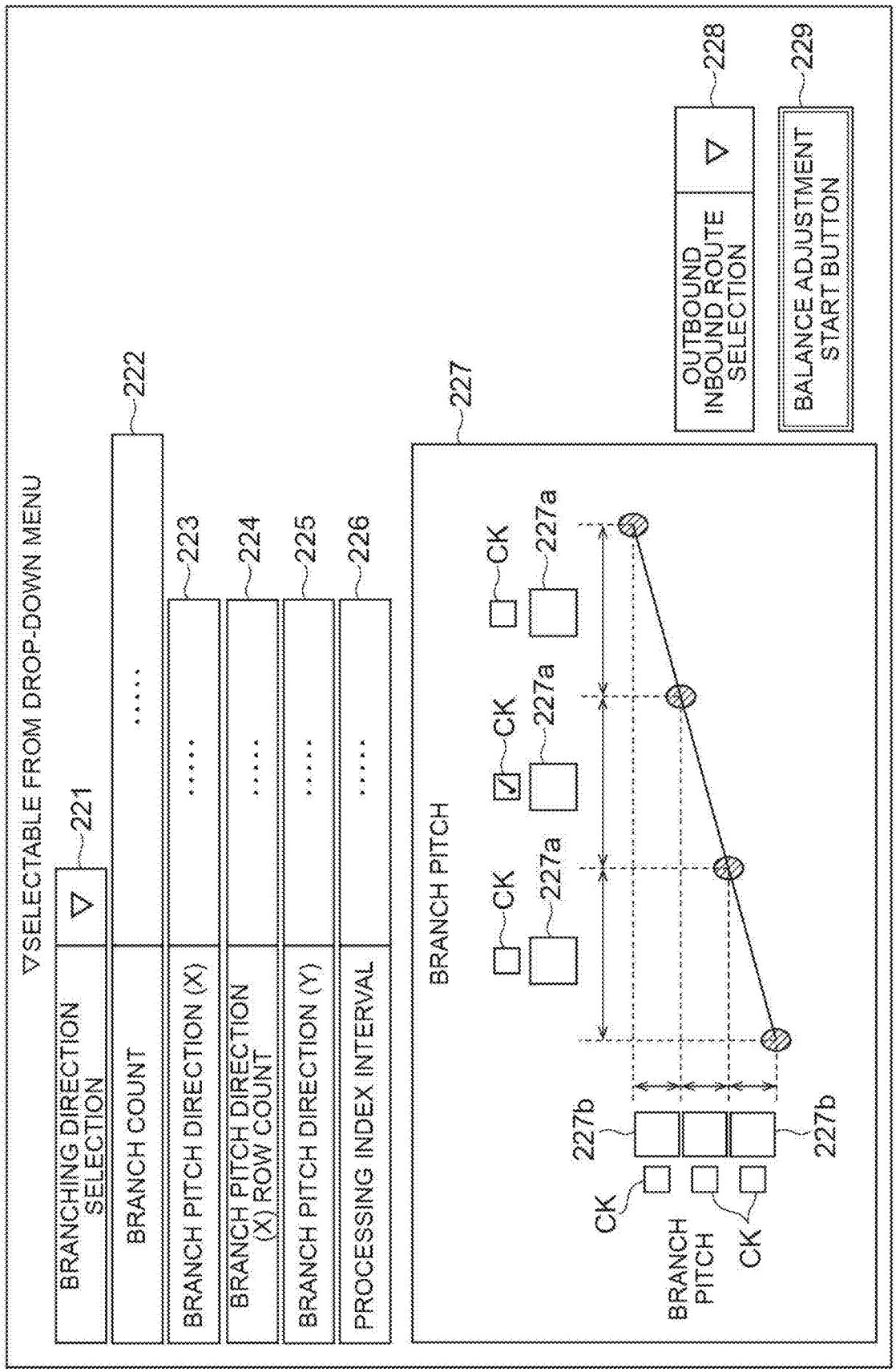
FIG. 27 is a diagram illustrating an example of an administrator mode of the setting screen of the GUI.

FIG. 27 is a diagram illustrating an example of an administrator mode of the setting screen of the GUI 111. The setting screen illustrated in FIG. 27 includes: a branching direction selection button 221 for selecting the branching direction of the first laser light L1; a branch count field 222 for inputting or selecting the number of branches of the first laser light L1; a branch pitch field 223 for inputting the branch pitch BPx; a branch pitch row count input field 224 for inputting the number of rows of the branch pitch BPx; a branch field input field 225 for inputting the branch pitch BPy; an index field 226 for inputting the index; an optical axis image diagram 227 based on the branch count; an outbound inbound route selection button 228 for selecting whether the scanning direction of the first laser light L1 is one direction (outbound path) or the other direction (inbound path); and a balance adjustment start button 229 for automatically adjusting the balance among various numerical values.

When the branch count and the branch pitches BPx and BPy are input, the distance of the optical axis is automatically calculated. When the calculated value is an erroneous distance in terms of the imaging optical system 35 (see FIG. 5), such information is displayed on the GUI 111. For the calculation, information on the imaging optical system 35 may be input. When vertical is selected as the branching direction with the branching direction selection button 221, a plurality of branch pitches 227a may not be displayed on the optical axis image diagram 227. Depending on the branch count, the numbers of the branch pitches 227a and 227b on the optical axis image diagram 227 may be increased/decreased. The input values in the branch pitch row count input field 224 and the branch field input field 225 is reflected on the optical axis image diagram 227. By checking each check field CK, the distance of the branch pitches 227a/227b corresponding to the checked check field CK can be changed.

FIG. 28 is a diagram illustrating an example of investigating the optimum pulse energy in the peeling processing. FIG. 28 illustrates a processing state when laser processing is performed along one processing line, and whether peeling can be performed after laser processing has been performed along a plurality of processing lines (parallel lines). The first laser light L1 has the branch count being 4, both of the branch pitches BPx and BPy being 30 μm, the processing speed being 800 mm/s, the pulse pitch being 10 μm, and the pulse width being 700 ns. In the figure, "SST" indicates the slicing stealth state. In the figure, "SHC" indicates the slicing half cut state. As can be seen in FIG. 28, the optimum pulse energy with which the slicing half cut state is established is in the range of 9.08 to 56 μJ. In particular, it can be seen that peeling can be performed without problems when the pulse energy is 12.97 to 25 μJ. When the pulse pitch is larger than 10 μm, the optimum pulse energy is likely to be larger than the experimental result in the figure. When the pulse pitch is smaller than 10 μm, the optimum pulse energy is likely to be smaller than the experimental result in the figure.

In the present embodiment, the controller 9 automatically determines the processing state. Alternatively, the user may determine the processing state based on the monitoring result obtained by the imaging unit IR. The determination that the processing state is the slicing full cut state corresponds to the determination that the processing state is not the slicing half cut state or the slicing stealth state.

In general peeling processing, the target 100 may be peeled with a short pitch between the plurality of modified spots SA in the modified region 4 formed, so that the modified spots SA are densely provided in the virtual plane M1 as the scheduled peeling plane. In this case, a condition under which advancement of the cracks from the modified spots SA is relatively small is selected as the processing condition (for example, wavelength of the laser light is short (1028 nm), the pulse width is 50 nsec, and the pulse pitch is 1 to 10 μm (1.5 to 3.5 μm in particular)). On the other hand, in the present embodiment, a condition under which the cracks advances along the virtual plane M1 is selected as the processing condition. For example, as the processing condition of the first laser light L1 for forming the modified region 4 along the virtual plane M1, a long wavelength (for example, 1099 nm) and the pulse width of 700 nsec are selected for the first laser light L1. It has been found that this results in a new processing state (such as the slicing half cut state and slicing full cut).

In the present embodiment, the controller 9 may perform a third processing process of irradiating the bevel peripheral portion 100X with the first laser light L1 under another processing condition different from the first processing condition, during the first processing process. In other words, the third processing step of irradiating the bevel peripheral portion 100X with the first laser light L1 under the other processing condition different from the first processing condition may be performed during the first processing step. The other processing condition is not particularly limited and may be various conditions. For example, the other processing condition may be a processing condition under which the slicing stealth state, the slicing half cut state, or the slicing full cut state is established as the processing state in the target 100. Also in this case, the target 100 can be reliably peeled. The interval of the processing line in the index direction in the third processing process (third processing step) may be wider than the interval of the processing line in the index direction in the first processing process (first processing step).

In the present embodiment, the processing may be temporarily stopped or not stopped when switching between the first processing process (first processing step) and the second processing process (second processing step). In the present embodiment, the processing may be temporarily stopped or not stopped when switching between the first processing process (first processing step) and the third processing process (third processing step). When the processing process (processing step) is switched without switching the processing, the processing condition may be gradually switched. For example, when the first processing condition and the second processing condition are different from each other in the branch pitch BPy only, the branch pitch BPy may be switched from 20 μm to 30 μm gradually (in the sequence of 20 μm, 21 μm, 22 μm, 23 μm, . . . 30 μm) without stopping the processing, and without stopping the rotation of the stage 107.

Second Embodiment

Next, a second embodiment will be described. In the description of the second embodiment, the points different from those in the first embodiment will be described, and the description that is given in the first embodiment will not be redundantly given.

In the above first embodiment, the peeling processing is implemented in the first and the second processing processes. In the present embodiment, the peeling processing is implemented with a single processing process. Specifically, as illustrated in FIGS. 29(a) and 29(b), the present embodiment is different from the first embodiment described above in that the laser processing is performed over the entirety of the target 100 including the bevel peripheral portion 100X and the inner circumferential portion 100Y under a single processing condition.

The controller 9 performs a processing process of irradiating the entirety of the target 100 with the first laser light L1 under the second processing condition. Specifically, the target 100 is irradiated with the first laser light L1 under the second processing condition, while the position of the first focusing point P1 moves relative to the target 100 along the spiral line M11 from the circumferential edge toward the inner side. Thus, the modified region 4 is formed along the line M11. That is, the region of the target 100 in which the modified region 4 is formed, shifts in the first direction E1 from the circumferential edge toward the inner side.

The controller 9 operates a suction jig that sucks the target 100 after the laser processing, in a twisting manner around the Z direction. With this configuration, external stress for peeling can be applied to the target 100.

Figure 30:
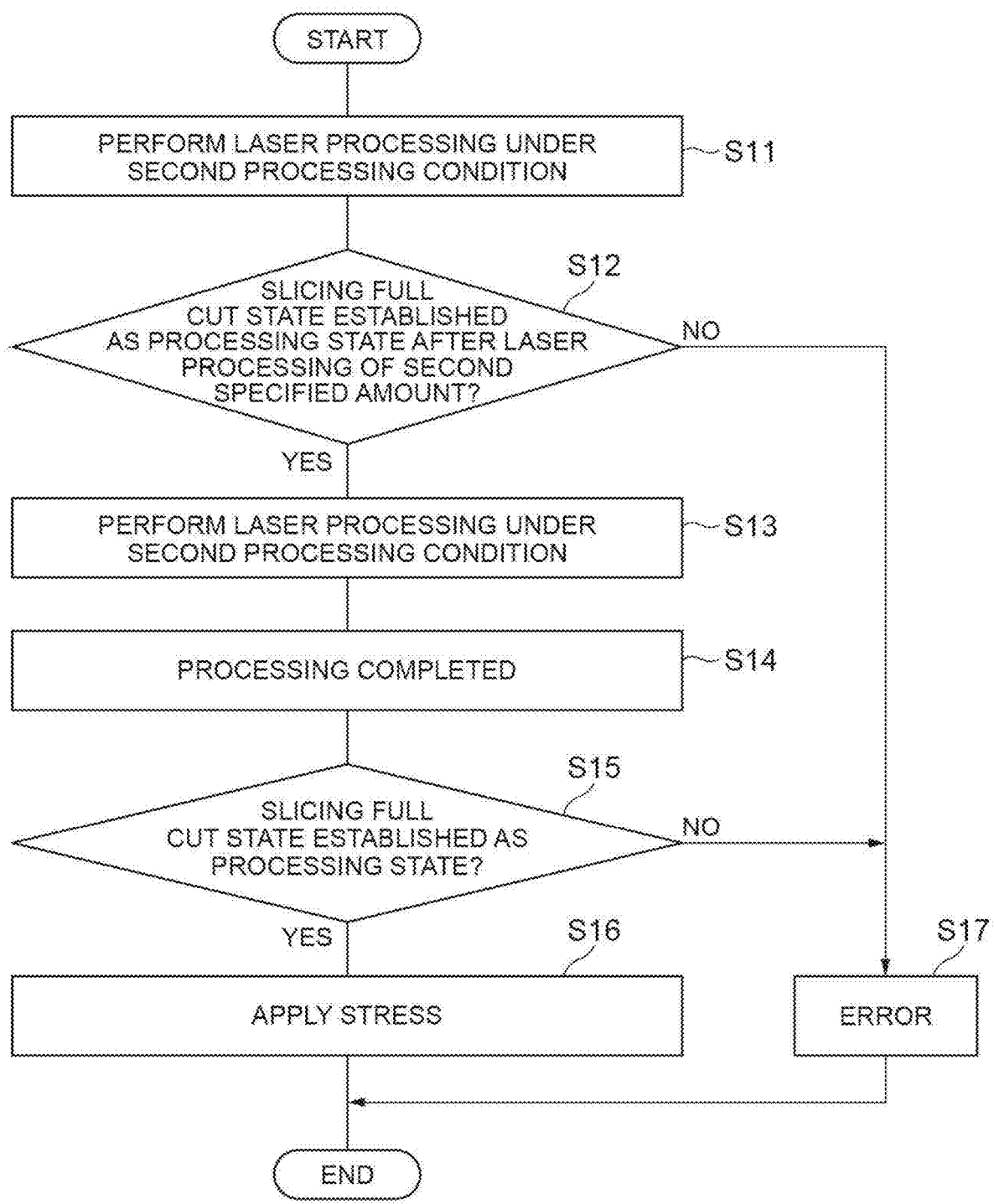
FIG. 30 is a flowchart illustrating the peeling processing according to the second embodiment.

Next, the peeling processing according to the present embodiment will be described with reference to a flowchart in FIG. 30.

In the peeling processing according to the present embodiment, the controller 9 controls the parts of the laser processing apparatus 101 to perform the following processes. Specifically, the rotation of the stage 107 starts. The laser processing head 10A moves along the Y-axis rail 108 so that the first focusing point P1 moves toward the inner circumferential side along the Y direction, while the target 100 is being irradiated with the first laser light L1 under the second processing condition (step S11, processing step).

In step S11 described above, the laser processing is performed with the index direction set to be the first direction E1. In step S11 described above, the modified region 4 is formed with the first focusing point P1 moving toward the inner side from the circumferential edge, along the spiral line M11. In step S11 described above, a timing at which the first laser light L1 starts to be emitted may be a timing when the optical axis of the first laser light L1 is still positioned outside the target 100, or when the optical axis is positioned in the bevel peripheral portion 100X.

After the processing step of the second specified amount, the rotation of the stage 107, the emission of the first laser light L1, and the like stop, and the processing step is terminated. Based on the image capturing result obtained by the imaging unit IR, whether the slicing full cut state is established (that is, whether the second slicing full cut state is established) as the processing state after the processing of the second specified amount is determined (step S12). When the result of the determination in step S12 described above is Yes, the rotation of the stage 107, the emission of the first laser light L1, and the like start again, and the processing step is resumed (step S13). As a result, the modified region 4 is formed along the line M11 of a spiral shape in the target 100, whereby the slicing full cut state is established as the processing state (see FIG. 29(b)). As a result, the modified region 4 is formed along the line M11 over the entirety of the virtual plane M1, and thus the processing is completed (step S14).

Based on the image capturing result obtained by the imaging unit IR, whether the slicing full cut state is established as the processing state after the completion of the processing over the entirety of the virtual plane M1 is determined (step S15). When the result of the determination in step S15 described above is Yes, the stress is applied to peel a part of the target 100 (step S16). In step S16 described above, for example, the external stress may be applied to the target 100 by twisting the suction jig sucking the target 100 around the Z direction. Then, the peeling processing is determined to have been normally completed, and the process normally ends. On the other hand, when the result of the determination in step S12 described above is No, or when the result of the determination in step S15 described above is No, the processing state is determined to be erroneous, and the error in the processing state is notified through the GUI 111 for example (step S17). For example, after step S17 described above, the second processing condition is reset by a separate step (for example, a process in a fourth embodiment described later).

Also with the laser processing apparatus 101 and the laser processing method according to the present embodiment described above, effects similar to those obtained by the first embodiment are provided. In the laser processing apparatus 101 and the laser processing method of the present embodiment, the slicing full cut state is established as the processing state with the laser processing only, and the target 100 can be peeled by applying stress.

In the present embodiment, the processing condition may be a condition under which the slicing half cut state is established as the processing state. Furthermore, the processing condition may be a condition under which the first slicing full cut state is established as the processing state. When the processing condition under which the first slicing full cut state is established as the processing state is used, step S16 described above of applying stress may be omitted.

In the present embodiment, the method and configuration for applying the stress is not particularly limited. For example, physical stress may be applied (such as suction, pressurization, or water pressure) to advance the crack for the peeling. Furthermore, for example, stress may be applied by laser preheating, ultrasonic waves, or the like to advance the crack for the peeling.

Figure 31:
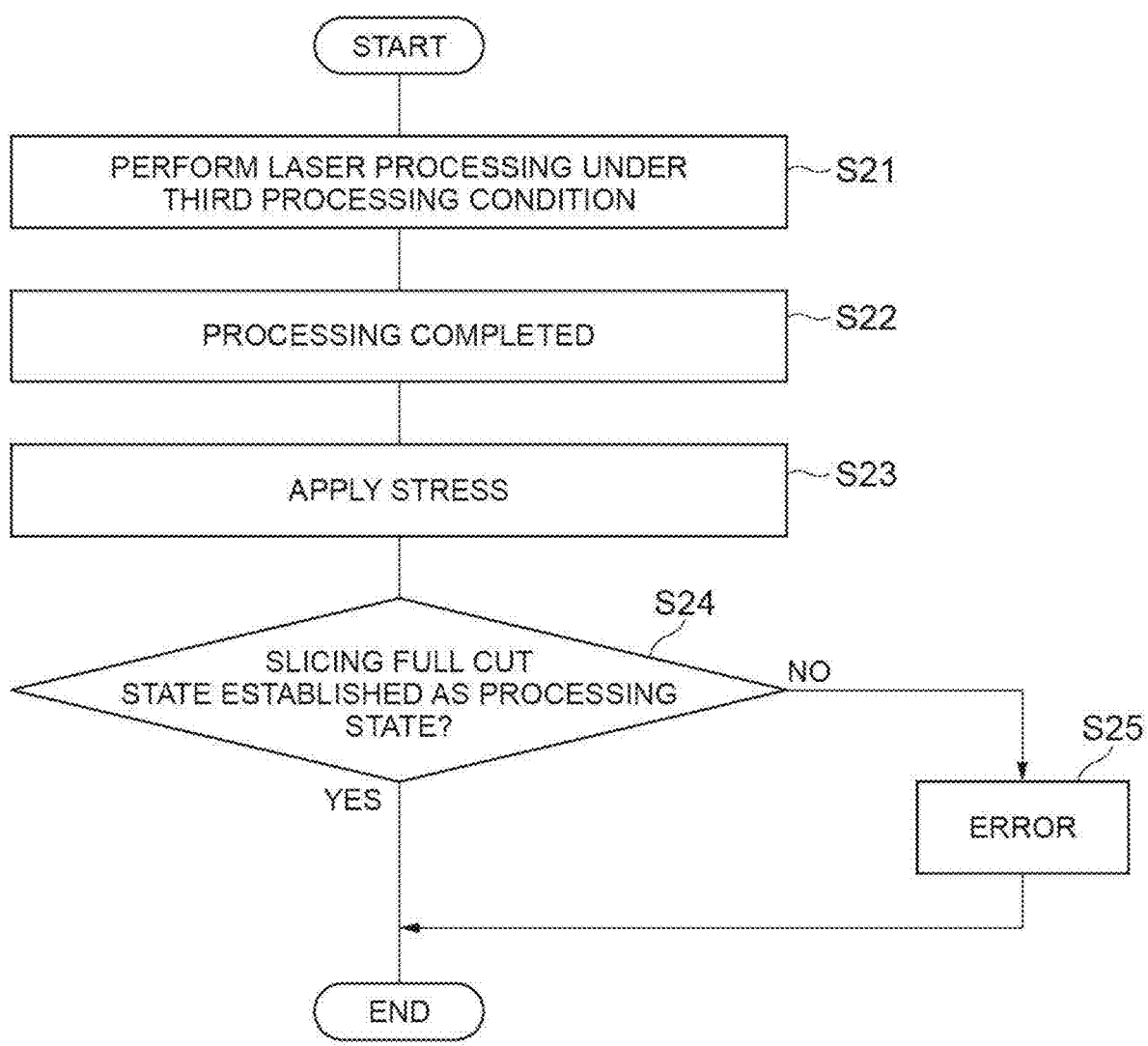
FIG. 31 is a flowchart illustrating peeling processing according to a modification example of the second embodiment.

FIG. 31 is a flowchart illustrating peeling processing according to a modification example of the second embodiment. In the modification example, the peeling is implemented with the slicing full cut state established as the processing state by the laser processing and by applying stress. In the modification example, the following processes illustrated in FIG. 31 are performed instead of the processes illustrated in FIG. 30. The laser processing head 10A moves along the Y-axis rail 108 so that the first focusing point P1 moves toward the inner circumferential side along the Y direction, while the target 100 is being irradiated with the first laser light L1 under the third processing condition and with the stage 107 rotated (step S21). The third processing condition is a condition under which the slicing half cut state is established as the processing state when the modified region 4 is formed by emitting the first laser light L1 along one processing line, and is a condition under which the slicing full cut state is not established as the processing state when the modified region 4 is formed by emitting the first laser light L1 along the processing line including a plurality of parallel lines arranged side by side. Such a third processing condition has various parameters set as appropriate based on the known technique, so that the slicing half cut state is established but the slicing full cut state is not established as the processing state. As a result, the modified region 4 is formed along the line M11 over the entirety of the virtual plane M1, and thus the processing is completed (step S22). The stress is applied to the target 100 so that the slicing full cut state is established as the processing state (step S23).

Based on the image capturing result obtained by the imaging unit IR, whether the slicing full cut state is established as the processing state after the completion of the processing over the entirety of the virtual plane M1 is determined (step S24). When the result of the determination in step S24 described above is Yes, the peeling processing is deemed to be completed normally, and the process ends normally. On the other hand, when the result of the determination in step S24 described above is No, the processing state is determined to be erroneous, and the error in the processing state is notified through the GUI 111 for example (step S25). Also with the laser processing apparatus and the laser processing method according to such a modification example, effects similar to those obtained by the first embodiment above are provided.

Third Embodiment

Next, a third embodiment will be described. In the description of the third embodiment, the points different from those in the first embodiment will be described, and the description that is given in the first embodiment will not be redundantly given.

Figure 32:
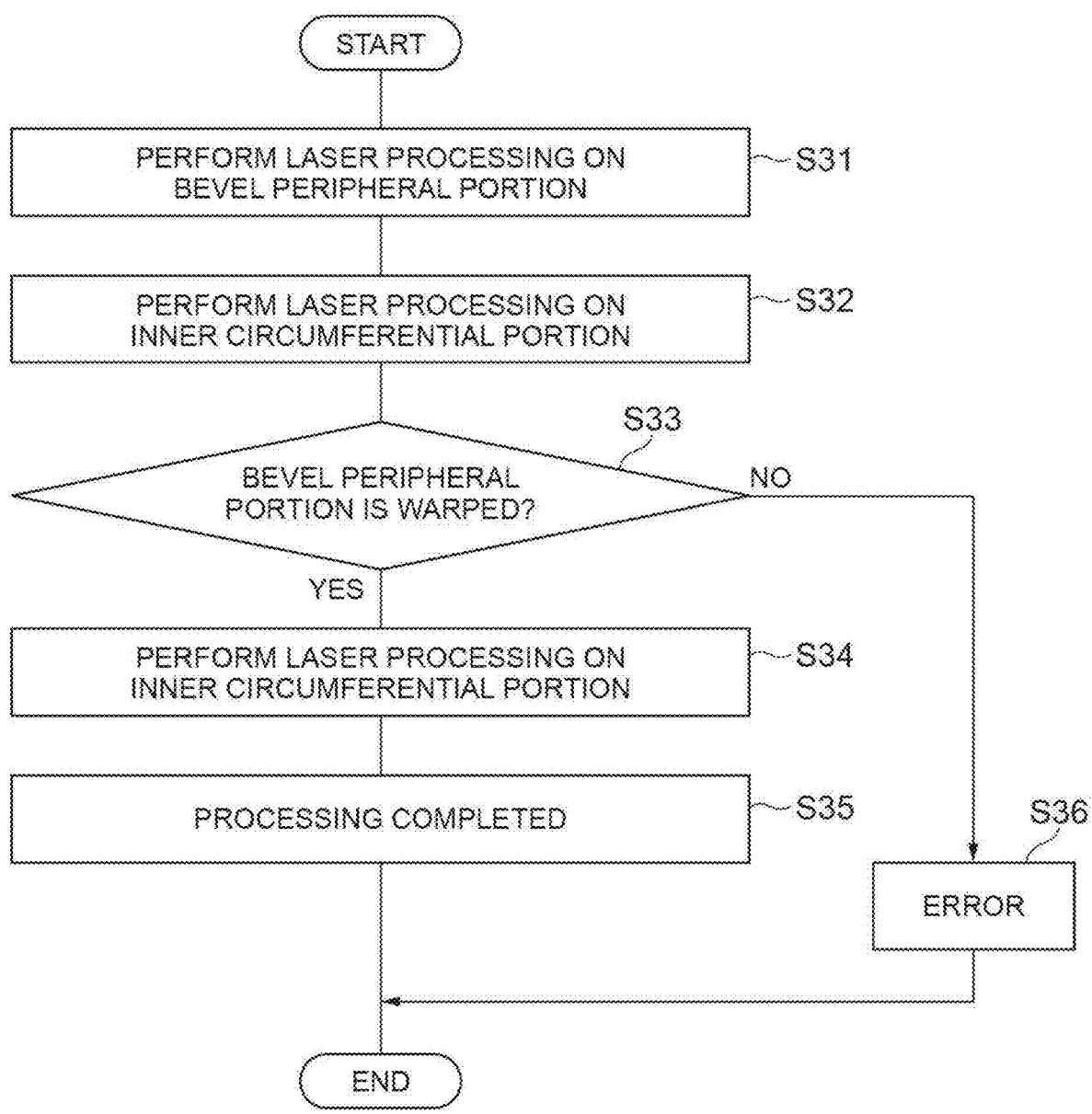
FIG. 32 is a flowchart illustrating the peeling processing according to a third embodiment.

The peeling processing of the present embodiment is performed with the ranging sensor 36 (see FIG. 9) of the laser processing head 10A detecting the height (displacement) of the bevel portion BB, warpage of the bevel portion BB is monitored. In the peeling processing according to the present embodiment, the controller 9 controls the parts of the laser processing apparatus 101 to perform the following processes illustrated in FIG. 32.

The rotation of the stage 107 starts. The laser processing head 10A moves along the Y-axis rail 108 so that the first focusing point P1 moves toward the inner circumferential side along the Y direction, while the bevel peripheral portion 100X is being irradiated with the first laser light L1 under the first processing condition (step S31). The laser processing head 10A moves along the Y-axis rail 108 so that the first focusing point P1 moves toward the inner circumferential side along the Y direction, while the inner circumferential portion 100Y is being irradiated with the first laser light L1 under the first processing condition or the second processing condition (step S32). In steps S31 and S32 described above, the modified region 4 is formed with the first focusing point P1 moving toward the inner side from the circumferential edge, along the spiral line M11.

The rotation of the stage 107, the emission of the first laser light L1, and the like are stopped, and the laser processing on the inner circumferential portion 100Y is stopped. Based on the detection result obtained by the ranging sensor 36, whether the bevel portion BB is warped is determined (step S33). In step S33 described above, when the height of the bevel portion BB detected by the ranging sensor 36 is equal to or higher than a preset predetermined height, it is determined that the bevel portion BB is warped.

When the result of the determination in step S33 described above is Yes, the rotation of the stage 107, the emission of the first laser light L1, and the like start again, and the laser processing on the inner circumferential portion 100Y is resumed (step S34). Then, the modified region 4 is formed along the line M11 over the entirety of the virtual plane M1, and thus the processing is completed (step S35). On the other hand, when the result of the determination in step S33 described above is No, the processing state is determined to be erroneous, and the error in the processing state is notified through the GUI 111 for example (step S36). For example, after step S36 described above, the first processing condition and the second processing condition are reset by a separate step (for example, a process in a fourth embodiment described later).

Also with the laser processing apparatus and the laser processing method according to the present embodiment described above, effects similar to those obtained by the first embodiment are provided. It is found that the bevel portion BB warps, when the crack advances into the bevel portion BB along the virtual plane M1. In view of this, in the laser processing apparatus 101 and the laser processing method of the present embodiment, whether the cracks have reached the bevel portion BB can be recognized, by monitoring (externally monitoring) the warpage of the bevel portion BB.

A notable warpage of the bevel portion BB involves a risk of contact between the laser processing apparatus 1 and the bevel portion BB. Therefore, in the present embodiment, the result of the determination in step S33 is Yes, the amount of warpage of the bevel portion BB may be calculated from the detection result obtained by the ranging sensor 36, and the processing may proceed to step S36 described above for error notification, when the magnitude of the warpage of the bevel portion BB is equal to or larger than a predefined value set in advance.

The bevel portion BB is likely to warp when the laser processing is performed on a portion in the target 100 from the circumferential edge to a position separated from the circumferential edge by a predetermined distance (35 mm for example) or more so that the first slicing full cut state is established as the processing state. When the laser processing is further performed with the index direction being the second direction E2 from the inner circumference toward the circumferential edge of the target 100, the target 100 might be cracked by the stress due to the warpage. Thus, in such a case, it is confirmed that there is not warpage occurring before the laser processing is performed with the second direction E2 being the index direction, so that the cracking of the target 100 can be prevented in advance.

In the present embodiment, the ranging sensor 36 is used as a circumferential edge monitoring unit that monitors the warpage of the bevel portion BB. However, this should not be construed in a limiting sense. Various devices, including a monitoring camera or a contactless sensor, for example, can be used as the circumferential edge monitoring unit as long as the outer appearance of the bevel portion BB can be monitored. When the warpage of the bevel portion BB is monitored by using a contactless sensor, whether the bevel portion BB is warped and the warp amount can be monitored in real time, without stopping the laser processing. In the present embodiment, the controller 9 determines the warpage of the bevel portion BB. Alternatively, the user may determine whether the bevel portion BB is warped based on the detection result obtained by the ranging sensor 36. The present embodiment can be not only applied to the first embodiment but can also be applied to the second embodiment.

Fourth Embodiment

Next, a fourth embodiment will be described. In the description of the fourth embodiment, the points different from those in the first embodiment will be described, and the description that is given in the first embodiment will not be redundantly given.

In the present embodiment, a half cut processing condition which is a processing condition under which the slicing half cut state is established as the processing state in the target 100 is determined (examined) in advance before the laser processing is actually performed on the target 100.

Specifically, the controller 9 performs single line processing (second preprocessing) of forming the modified region 4 in the target 100, with the target 100 irradiated with the first laser light L1 under the half cut processing condition, along a single processing line. The imaging unit IR captures a single line image (second image) showing the processing state in a case where the modified region 4 is formed along a single processing line, by the single line processing. The controller 9 determines the processing state shown in the single line image, and changes the half cut processing condition based on the result of the determination. Specifically, the controller 9 determines whether the processing state shown in the single line image is the slicing half cut state. When the slicing half cut state is not established, the half cut processing condition is changed. The half cut processing condition is a precondition for the first and the second processing conditions described above. The controller 9 sets the half cut processing condition (processing condition for the second preprocessing) based on an input on the GUI 111.

Figure 33:
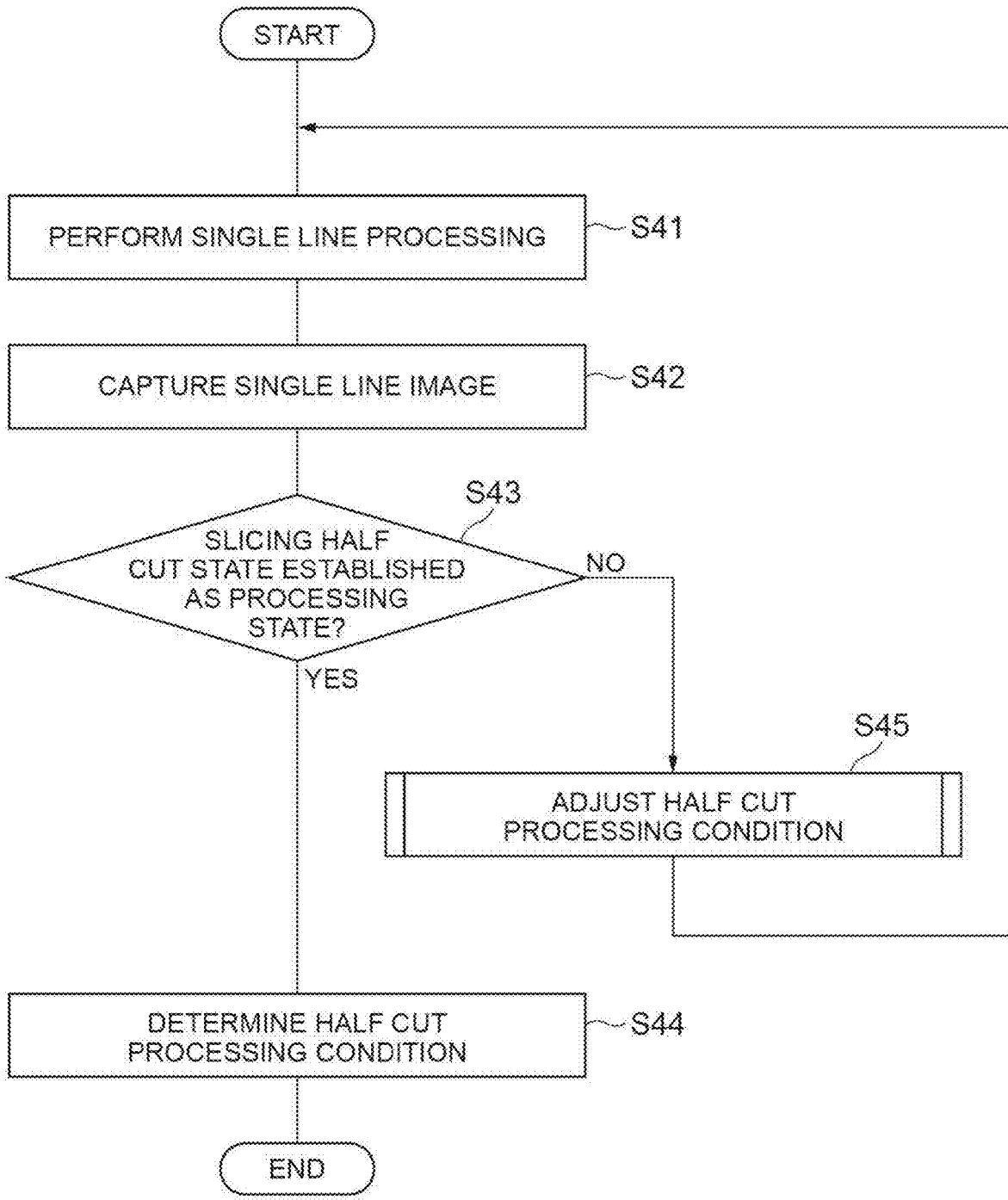
FIG. 33 is a flowchart illustrating an example of processing of determining a half cut processing condition for peeling processing according to a fourth embodiment.

FIG. 33 is a flowchart illustrating an example of a process for determining the half cut processing condition. When the half cut processing condition is determined, the controller 9 controls the parts of the laser processing apparatus 101 to implement the following processes illustrated as examples in FIG. 33.

First of all, the target 100 is irradiated with the first laser light L1 under the half cut processing condition set, along a single processing line, whereby the modified region 4 is formed in the target 100 (step S41, single line processing). The imaging unit IR captures a single line image showing the processing state when the modified region 4 is formed in step S41 described above (step S42). Based on the single line image, whether the slicing half cut state is established as the processing state is determined (step S43).

When the result of the determination in step S43 described above is Yes, the half cut processing condition is determined as the final processing condition (step S44). When the result of the determination in step S43 described above is No, the half cut processing condition is adjusted (step S45). In step S45 described above, for example, the pulse energy of the first laser light L1 is optimized (see FIG. 28) and/or the branch pitch BPy, BPx or the pulse pitch is narrowed. After step S45 described above, the processing returns to step S41 described above. The initial value of the half cut processing condition in step S41 described above can be set by the user using the GUI 111.

In the present embodiment, the first processing condition which is a processing condition under which the first slicing full cut state is established as the processing state in the target 100 is determined (examined) in advance before the laser processing is actually performed on the target 100.

Specifically, the controller 9 performs multiple line processing (first preprocessing) of forming the modified region 4 in the target 100, by irradiating the target 100 with the first laser light L1 under the first processing condition, along the processing line including a plurality lines (parallel lines) arranged side by side. The imaging unit IR captures a multiple line image (first image) showing the processing state in a case where the modified region 4 is formed by the multiple line processing. The controller 9 determines the processing state shown in the multiple line image, and changes the first processing condition based on the result of the determination. The controller 9 sets the first processing condition based on the input on the GUI 111.

The imaging unit IR captures a first multiple line image showing the processing state after the laser processing of the first specified amount, as the multiple line image. Based on the first multiple line image, the controller 9 determines whether the slicing full cut state is the processing state after the laser processing of the first specified amount (that is, whether the first slicing full cut state is established). The controller 9 changes the first processing condition when the processing state is not the first slicing full cut state.

Figure 34:
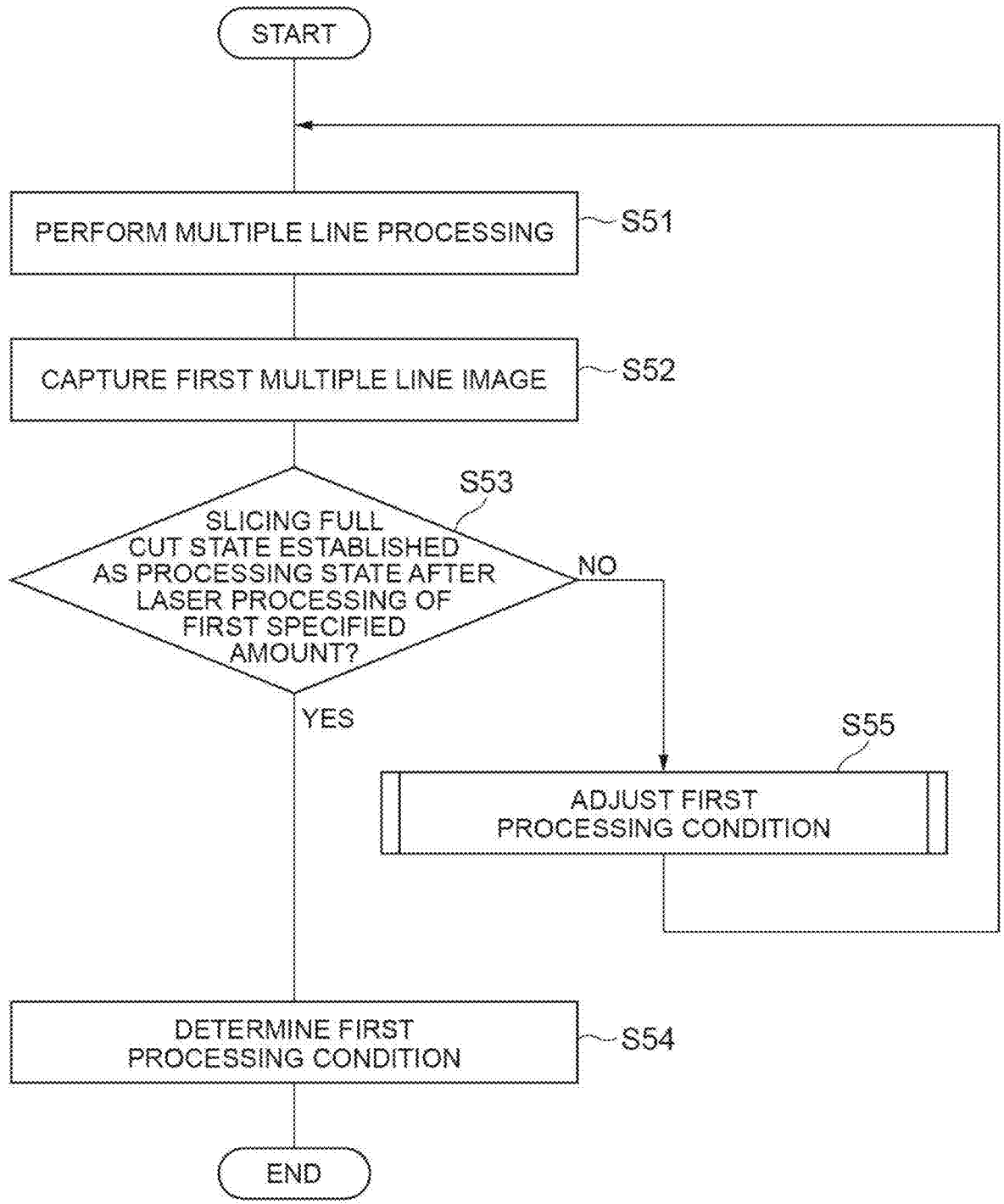
FIG. 34 is a flowchart illustrating an example of processing of determining a first processing condition for peeling processing according to a fourth embodiment.

FIG. 34 is a flowchart illustrating an example of a process for determining the first processing condition. When the first processing condition is determined, the controller 9 controls the parts of the laser processing apparatus 101 to implement the following processes illustrated as examples in FIG. 34.

First of all, the target 100 is irradiated with the first laser light L1 under the first processing condition set, along the plurality of parallel lines arranged side by side, to form the modified region 4 in the target 100 (step S51, multiple line processing). The imaging unit IR captures the first multiple line image showing the processing state after the laser processing of the first specified amount, which is the processing state after the modified region 4 is formed in step S51 described above (step S52). Based on the first multiple line image, whether the slicing full cut state (the first slicing full cut state) is established as the processing state after the laser processing of the first specified amount is determined (step S53).

When the result of the determination in step S53 described above is Yes, the first processing condition is determined as the final processing condition (step S54). When the result of the determination in step S52 described above is No, the first processing condition is adjusted (step S55). In step S55 described above, for example, the pulse energy of the first laser light L1 is optimized (see FIG. 28) and/or the branch pitch BPy, BPx or the pulse pitch is narrowed. After step S55 described above, the processing returns to step S51 described above. The initial value of the first processing condition in step S51 described above can be set by the user using the GUI 111.

In the present embodiment, the second processing condition which is a processing condition under which the second slicing full cut state is established as the processing state in the target 100 is determined (examined) in advance before the laser processing is actually performed on the target 100.

Specifically, the controller 9 performs multiple line processing (first preprocessing) of forming the modified region 4 in the target 100, by irradiating the target 100 with the first laser light L1 under the second processing condition, along the processing line including a plurality lines (parallel lines) arranged side by side. The imaging unit IR captures a multiple line image (first image) showing the processing state in a case where the modified region 4 is formed by the multiple line processing. The controller 9 determines the processing state shown in the multiple line image, and changes the second processing condition based on the result of the determination. The controller 9 sets the second processing condition based on the input on the GUI 111.

The imaging unit IR captures a second multiple line image showing the processing state after the laser processing of the second specified amount and after the stress application, as the multiple line image. The stress application can be implemented, for example, in the manner that is the same as that in step S16 described above (see FIG. 30). Based on the second multiple line image, the controller 9 determines whether the slicing full cut state is the processing state after the laser processing of the second specified amount (that is, whether the second slicing full cut state is established). The controller 9 changes the second processing condition when the processing state is not the second slicing full cut state.

Alternatively, the imaging unit IR captures a first multiple line image showing the processing state after the laser processing of the first specified amount, as the multiple line image. The controller 9 determines whether the processing state is the first slicing full cut state based on the first multiple line image. When the processing state is the first slicing full cut state, the controller 9 changes the second processing condition. When the processing state is not the first slicing full cut state, the imaging unit IR captures a second multiple line image showing the processing state after the laser processing of the second specified amount, as the multiple line image. The controller 9 determines whether the processing state is the second slicing full cut state based on the second multiple line image. The controller 9 changes the second processing condition when the processing state is not the second slicing full cut state.

Figure 35:
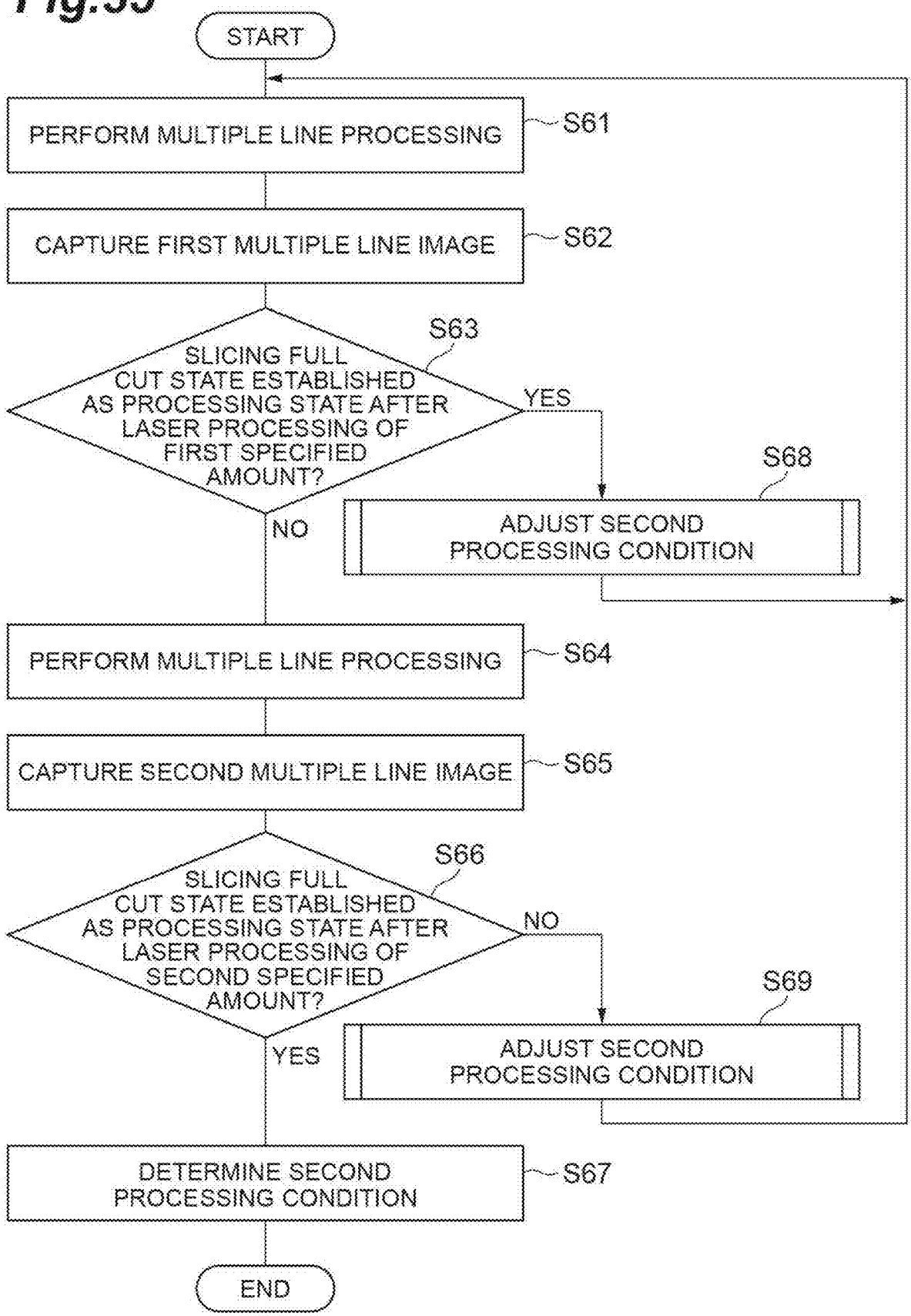
FIG. 35 is a flowchart illustrating an example of processing of determining a second processing condition for peeling processing according to a fourth embodiment.

FIG. 35 is a flowchart illustrating an example of a process for determining the second processing condition. When the second processing condition is determined, the controller 9 controls the parts of the laser processing apparatus 101 to implement the following processes illustrated as examples in FIG. 35.

First of all, the target 100 is irradiated with the first laser light L1 under the second processing condition set, along the plurality of parallel lines arranged side by side, to form the modified region 4 in the target 100 (step S61, multiple line processing). The imaging unit IR captures the first multiple line image showing the processing state after the laser processing of the first specified amount (step S62). Based on the first multiple line image, whether the slicing full cut state (the first slicing full cut state) is established as the processing state after the laser processing of the first specified amount is determined (step S63).

When the result of the determination in step S63 described above is NO, the multiple line processing continues to be performed if the processing state is the slicing stealth state or the slicing half cut state (step S64). The imaging unit IR captures the second multiple line image showing the processing state after the laser processing of the second specified amount (step S65). Based on the second multiple line image, whether the slicing full cut state (the second slicing full cut state) is established as the processing state after the laser processing of the second specified amount is determined (step S66).

When the result of the determination in step S66 described above is YES, the second processing condition is determined as the final processing condition (step S67). When the result of the determination in step S63 described above is YES, the second processing condition is adjusted (step S68). In step S68 described above, for example, the branch pitch BPy, BPx or the pulse pitch is widened.

When the result of the determination in step S66 described above is NO, the second processing condition is adjusted (step S69). In step S69 described above, for example, the pulse energy of the first laser light L1 is optimized (see FIG. 28) and/or the branch pitch BPy, BPx or the pulse pitch is narrowed. After step S68 described above or step S69 described above, the processing returns to step S61 described above. The initial value of the second processing condition in step S61 described above can be set by the user using the GUI 111.

Also with the laser processing apparatus 101 and the laser processing method according to the present embodiment described above, effects similar to those obtained by the first embodiment are provided. It is found that there is a correlation between peeling of the target 100 and the processing state when the modified region 4 is formed along the processing line including a plurality or parallel lines. Thus, in the laser processing apparatus 101 and the laser processing method of the present embodiment, the multiple line image is captured that shows the processing state when the modified region 4 is formed along the processing line including a plurality of parallel lines. Based on the multiple line image, the processing condition can be adjusted so that the target 100 can be peeled. Thus, the target 100 can be reliably peeled.

It is found that there is a correlation between peeling of the target 100 and the processing state when the modified region 4 is formed along a single processing line. Thus, in the laser processing apparatus 101 and the laser processing method of the present embodiment, the single line image is captured that shows the processing state when the modified region 4 is formed along the single processing line. Based on the single line image, the half cut processing condition can be adjusted so that the target 100 can be peeled. The target 100 can be reliably peeled.

In the laser processing apparatus 101 and the laser processing method of the present embodiment, the processing state shown in the single line image is determined. The half cut processing condition is changed based on a result of the determination. In this case, the half cut processing condition can be automatically changed based on the single line image.

It is found that when the processing state when the modified region 4 is formed along a single processing line is not the slicing half state, the target 100 is difficult to peel. Thus, in the laser processing apparatus 101 and the laser processing method of the present embodiment, the half cut processing condition is changed when the processing state shown in the single line image is not the slicing half cut state. Thus, the half cut processing condition can be set so that the target 100 can be peeled.

In the laser processing apparatus 101 and the laser processing method of the present embodiment, the processing state shown in the multiple line image is determined. The first and the second processing conditions are changed according to the result of the determination. In this case, the first and the second processing conditions can be automatically changed based on the first image.

It is found that when the modified region 4 is formed along the processing line including a plurality of parallel lines, the target 100 may be reliably peeled when the laser processing is performed with the processing state after the laser processing of the first specified amount being the slicing full cut state. Thus, in the laser processing apparatus and the laser processing method of the present embodiment, whether the processing state after the laser processing of the first specified amount is determined based on the first multiple line image. The first processing condition is changed when the slicing full cut state is not established. With this configuration, the first processing condition under which the target 100 may be reliably peeled can be set.

It is found that when the modified region 4 is formed along the processing line including a plurality of parallel lines, the target 100 may be peeled without compromising the takt time when the laser processing is performed with the processing state after the laser processing of the second specified amount being the slicing full cut state. Thus, in the laser processing apparatus 101 and the laser processing method of the present embodiment, whether the processing state after the laser processing of the second specified amount is determined based on the second multiple line image. The second processing condition is changed when the slicing full cut state is not established. Thus, the second processing condition under which the target 100 may be peeled with deterioration of the takt time suppressed.

In the present embodiment, the half cut processing condition, the first processing condition, and the second processing condition are determined, but any of these may be determined. For example, with the slicing half cut state cannot be confirmed using the imaging unit IR, at least one of the first processing condition and the second processing condition may be determined. In the present embodiment, the controller 9 automatically determines the processing state. Alternatively, the user may determine the processing state based on the result of the image capturing by the imaging unit IR. Steps S51 and S61 described above serve as a first preprocessing step, and steps S52 and S62 described above serve as a first image capturing step. The present embodiment can be not only applied to the first embodiment but can also be applied to the second embodiment or the third embodiment.

Examples of the target 100 used for determining the processing condition in the present embodiment include: a wafer for condition determination which is a wafer for practice that would not be ultimately obtained as a semiconductor device (product) by the peeling processing or the like; and a wafer for a semiconductor device, which is a wafer for production to be ultimately obtained as a semiconductor device. In the former case, the processing condition may be determined with a processing line set anywhere on the entire region of the wafer. In the latter case, a processing line may be set in an outer edge region with a small impact on the peeling quality of the wafer, and then the peeling processing may be directly sequentially performed under the processing condition thus determined. The latter case may be for example employed when the processing condition needs to be adjusted for each wafer, due to variation of back surface film of the wafer or the like.

MODIFICATION EXAMPLES

As described above, one aspect of the present invention is not limited to the above-described embodiment.

In the above embodiment, the trimming processing for forming the modified region 43 is performed before the target 100 is peeled by the peeling processing. Alternatively, as illustrated in FIGS. 36(*a*) and 36(*b*), the removal region E may be removed by the trimming processing after the target 100 has been peeled by the peeling. Also in this case, the device and the method are reusable on a removed portion removed from the target 100 by the peeling processing.

Further, as illustrated in FIGS. 37(*a*) and 37(*b*), the modified region 4 may be formed inside the effective region R of the target 100 along the virtual plane M1 by the peeling processing, and then the removal region E may be removed by the trimming processing. Further, as illustrated in FIGS. 38(*a*) and 38(*b*), after the removal region E is removed by the trimming processing, the target 100 may be peeled by the peeling processing.

Figure 39:
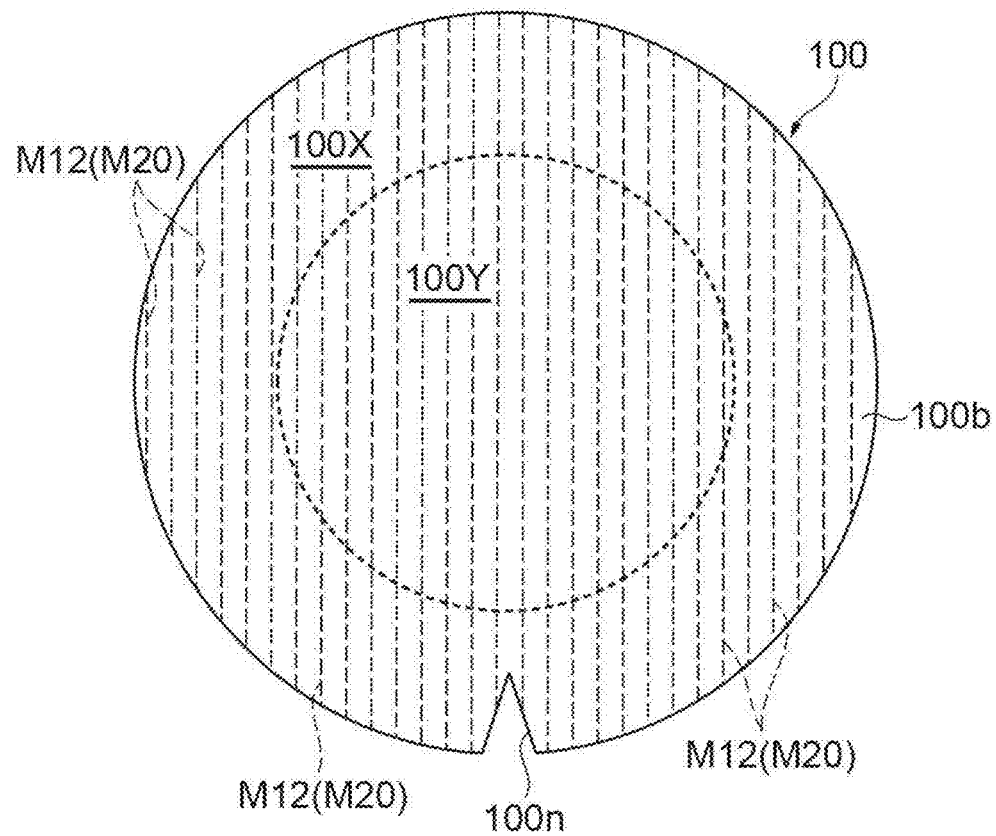
FIG. 39 is a plan view of the target subjected to peeling processing according to the modification example.

In the above embodiment, the processing line is not limited to the spiral line M11, and processing lines having various shapes may be set on the target 100. For example, as illustrated in FIG. 39, the plurality of linear lines (parallel lines) M12 may be set to the target 100 to be arranged in a predetermined direction. These plurality of lines M12 are included in a line (processing line) M20. The line M12 is a virtual line, but it may be a line actually drawn. The line M12 may be designated by coordinates. Some or all of the plurality of lines M12 arranged side by side may or may not be connected to each other.

In the embodiments described above, a plurality of laser processing heads may be provided as an irradiation portion. When a plurality of laser processing heads are provided as an irradiation portion, the laser processing may be performed using the plurality of laser processing heads in each of the first processing process (first processing step), the second processing process (second processing step), the first preprocessing (first preprocessing step), and the second preprocessing (second preprocessing step) described above.

In the embodiments described above, the reflective spatial light modulator 34 is used. However, the spatial modulator is not limited to the reflective modulator, and transmissive spatial modulator may be used. In the embodiments described above, the type of the target 100, the shape of the target 100, the size of the target 100, the number and direction of crystal orientations of the target 100, and the orientation of the principal plane of the target 100 are not particularly limited.

In the embodiments described above, the back surface 100b of the target 100 is the laser light incident surface, but the laser light incident surface may be the front surface 100a of the target 100. In the embodiments described above, the modified region may be a crystal region, a recrystallization region, or a gettering region formed in the target 100 for example. The crystal region is a region that maintains the structure of the target 100 before being processed. The recrystallization region is a region that is once evaporated, converted into plasma, or melted, and then solidified as a single crystal or polycrystal when resolidified. The gettering region is a region that exerts a gettering effect of collecting and capturing impurities such as heavy metals, and may be formed continuously or intermittently. The embodiment described above may be applied to a process such as ablation.

In the laser processing of the embodiment described above, in the second processing process, the pitch of the modified spots SA included in the modified region 4 might be short when the device reaches a limit (when the rotation speed of the stage 107 reaches the maximum rotation speed). In this case, other processing condition may be changed so that the pitch can be a constant pitch.

Other modification examples will be described below.

Figure 40:
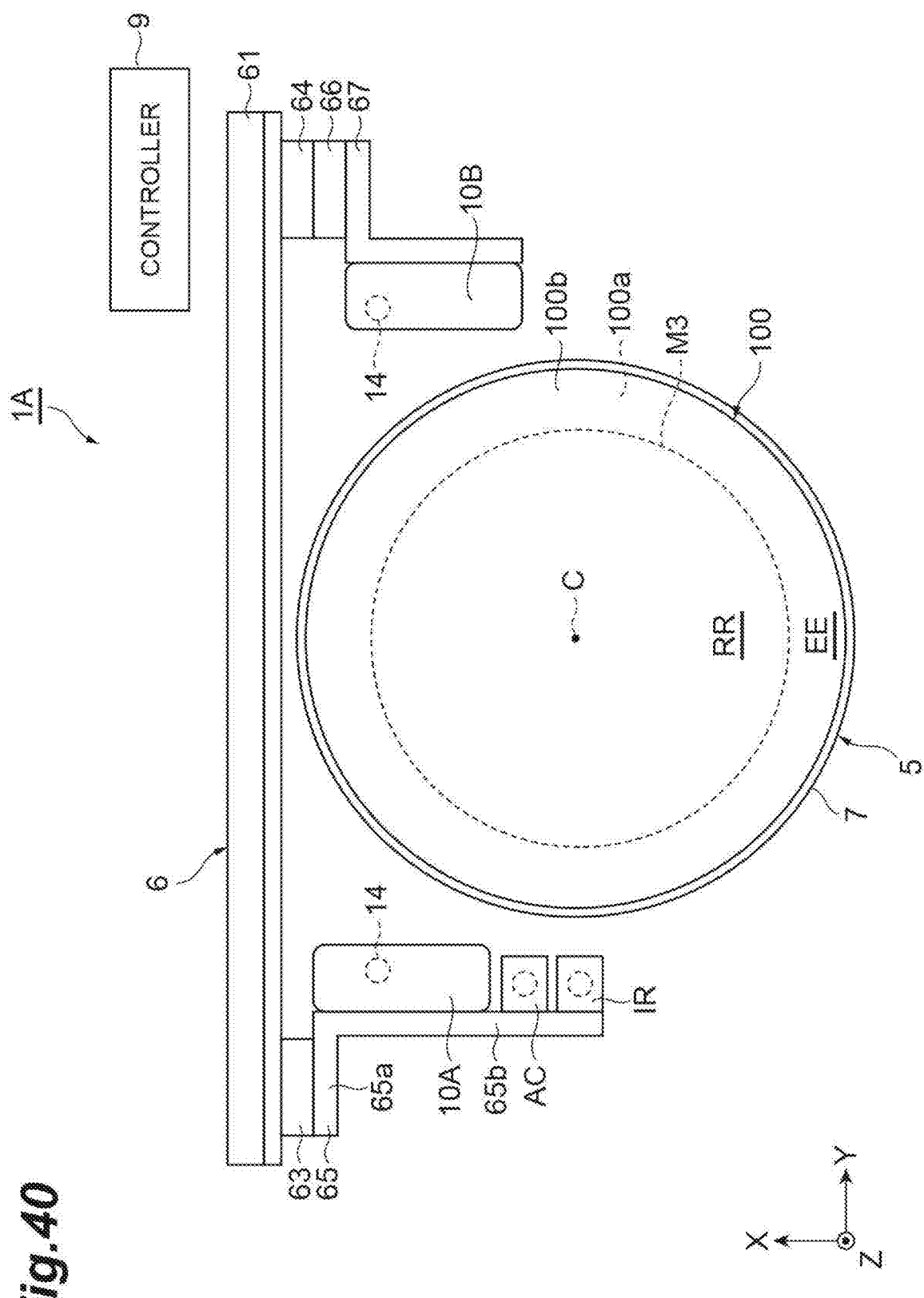
FIG. 40 is a plan view of a laser processing apparatus of a modification example.

A laser processing apparatus 1A illustrated in FIG. 40 is mainly different from the laser processing apparatus 1 described above, in that the alignment camera AC and the imaging unit IR and in that a laser processing head (first irradiation portion) 10B is attached to the attachment portion 66 via a rotation mechanism 67. In the present embodiment, the laser processing apparatus 1A performs the trimming processing and the peeling processing on the target 100 including a front surface 100a (hereinafter, also referred to as "first principal plane 100a") and a surface 100b (hereinafter, also referred to as "second principal plane 100b"), to acquire (manufacture) a semiconductor device. The trimming processing is a process for removing an unnecessary portion in the target 100. The peeling processing is a process for peeling a part of the target 100. The configuration of the laser processing apparatus 1A will be described by focusing on the differences from the laser processing apparatus 1. Note that in FIG. 40, the device frame 1a, the light source unit 8, and the like are not illustrated.

As illustrated in FIG. 40, the alignment camera AC and the imaging unit IR are attached to the attachment portion 65 together with the laser processing head (second irradiation portion) 10A. The alignment camera AC, for example, captures an image of a device pattern or the like using light transmitted through the target 100. Alignment of the irradiation position of the laser light L1 on the target 100 and the like are implemented based on the image captured by the alignment camera AC. The imaging unit IR captures an image of the target 100 using light transmitted through the target 100. For example, when the target 100 is a wafer containing silicon, the imaging unit IR uses light in the near infrared region. Based on the image captured by the imaging unit IR, confirmation of the state of the modified region formed in the target 100 and the state of cracks extending from the modified region and the like are performed.

The laser processing head 10B is attached to the attachment portion 66 via the rotation mechanism 67. The rotation mechanism 67 is attached to the attachment portion 66 to be rotatable about an axis parallel to the X direction. With this configuration, the movement mechanism 6 can change the orientation of the laser processing head 10B, so that a state is established in which the optical axis of the condensing unit (first condensing unit) 14 of the laser processing head 10B extends along the Y direction (first direction intersecting with a direction orthogonal to the surface of the target) parallel to the second principal plane 100b of the target 100, or a state is established in which the optical axis of the condensing unit 14 of the laser processing head 10B extends along the Z direction (second direction) orthogonal to the second principal plane 100b. In the laser processing apparatus 1A, the state where the optical axis of the condensing unit 14 extends along the first direction is a state in which an angle between the optical axis and the first direction is equal to or smaller than 10°. The state where the optical axis of the condensing unit 14 extends along the second direction is a state in which an angle between the optical axis and the second direction is equal to or smaller than 10°.

Next, the target 100 to be processed by the laser processing apparatus 1A will be described. The target 100 includes, for example, a semiconductor wafer formed in a disk-shape. The target 100 may be formed of various materials and may have various shapes. A functional element (not illustrated) is formed on the first principal plane 100a of the target 100. Examples of the functional element include, a light receiving element such as a photodiode, a light emitting element such as a laser diode, a circuit element such as a memory, and the like.

As illustrated in FIGS. 41(a) and 41(b), an effective portion RR and a circumferential edge portion EE are set in the target 100. The effective portion RR is a portion corresponding to the semiconductor device to be acquired. The effective portion RR is, for example, a disk-shaped portion including a center portion when the target 100 is viewed in the thickness direction. The circumferential edge portion EE is a region, in the target 100, more on the outer side than the effective portion RR. The circumferential edge portion EE is an outer edge portion in the target 100 excluding the effective portion RR. The circumferential edge portion EE is, for example, an annular bevel part (bevel portion) surrounding the effective portion RR.

A virtual plane M1 is set in the target 100 as a scheduled peeling plane. The virtual plane M1 is a plane on which a modified region is scheduled to be formed. The virtual plane M1 is a plane facing the second principal plane 100b that is the laser light incident surface of the target 100 (that is, a plane opposite to the second principal plane 100b). The virtual plane M1 includes a first region M1a and a second region M1b. The first region M1a is a region of the virtual plane M1 located in the effective portion RR. The second region M1b is a region of the virtual plane M1 located in the circumferential edge portion EE. The virtual plane M1 is a plane parallel to the second principal plane 100b, and has a circular shape, for example. The virtual plane M1 is a virtual region, and is not limited to a flat plane, and may be a curved plane or a three-dimensional plane. The effective portion RR, the circumferential edge portion EE, and the virtual plane M1 can be set by the controller 9. The effective portion RR, the circumferential edge portion EE, and the virtual plane M1 may be designated by coordinates.

A line M3 is set in the target 100 as a scheduled trimming line. The line M3 is the line along which the modified region scheduled to be formed. The line M3 extends annularly on the inner side of the outer edge of target 100. The line M3 annularly extend for example. The line M3 is set as a boundary between the effective portion RR and the circumferential edge portion EE, in a portion that is more on the opposite side of the laser light incident surface than the virtual plane M1 in the target 100. The line M3 can be set by the controller 9. The line M3 may be designated by coordinates.

Next, an example of a method of manufacturing (obtaining) a semiconductor device by performing the trimming processing and the peeling processing on the target 100 using the laser processing apparatus 1A will be described below. The manufacturing method described below is a method reusable for a removed portion (a portion in the target 100 that is not used as a semiconductor device) removed from the target 100 by the trimming processing and the peeling processing.

First of all, as illustrated in FIG. 40, the target 100 is supported by the support portion 7, with the second principal plane 100b provided on the laser light incident surface side. On the first principal plane 100a side of the target 100 on which the functional elements are formed, a substrate such as a supporting substrate is joined, or a tape material is attached.

Figure 41:
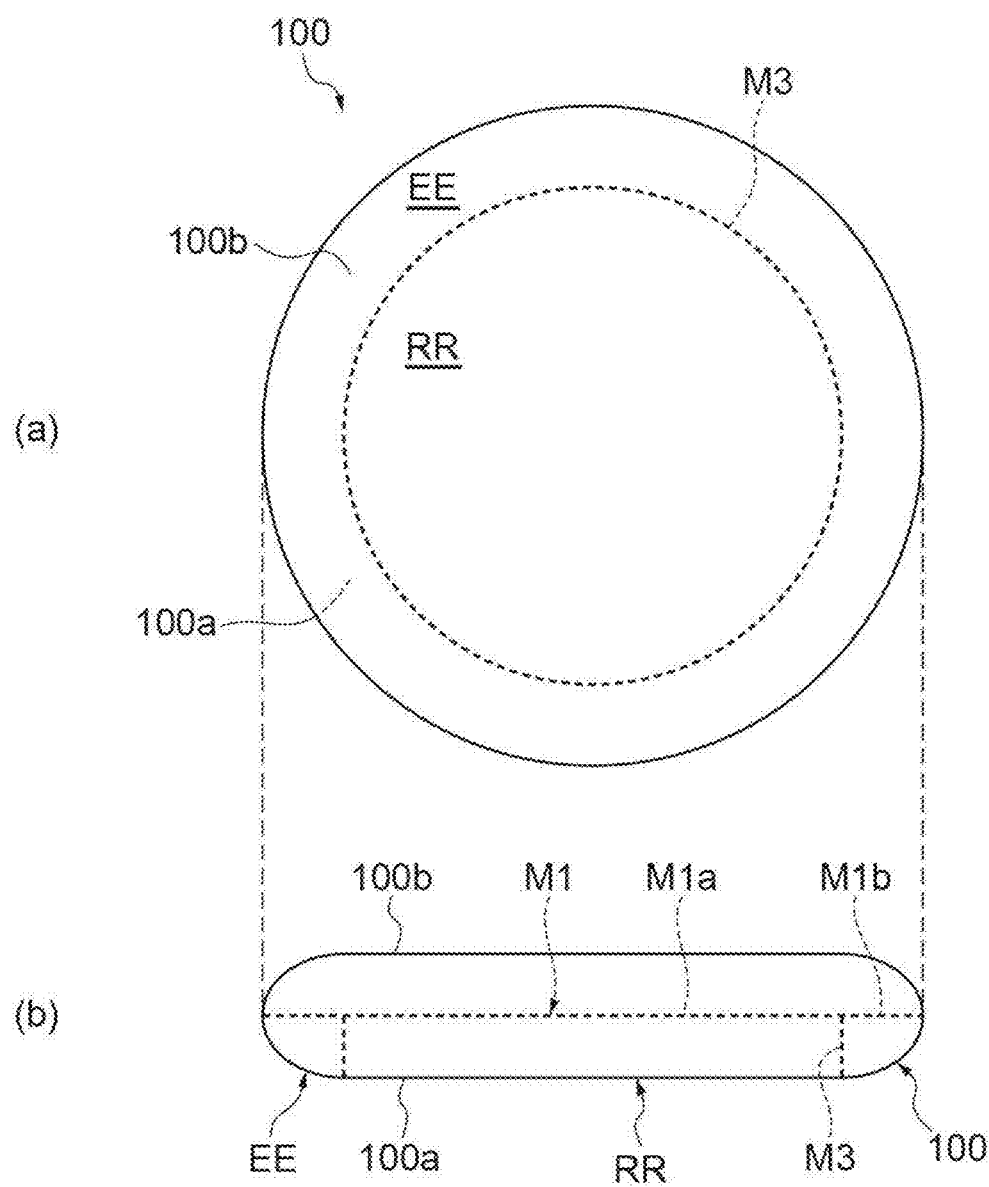
FIG. 41 is a plan view illustrating an example of the target.
Figure 42:
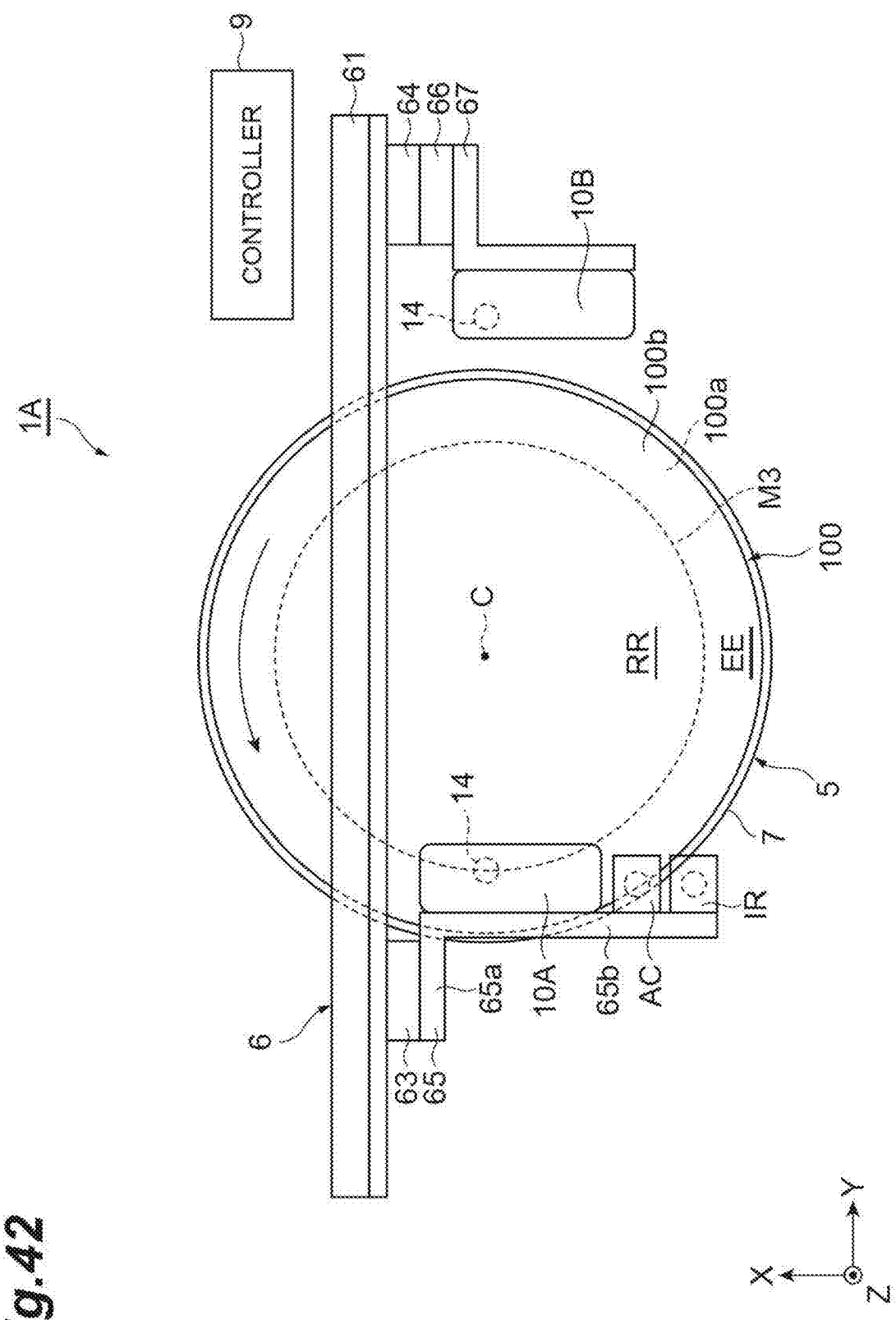
FIG. 42 is a plan view of a laser processing apparatus illustrating a method of manufacturing a semiconductor device using the laser processing apparatus of the modification example.

Next, the trimming processing is performed on the target 100 as illustrated in FIGS. 42 and 43(a). Specifically, the movement mechanism 5 moves the support portion 7 and the movement mechanism 6 moves the laser processing head 10A to position the condensing unit (second condensing unit) 14 of the laser processing head 10A above the line M3, and position the first focusing point P1 (hereinafter, also simply referred to as "focusing point P1") of the laser light L1 above the line M3. Then, the laser light L1 is emitted from the laser processing head 10A, with the focusing point P1 of the laser light L1 positioned at a position on the line M3, while the movement mechanism 5 rotates the support portion 7 about the rotation axis C (hereinafter, also referred to as "axis C") at a constant rotation speed. Such irradiation of the laser light L1 is repeatedly performed while changing the position of the focusing point P1 in the Z direction. As a result, as illustrated in FIG. 43(b), before the peeling process, the modified region 43 is formed along the line M3 (see FIG. 41) in a portion in the target 100 more on the side opposite to the laser light incident surface than the virtual plane M1 (see FIG. 41). When the trimming processing is performed on the target 100, the optical axis of the condensing unit 14 of the laser processing head 10A extends along the Z direction, and the second principal plane 100b of the target 100 is the incident surface of the laser light L1.

Figure 44:
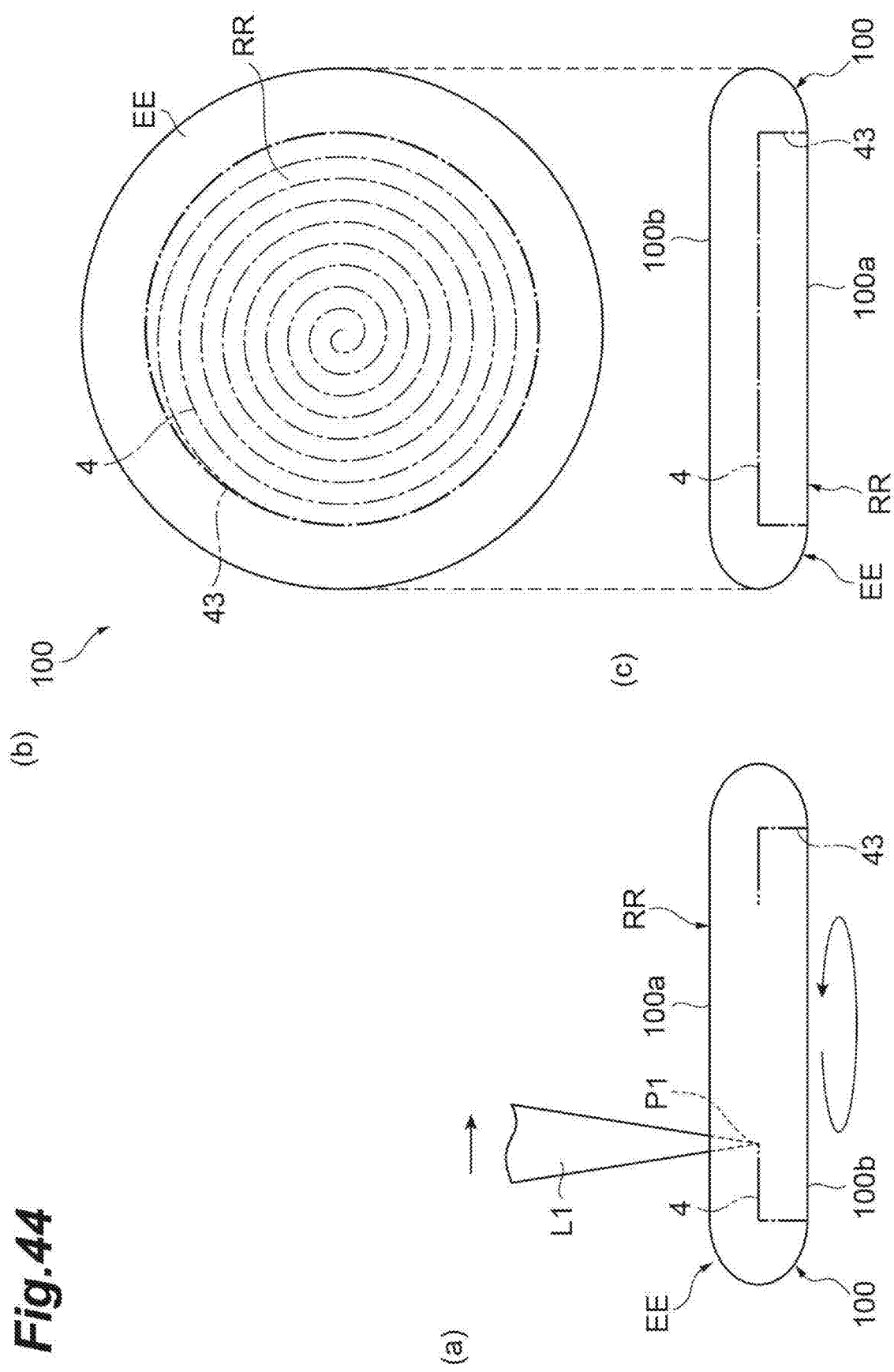
FIG. 44(a) is a side view of the target continuing from FIG. 43(b).
FIG. 44(b) is a plan view of the target continuing from FIG. 44(a).
FIG. 44(c) is a side view of the target illustrated in FIG. 44(b).

Next, the peeling processing is performed on the effective portion RR of the target 100 as illustrated in FIG. 42 and FIG. 44(a). The movement mechanism 6 moves the laser processing head 10A, while the laser light L1 is being emitted from the laser processing head 10A with the movement mechanism 5 rotating the support portion 7 about the axis C at a constant rotation speed, so that the focusing point P1 moves along the Y direction from the outer side toward the inner side in the first region M1a (see FIG. 41) of the virtual plane M1. As a result, the modified region 4 extending in a spiral shape (involute curve) along the first region M1a (see FIG. 41) in the target 100, as illustrated in FIGS. 44(b) and 44(c). When the peeling processing is performed on the effective portion RR of the target 100, the optical axis of the condensing unit 14 of the laser processing head 10A extends along the Z direction and the second principal plane 100b of the target 100 is the incident surface of the laser light L1. As described above, the peeling processing is performed on the effective portion RR of the target 100, with the controller 9 controlling the support portion 7, the laser processing head 10A, and the plurality of movement mechanisms 5 and 6, to form the modified region 4 along the first region M1a in the effective portion RR, in the state where the optical axis of the condensing unit 14 of the laser processing head 10A extends along the Z direction.

Figure 45:
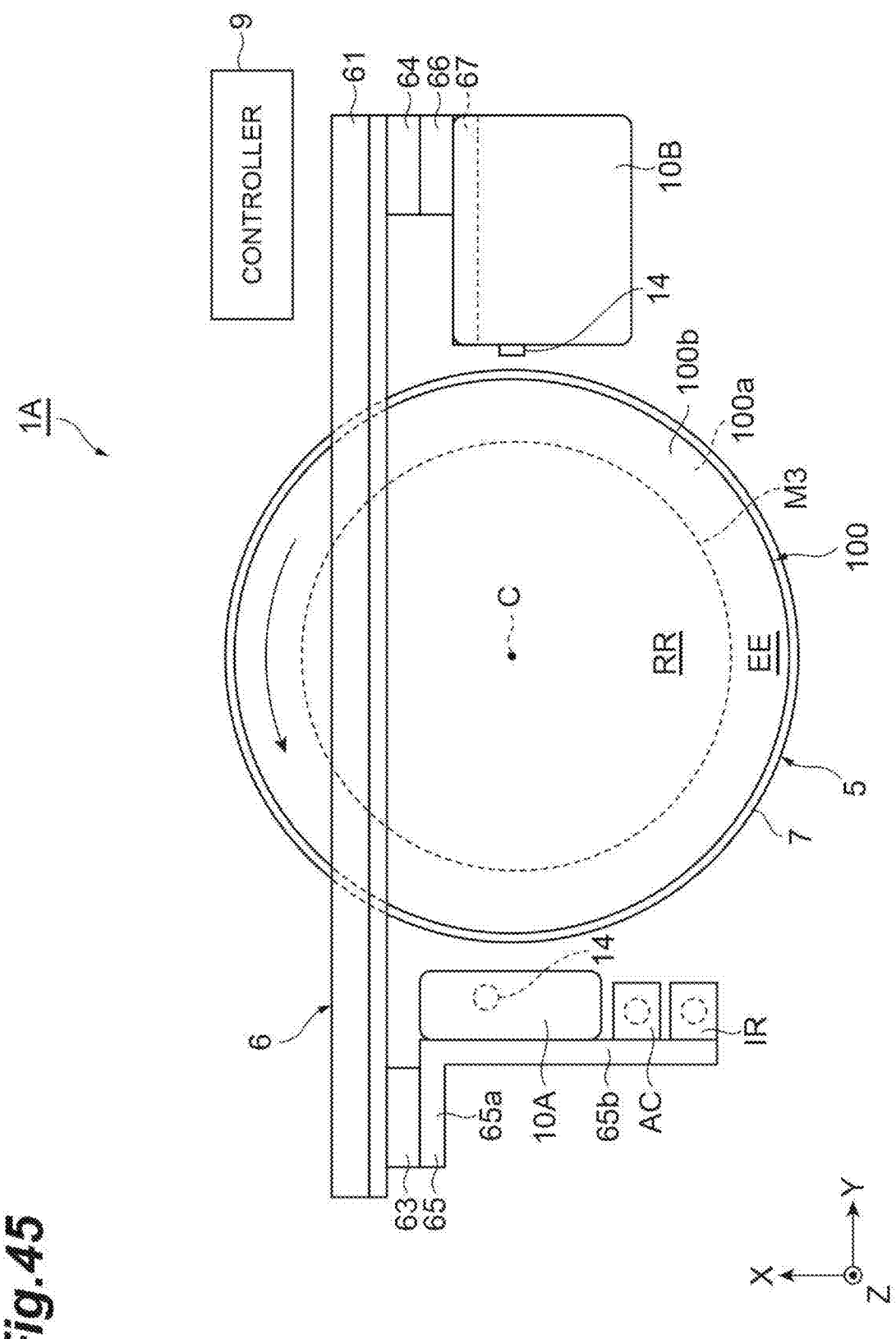
FIG. 45 is a plan view of a laser processing apparatus illustrating a method of manufacturing a semiconductor device using the laser processing apparatus of the modification example.
Figure 46:
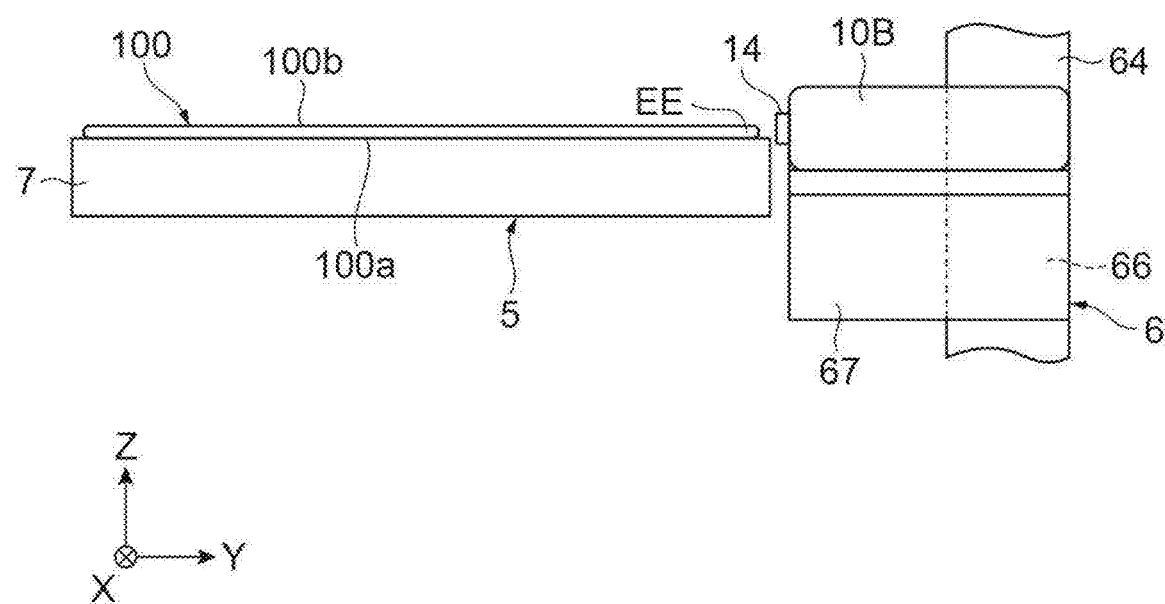
FIG. 46 is a side view of a portion of a laser processing apparatus illustrating a method of manufacturing a semiconductor device using the laser processing apparatus of the modification example.
Figure 47:
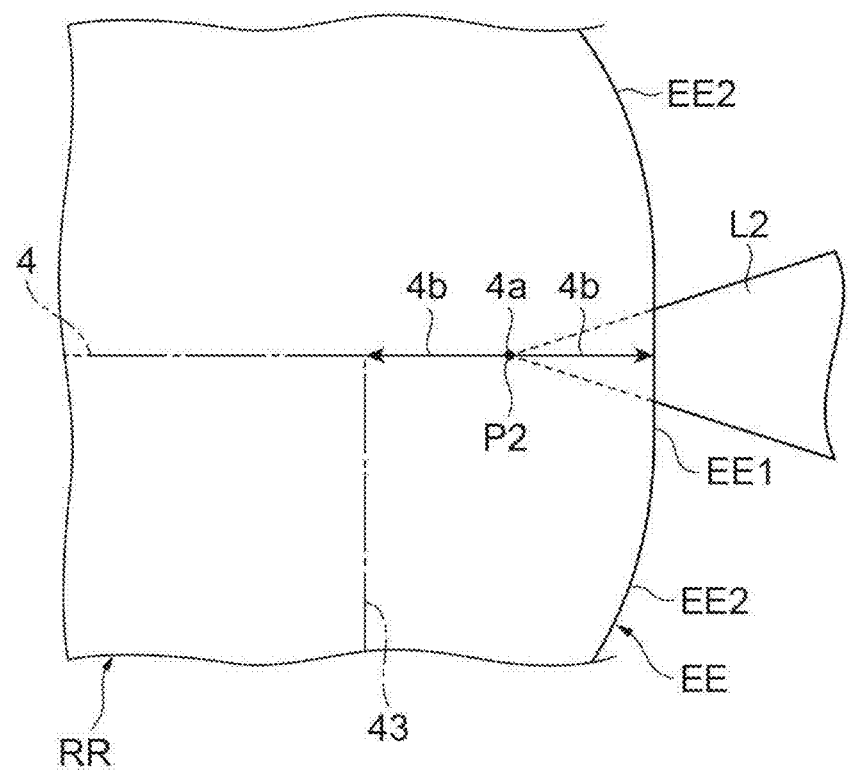
FIG. 47 is a side view of a circumferential edge portion of the target continuing from FIGS. 44(b) and 44(c).

Next, the peeling processing is performed on the circumferential edge portion EE of the target 100 as illustrated in FIG. 45 and FIG. 46. Specifically, the movement mechanism 6 changes the orientation of the laser processing head 10B so that the state where the optical axis of the condensing unit 14 of the laser processing head 10B extends along the Y direction. Furthermore, the movement mechanism 5 moves the support portion 7 and the movement mechanism 6 moves the laser processing head 10B to position a focusing point P2 of the laser light L2 at a position on the second region M1b of the virtual plane M1 as illustrated in FIG. 41 and FIG. 47. Then, the laser light L2 is emitted from the laser processing head 10B, with the focusing point P2 of the laser light L2 positioned at a position on the second region M1b, while the movement mechanism 5 rotates the support portion 7 about the axis C at a constant rotation speed. As a result, a modified region 4a is formed along the second region M1b in the circumferential edge portion EE. A crack 4b extends from this modified region 4a toward the inner side (that is, the modified region 4 side along the first region M1a) and toward the outer side (that is, a side surface EE1 side of the target 100).

When the peeling processing is performed on the circumferential edge portion EE of the target 100, the optical axis of the condensing unit 14 of the laser processing head 10B extends along the Y direction and the side surface EE1 of the target 100 is the incident surface of the laser light L2. As illustrated in FIG. 46 and FIG. 47, the side surface EE1 is surface, of the side surfaces intersecting with the first principal plane 100a and the second principal plane 100b, orthogonal to the first principal plane 100a and the second principal plane 100b (an orthogonal surface as viewed in a direction parallel to the first principal plane 100a and the second principal plane 100b). A side surface EE2 is a chamfered surface, of the side surfaces intersecting with the first principal plane 100a and the second principal plane 100b, formed between the first principal plane 100a and the side surface EE1 and the second principal plane 100b and the side surface EE1, and has an outwardly protruding round shape, for example. The side surface EE1 and the side surface EE2 are included in the circumferential edge portion EE. In the present embodiment, the side surfaces EE1 and EE2 form a bevel part.

As described above, the peeling processing is performed on the circumferential edge portion EE of the target 100, with the controller 9 controlling the support portion 7, the laser processing head 10B, and the plurality of movement mechanisms 5 and 6, to form the modified region 4a in the circumferential edge portion EE, in the state where the optical axis of the condensing unit 14 of the laser processing head 10B extends along the Y direction. The controller 9 controls the movement mechanism 5 to rotate the support portion 7 about the axis C orthogonal to the second principal plane 100b of the target 100, in the state where the optical axis of the condensing unit 14 of the laser processing head 10B extending along the Y direction. In the state where the optical axis of the condensing unit 14 of the laser processing head 10B extending along the Y direction, the polarization direction of the laser light L2 emitted from the condensing unit 14 of the laser processing head 10B extends along the direction in which the focusing point P2 of the laser light L2 moves with respect to the target 100.

Next, as illustrated in FIG. 48(a), a part of the target 100 is peeled, with the modified region provided over the virtual plane M1 (see FIG. 41) and the crack extending from the modified region serving as boundaries. At the same time, the circumferential edge portion EE is removed with the modified region extending along the line M3 (see FIG. 41) and the crack extending from the modified region serving as boundaries. The partial peeling of the target 100 and removal of the circumferential edge portion EE may be implemented using the suction jig for example. The partial peeling of the target 100 may be implemented on the support portion 7, or may be implemented after the target 100 is moved to a dedicated peeling area. A part of the target 100 may be peeled by using air blow or a tape material. When the target 100 cannot be peeled by using external stress only, the modified regions 4 and 43 may be selectively etched with an etching solution (such as KOH or TMAH) that reacts with the target 100. As a result, the target 100 can be easily peeled. Although the support portion 7 is rotated at a constant rotation speed, the rotation speed may be variable. For example, the rotation speed of the support portion 7 may be varied to achieve a constant pitch between the modified spots included in the modified region 4.

Then, as illustrated in FIG. 48(b), a peeled surface 100h of the target 100 is finished by grinding or polishing with an abrasive such as a grindstone. When the target 100 is peeled by etching, the polishing can be simplified. As a result of the above, a semiconductor device 100k is obtained.

In general peeling processing, the target 100 may be peeled with a short pitch between the plurality of modified spots in the modified region 4 formed, so that the modified spots are densely provided in the virtual plane M1 as the scheduled peeling plane. In this case, a condition under which advancement of the cracks from the modified spots is relatively small is selected as the processing condition (for example, wavelength of the laser light is short (1028 nm), the pulse width is 50 nsec, and the pulse pitch is 1 to 10 μm (1.5 to 3.5 μm in particular)). On the other hand, in the present embodiment, a condition under which the cracks advances along the virtual plane M1 is selected as the processing condition. For example, as the processing condition of the laser light L1 for forming the modified region 4 along the first region M1a of the virtual plane M1, a long wavelength (for example, 1099 nm) and the pulse width of 700 nsec are selected for the laser light L1.

[Operation and Effect]

With the laser processing apparatus 1A, the modified region 4a is formed in the circumferential edge portion EE of the target 100, with the laser light L2 condensed in and emitted from the condensing unit 14 of the laser processing head 10B, in the state where the optical axis of the condensing unit 14 of the laser processing head 10B extending along the Y direction intersecting with a direction orthogonal to the second principal plane 100b of the target 100. As a result, for example, even when the side surfaces EE1 and EE2 of the target 100 include a chamfered surface in order to improve the strength, the laser light L2 can be appropriately focused in the circumferential edge portion EE of the target 100 including the side surfaces EE1 and EE2. Thus, with the laser processing apparatus 1A, the modified region 4a can be accurately formed in the circumferential edge portion EE of the target 100.

FIG. 49(a) is a diagram illustrating a photograph showing cross section of a circumferential edge portion of a target, and FIG. 49(b) is a diagram illustrating a photograph of an enlarged cross section of a part of FIG. 49(a). In the examples illustrated in FIGS. 49(a) and 49(b), the target is a silicon wafer, and the circumferential edge portion is the bevel part. The width of the bevel part in the horizontal direction (direction parallel to the main of the silicon wafer) was about 200 to 300 μm, and the width of a side surface, of the side surfaces forming the bevel part, orthogonal to the principal plane of the silicon wafer was about 100 μm. In the examples illustrated in FIGS. 49(a) and 49(b), the laser light was focused along the horizontal direction in the bevel part from the outside of the bevel part with the side surface, of the side surfaces forming the bevel part, orthogonal to the principal plane of the silicon wafer serving as the laser light incident surface. As a result, a modified region and a crack forming along the horizontal direction toward the inner side and the outer side from the modified region were formed in the circumferential edge portion. The extension amount of the crack was about 120 μm.

With the laser processing apparatus 1A, the modified region 4 is formed along the virtual plane M1 in the effective portion RR of the target 100, with the laser light L1 condensed in and emitted from the condensing unit 14 of the laser processing head 10A, in the state where the optical axis of the condensing unit 14 of the laser processing head 10A extending along the Z direction orthogonal to the second principal plane 100b of the target 100. As a result, the modified region 4 can be accurately formed along the virtual plane M1 in the effective portion RR of the target 100.

The laser processing apparatus 1A forms the modified region 4a in the circumferential edge portion EE of the target 100, with the support portion 7 rotated about the axis C orthogonal to the second principal plane 100b, in the state where the optical axis of the condensing unit 14 of the laser processing head 10B extending along the Y direction. Thus, the modified region 4a can be efficiently formed in the circumferential edge portion EE of the target 100.

In the laser processing apparatus 1A, in the state where the optical axis of the condensing unit 14 of the laser processing head 10B extending along the Y direction, the polarization direction of the laser light L2 emitted from the condensing unit 14 of the laser processing head 10B extends along the direction in which the focusing point P2 of the laser light L2 moves with respect to the target 100. With this configuration, a crack 4b can be extended from the modified region 4a in the circumferential edge portion EE of the target 100 in a direction parallel to the second principal plane 100b of the target 100, by a large extension amount.

In the modification example described above, the movement mechanisms 5 and 6 may be configured to move at least one of the support portion 7 and the laser processing head 10A, for example. Similarly, the movement mechanisms 5 and 6 may be configured to move at least one of the support portion 7 and the laser processing head 10B.

The controller 9 may control the support portion 7, the laser processing head 10B, and the movement mechanisms 5 and 6, to form the modified region 4 along the virtual plane M1 in the effective portion RR of the target 100, in the state where the optical axis of the condensing unit 14 of the laser processing head 10B extends along the Z direction. As a result, the modified region 4 can be accurately formed along the virtual plane M1 in the effective portion RR of the target 100 with this configuration used together with or instead of the laser processing head 10A.

When the laser processing head 10B forms the modified region 4 in the target 100 with a state where the optical axis of the condensing unit 14 extending along the Z direction and a state where the optical axis of the condensing unit 14 extending along the Y direction both achieved, the laser processing apparatus 1A does not need to include the laser processing head 10A.

The laser processing head 10B may be dedicatedly used for forming the modified region 4a in the circumferential edge portion EE of the target 100, in the state where the optical axis of its condensing unit 14 extends along the Y direction. Also in this case, when the laser processing apparatus 1A is dedicated to being used for forming the modified region 4a in the circumferential edge portion EE of the target 100, the laser processing apparatus 1A may not include the laser processing head 10A.

Figure 50:
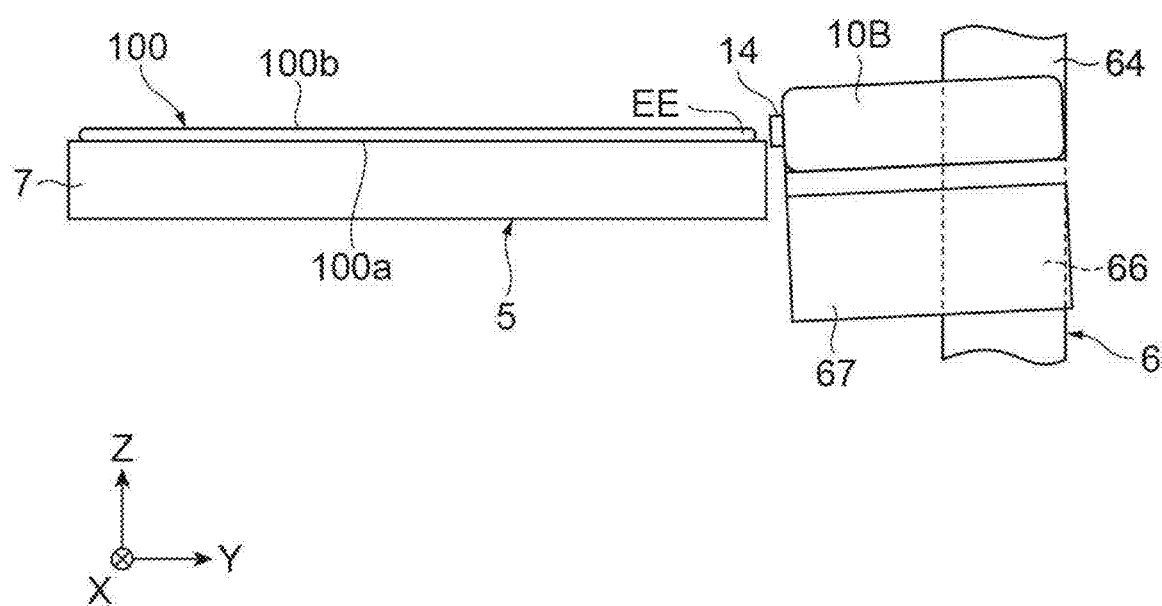
FIG. 50 is a side view of a portion of a laser processing apparatus illustrating a method of manufacturing a semiconductor device using the laser processing apparatus of the modification example.

As illustrated in FIG. 50, with the laser processing apparatus 1A, the laser light L2 may be condensed in and emitted from the condensing unit 14 of the laser processing head 10B to form the modified region 4a in the circumferential edge portion EE of the target 100, in the state where the optical axis of the condensing unit 14 of the laser processing head 10B extends along a direction, of directions intersecting with a direction (that is, the Z direction) orthogonal to the second principal plane 100b of the target 100, other than the Y direction. Thus, the angle of the optical axis of the condensing unit 14 of the laser processing head 10B can be adjusted to focus the laser light L2 appropriately in the circumferential edge portion EE, in accordance with the shape and the like of the side surfaces EE1 and EE2 forming the circumferential edge portion EE. The direction in which the optical axis of the condensing unit 14 of the laser processing head 10B intersects with the direction orthogonal to the second principal plane 100b of the target 100 (the first direction intersecting with the direction orthogonal to the surface of the target) is for example a direction inclined by an angle of 10 to 90° with respect to the direction orthogonal to the second principal plane 100b of the target 100, or a direction inclined by an angle of 30 to 90° with respect to the direction orthogonal to the second principal plane 100b of the target 100.

In the embodiments described above, the peeling processing is performed on the effective portion RR of the target 100 and then the peeling processing is performed on the circumferential edge portion EE of the target 100. Alternatively, the peeling may be performed on the circumferential edge portion EE of the target 100 and then the peeling may be performed on the effective portion RR of the target 100. In the embodiments described above, the second principal plane 100b of the target 100 is the laser light incident surface, but the laser light incident surface may be the first principal plane 100a of the target 100. Further, the laser processing apparatus 1A may be applied to a process such as ablation.

The type of the target 100, the shape of the target 100, the size of the target 100, the number and direction of crystal orientations of the target 100, and the orientation of the principal plane of the target 100 are not particularly limited. The modified region may be a crystallization region, a recrystallization region, a gettering region, or the like formed in the target 100. The crystal region is a region that maintains the structure of the target 100 before being processed. The recrystallization region is a region that is evaporated, converted into plasma, or melted, and then solidified as a single crystal or polycrystal when resolidified. The gettering region is a region exhibiting a gettering effect of collecting and capturing impurities such as heavy metals.

The configurations in the embodiments and the modification examples described above are not limited to the materials and shapes described above, and various materials and shapes may be applied. The configurations in the embodiments or the modification examples described above can be randomly applied to the configuration in another embodiment or modification examples.

Figure 53:
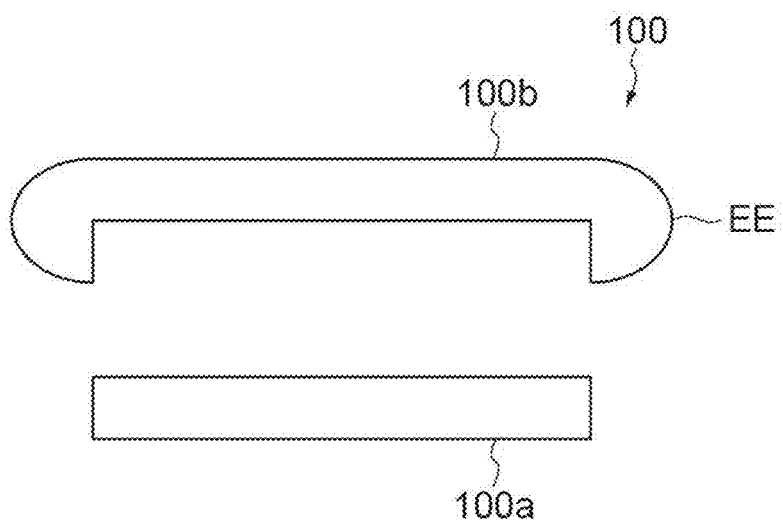
FIG. 53 is a side view of the target continuing from FIG. 52(c).

FIGS. 51 to 53 are side views of a target for explaining a laser processing apparatus according to another modification example and a method of manufacturing a semiconductor device using the same (laser processing method). In one aspect of the present invention, the processing may be performed as follows.

Specifically, first of all, the target 100 is supported with the second principal plane 100b being on the laser light incident surface. On the first principal plane 100a side of the target 100 on which the functional elements are formed, a substrate such as a supporting substrate is joined, or a tape material is attached.

Then, the first laser light L1 is emitted with the focusing point P1 of the first laser light L1 positioned at a position on the line M3 (see FIG. 10(b)), while the target 100 is rotated at a constant rotation speed as illustrated in FIG. 51(a). As described above, the line M3 is a scheduled trimming line, and annularly extend on the inner side of the outer edge of the target 100. Such irradiation of the first laser light L1 is repeatedly performed while changing the position of the focusing point P1 in the Z direction. As a result, as illustrated in FIG. 51(b), the modified region 43 is formed along the line M3 (see FIG. 10(b)) in a portion in the target 100 more on the side opposite to the laser light incident surface than the virtual plane M1. As described above, the virtual plane M1 is a scheduled peeling plane and faces the second principal plane 100b of the target 100.

Next, as illustrated in FIG. 52(a), a first portion NR1 that is an outer circumferential part excluding the circumferential edge portion (outer edge bevel portion) EE in the target 100 is irradiated with the first laser light L1 under a low separation power condition (first processing condition). Specifically, the first portion NR1 is irradiated with the first laser light L1 under the low separation power condition, with the focusing point P1 positioned at a position more on the inner side than the line M3 (see FIG. 10(b)) on the virtual plane M1 (see FIG. 10(b)), and with the target 100 rotated at a constant rotation speed. At the same time, the focusing point P1 is moved along the virtual plane M1. As a result, the modified region 4a is formed in the first portion NR1 along the virtual plane M1 (see FIG. 10(b)). No cracks extend from the modified region 4a to the outside of the line M3 (circumferential edge portion EE).

The low separation power condition is a condition under which the first slicing state is achieved as the processing state after the laser processing of a second specified amount larger than the first specified amount. Here, an intermediate separation power condition (first processing condition) may be used instead of the low separation power condition. The intermediate separation power condition is a condition under which the second slicing state is achieved as the processing state after the laser processing of a second specified amount.

The first specified amount of laser processing is, for example, a case where the modified region 4 is formed by irradiating the first laser light L1 along a plurality of parallel lines (a plurality of processing lines arranged side by side) of less than 100 lines. For example, the laser processing of the first specified amount corresponding to a case where a width of a region in which the modified region 4 is formed in the target 100 in an index direction is smaller than 12 mm.

The index direction is a direction orthogonal to the extending direction of the processing line as viewed from the laser light incident surface. The laser processing of the second specified amount corresponds to a case where the modified region 4 is formed by emitting the first laser light L1 along a plurality of, that is, 100 or more processing lines, for example. For example, the laser processing of the second specified amount corresponds to a case where a width of a region in which the modified region 4 is formed in the target 100 in an index direction is equal to or larger than 12 mm. The first specified amount and the second specified amount are not particularly limited, and may be of various parameter amounts. The first specified amount and the second specified amount may be processing time for example. The first specified amount and the second specified amount may be a combination of a plurality of parameter amounts.

The first slicing state is the slicing half cut state. The slicing half cut (SHC) state is a state in which the cracks extending from the plurality of modified spots included in the modified region 4 advance in a direction along the processing line (scanning direction). When an image is captured, it can be seen in the image that in the slicing half cut state, the modified spots and the stain along the processing line can be confirmed. When the number of processing lines increases to make the processing state transition to the slicing half cut state, the transition to the slicing full cut state described later is achieved. The number of the processing lines for achieving transition to the slicing full cut state differs depending on the processing condition. For established the slicing full cut state, the slicing half cut state needs to be established as the processing state in a case where the modified region 4 is formed by emitting the first laser light L1 along a single processing line.

The second slicing state is the slicing full cut state. The slicing full cut (SFC) state is a state in which cracks extending from the plurality of modified spots included in the modified region 4 advance in directions along and orthogonal to the plurality of processing lines to be connected to each other. When an image of the slicing full cut state is captured, in the image the cracks extending from the modified spots advance in upper and lower and left and right directions to be connected between the plurality of processing lines. The slicing full cut state is a state in which the modified spot cannot be confirmed on the image (a state in which the space or gap formed by the cracks is confirmed). The slicing full cut state is a state established when cracks formed between the plurality of processing lines are connected with each other, and thus cannot be established when the modified region 4 is formed by emitting the first laser light L1 along a single processing line.

Next, as illustrated in FIG. 52(b) and FIG. 52(c), a second portion NR2 more on the inner side than the first portion NR1 in the target 100 is irradiated with the first laser light L1 under a high separation strength condition (second processing condition). Specifically, the second portion NR2 as the center portion in the target 100 is irradiated with the first laser light L1 under the high separation strength condition, with the focusing point P1 positioned at a position on the virtual plane M1 (see FIG. 10(b)), while the target 100 rotates at a constant rotation speed. At the same time, the focusing point P1 is moved along the virtual plane M1. As a result, the modified region 4c is formed in the second portion NR2 along the virtual plane M1 (see FIG. 10(b)). Cracks actively advances from the modified region 4c toward the outer side (that is, the side surface side of the target 100). The high separation strength condition is a condition under which the second slicing state is achieved as the processing state after the laser processing of the first specified amount.

Then, the target 100 is partially peeled with the modified region 4 and/or cracks extending from the modified spots of the modified region 4 and the modified region 43 and/or cracks extending from the modified spots of the modified region 43 serving as boundaries (see FIG. 53). A part of the target 100 may be peeled by using a suction jig, air blow, and a tape material for example. When the target 100 cannot be peeled by using external stress only, the modified regions 4 and 43 may be selectively etched with an etching solution (such as KOH or TMAH) that reacts with the target 100.

As described above, in the other modification example, the first processing process in which the laser processing is performed on the first portion NR1 of the target 100 under the first processing condition and the second processing process in which the laser processing is performed on the second portion NR2 more on the inner side than the first portion NR1 in the target 100 under the second processing condition are performed. The first processing condition is a condition under which the first slicing state or the second slicing state is established as the processing state after the laser processing of the second specified amount, the second processing condition is a condition under which the second slicing state is established as the processing state after the laser processing of the first specified amount, and the first portion NR1 is a portion excluding the circumferential edge portion EE. Such laser processing is particularly effective when a part of the target 100 is peeled as illustrated in FIG. 53 (a part of the target 100 not including the circumferential edge portion EE is peeled). Thus, the peeling processing without the crack extending to the circumferential edge portion EE can be effectively performed. The part of the target 100 peeled does not include the circumferential edge portion EE, and thus alignment and other processes can be easily performed. When the peeled part of the target 100 is to go through an attachment step later, the alignment in such an attachment step can be easily performed.

FIGS. 54(a) and 54(b) are images at the position of the virtual plane M1, captured by the imaging unit IR from the laser light incident surface. FIGS. 54(a) and 54(b) illustrate a processing state in a case where the modified region 4 is formed by emitting the first laser light L1 along a plurality of processing lines. The processing line is set to extend linearly in a left and right direction in the figure. FIGS. 54(a) and 54(b) are photographic views illustrating a slicing half cut (SHC) state similar to those in FIG. 17(b). As illustrated in FIGS. 54(a) and 54(b), the slicing half cut state may partially include a region in which the cracks extending from the plurality of modified spots SA included in the modified region 4 is discontinued. Furthermore, the slicing half cut state may partially include a region in which the stain along the processing line is ungenerated.

REFERENCE SIGNS LIST 1, 101 laser processing apparatus
4, 43 modified region
6, 300 movement mechanism
9 controller
10A, 10B laser processing head (irradiation portion)
36 ranging sensor (circumferential edge monitoring unit)
100 target
100a front surface
100b back surface (laser light incident surface)
100X bevel peripheral portion (first portion)

100Y inner circumferential portion (second portion)
107 stage (support portion)
111 GUI (input portion)
BB bevel portion (circumferential edge portion)
E1 first direction
E2 second direction
IR imaging unit (image capturing unit, processing state monitoring unit)
L1 first laser light (laser light)
L2 second laser light (laser light)
M1 virtual plane
M11 line (processing line)
M11a parallel lines
M12 line (parallel lines, processing line)
M20 line (processing line)
P1 first focusing point (focusing point)
SA modified spot

The invention claimed is:

1. A laser processing apparatus that irradiates a target with a laser light to form a modified region along a virtual plane in the target, the laser processing apparatus comprising:
a support portion configured to support the target;
an irradiation portion configured to irradiate the target supported by the support portion with the laser light;
a movement mechanism configured to move at least one of the support portion and the irradiation portion to move a position of a focusing point of the laser light along the virtual plane; and
a controller configured to control the support portion, the irradiation portion, and the movement mechanism, wherein the controller performs
a first processing process of irradiating a first portion in the target with the laser light under a first processing condition, and
a second processing process of irradiating a second portion more on an inner side than the first portion in the target with the laser light under a second processing condition different from the first processing condition, after the first processing process,
wherein each of the first processing condition and the second processing condition includes one or more parameters for the laser light, each of which is defined by a parameter amount associated therewith, such that the first processing condition includes a first parameter set and the second processing condition includes a second parameter set that is different from the first parameter set.

2. The laser processing apparatus according to claim 1, wherein the first portion is a bevel portion in the target including a curved surface extending from a corner of a circumferential edge portion toward a laser light incident surface of the target.

3. The laser processing apparatus according to claim 2, wherein in the first processing process, a peripheral region in which the modified region is formed in the target shifts in a first direction toward the inner side from a circumferential edge.

4. The laser processing apparatus according to claim 3, wherein in the first processing process, a crack extending from the modified region along the virtual plane is formed in the circumferential edge portion.

5. The laser processing apparatus according to claim 3, wherein in the first processing process, the modified region is formed toward the inner side from the circumferential edge along a processing line spirally extending toward the inner side from the circumferential edge in the target, or a plurality of the modified regions are formed along a plurality of linear processing lines arranged in a direction toward the inner side from the circumferential edge in the target, the plurality of modified regions being formed sequentially from the circumferential edge toward the inner side.

6. The laser processing apparatus according to claim 3, wherein
a first slicing state is established as a processing state when the modified region is formed by emitting the laser light under the first processing condition or the second processing condition along a single processing line, and
the first slicing state is a state in which cracks extending from a plurality of modified spots included in the modified region advance in a direction along the single processing line.

7. The laser processing apparatus according to claim 6, wherein
a second slicing state is established as a processing state when the modified region is formed by emitting the laser light under the first processing condition or the second processing condition along a processing line including a plurality of parallel lines arranged side by side, and
the second slicing state is a state in which the cracks extending from the plurality of modified spots included in the modified region advance in a direction along the parallel lines and a direction intersecting with the parallel lines to be connected to each other.

8. The laser processing apparatus according to claim 7, wherein
the second slicing state is established as a processing state (1) after laser processing is performed under the first processing condition using a first specified parameter associated with at least one of the parameters, or (2) after laser processing is performed under the second processing condition using a second specified parameter associated with the at least one of the parameters that is larger than the first specified parameter.

9. The laser processing apparatus according to claim 3, wherein
the movement mechanism moves at least one of the support portion and the irradiation portion to make the position of the focusing point of the laser light move in a direction intersecting with the virtual plane, and
the controller performs a trimming process of forming the modified region by irradiating, with the laser light, a portion more on a side opposite to the laser light incident surface than the virtual plane in the target, along a processing line extending annularly on the inner side of the circumferential edge of the target, before the first processing process.

10. The laser processing apparatus according to claim 3, wherein in the second processing process, a region in which the modified region is formed in the target shifts in the first direction.

11. The laser processing apparatus according to claim 3, wherein
in the second processing process, an inner region in which the modified region is formed in the target shifts in a second direction opposite to the first direction, and
a distance of the first portion in the first direction is equal to or shorter than a predetermined distance set in advance.

12. The laser processing apparatus according to claim 1 comprising an input portion configured to receive an input from a user, wherein the controller sets at least one of the first processing condition and the second processing condition based on the input made on the input portion.

13. The laser processing apparatus according to claim 1, wherein the controller performs a third processing process of irradiating the first portion in the target with the laser light under another processing condition different from the first processing condition, during the first processing process.

14. The laser processing apparatus according to claim 1, wherein
under the second processing condition, a second slicing state is established as a processing state after laser processing is performed using a first specified parameter associated with at least one of the parameters when the modified region is formed by emitting the laser light along a processing line including a plurality of parallel lines arranged side by side,
under the first processing condition, a first slicing state or the second slicing state is established as a processing state after laser processing is performed using a second specified parameter associated with the at least one of the parameters that is larger than the first specified parameter when the modified region is formed by emitting the laser light along the processing line including the plurality of parallel lines,
the first portion is a portion in the target excluding a circumferential edge portion, the circumferential edge portion including a side surface intersecting with a laser light incident surface,
in the first slicing state, cracks extending from a plurality of modified spots included in the modified region advance in a direction along a single processing line, and
in the second slicing state, the cracks extending from the plurality of modified spots included in the modified region advance in a direction along the parallel lines and a direction intersecting with the parallel lines to be connected to each other.

15. A laser processing method that irradiates a target with a laser light to form a modified region along a virtual plane in the target, the laser processing method comprising:
a first processing process of irradiating a first portion in the target including a circumferential edge portion including a side surface intersecting with a laser light incident surface with the laser light under a first processing condition; and
a second processing process of irradiating a second portion more on an inner side than the first portion in the target with the laser light under a second processing condition different from the first processing condition, after the first processing process, wherein
in the first processing process, a region in which the modified region is formed in the target shifts in a first direction toward the inner side from a circumferential edge, and
each of the first processing condition and the second processing condition includes one or more parameters for the laser light, each of which is defined by a parameter amount associated therewith, such that the first processing condition includes a first parameter set and the second processing condition includes a second parameter set that is different from the first parameter set.

16. The laser processing apparatus according to claim 1, wherein the laser light comprises one or more branched components, and the one or more parameters include at least one of:
(a) a number of the branched components of the laser light,
(b) a pitch defined between the branched components of the laser light,
(c) a property of a pulse oscillation with which the laser light is generated, the property comprising one or more of a pulse energy or a pulse width,
(d) a processing speed associated with the irradiating with the laser light,
(e) a frequency associated with the laser light, or
(f) an operation parameter used by a spatial light modulator to branch the laser light into the branched components.

17. The laser processing method of claim 15, wherein the laser light comprises one or more branched components, and the one or more parameters include at least one of:
(a) a number of the branched components of the laser light,
(b) a pitch defined between the branched components of the laser light,
(c) a property of a pulse oscillation with which the laser light is generated, the property comprising one or more of a pulse energy or a pulse width,
(d) a processing speed associated with the irradiating with the laser light,
(e) a frequency associated with the laser light, or
(f) an operation parameter used by a spatial light modulator to branch the laser light into the branched components.

18. The laser processing method of claim 1, wherein performing the second processing process under the second processing condition causes formation of a plurality of modified spots in the modified region that are rougher than when performing the first processing process under the first processing condition.

19. The laser processing apparatus according to claim 1, wherein the laser light comprises one or more branched components, and the one or more parameters include a number of the branched components of the laser light.

20. A laser processing apparatus that irradiates a target with a laser light to form a modified region along a virtual plane in the target, the laser processing apparatus comprising:
a support portion configured to support the target;
an irradiation portion configured to irradiate the target supported by the support portion with the laser light;
a movement mechanism configured to move at least one of the support portion and the irradiation portion to move a position of a focusing point of the laser light along the virtual plane; and
a controller configured to control the support portion, the irradiation portion, and the movement mechanism, wherein the controller performs
a first processing process of irradiating a first portion in the target with the laser light under a first processing condition for generating the laser light, and
a second processing process of irradiating a second portion more on an inner side than the first portion in the target with the laser light under a second processing condition for generating the laser light different from the first processing condition, after the first processing process,
wherein each of the first processing condition and the second processing condition includes one or more parameters for the laser light, each of which is defined by a parameter amount associated therewith, such that the first processing condition includes a first parameter set and the second processing condition includes a second parameter set that is different from the first parameter set.

\* \* \* \* \*